(12) United States Patent
Takahara et al.

(10) Patent No.: US 12,016,229 B2
(45) Date of Patent: Jun. 18, 2024

(54) ELECTROLUMINESCENT DISPLAY-PANEL MANUFACTURING METHOD

(71) Applicant: Qualtec Co., Ltd., Osaka-fu (JP)

(72) Inventors: Hiroshi Takahara, Sakai (JP); Yuki Nagata, Sakai (JP)

(73) Assignee: Qualtec Co., Ltd., Osaka-fu (JP)

( * ) Notice: Subject to any disclaimer, the term of this patent is extended or adjusted under 35 U.S.C. 154(b) by 52 days.

(21) Appl. No.: 17/546,010

(22) Filed: Dec. 8, 2021

(65) Prior Publication Data

US 2022/0208872 A1 Jun. 30, 2022

Related U.S. Application Data

(62) Division of application No. 16/499,868, filed as application No. PCT/JP2018/011863 on Mar. 23, 2018, now abandoned.

(30) Foreign Application Priority Data

Mar. 30, 2017 (JP) ................................ 2017-069113
May 15, 2017 (JP) ................................ 2017-096359
(Continued)

(51) Int. Cl.
*H10K 59/35* (2023.01)
*H10K 50/15* (2023.01)
(Continued)

(52) U.S. Cl.
CPC ............. *H10K 59/35* (2023.02); *H10K 50/15* (2023.02); *H10K 50/828* (2023.02);
(Continued)

(58) Field of Classification Search
CPC ............. H01L 27/3211; H01L 27/3216; H01L 27/3246; H01L 27/3206; H01L 51/0027;
(Continued)

(56) References Cited

U.S. PATENT DOCUMENTS 8,461,577 B2 * 6/2013 Sumita ................. H10K 59/124
257/69
2004/0222738 A1 11/2004 Liao et al.
(Continued)

FOREIGN PATENT DOCUMENTS

JP 2005-158676 6/2005
JP 2008-135306 6/2008
(Continued)

*Primary Examiner* — Natalia A Gondarenko
(74) *Attorney, Agent, or Firm* — j-pat U.S. Patent Legal Services; James W. Judge

(57) ABSTRACT

In EL display panels fabricated by vapor deposition, a vapor-deposition fine mask is employed to form red, green, and blue pixels. An issue, however, has been that misregistration of the vapor-deposition fine mask occurs, lowering manufacturing yields. To resolve this issue, on a thin-film transistor (TFT) substrate, red, green, and blue pixel electrodes are fashioned in matrix form. The TFT substrate is conveyed into a vapor-deposition chamber. Under a vacuum, an organic evaporation source is employed to codeposit a light-emitting layer composed of a host material and a red guest material on the TFT substrate display screen. An ultraviolet laser beam generated by a laser device is optically guided into the vapor-deposition chamber through a laser window and directed on the light-emitting layer formed onto the green and blue pixel electrodes. Positional selecting on the green and blue pixels is carried out by controlling a mirror galvanometer.

11 Claims, 31 Drawing Sheets

(30) Foreign Application Priority Data

Aug. 7, 2017 (JP) .................................. 2017-152128
Oct. 30, 2017 (JP) .................................. 2017-209417

(51) Int. Cl.
  *H10K 50/828* (2023.01)
  *H10K 50/852* (2023.01)
  *H10K 50/856* (2023.01)
  *H10K 71/00* (2023.01)
  *H10K 71/40* (2023.01)
  *H10K 101/30* (2023.01)

(52) U.S. Cl.
  CPC ......... *H10K 50/852* (2023.02); *H10K 50/856* (2023.02); *H10K 71/00* (2023.02); *H10K 71/421* (2023.02); *H10K 2101/30* (2023.02)

(58) Field of Classification Search
  CPC ............. H01L 51/5012; H01L 51/5056; H01L 51/508; H01L 51/5096; H01L 51/5234; H01L 51/5265; H01L 51/5271; H01L 51/5278; H01L 51/56; H01L 2251/10; H01L 2251/50; H01L 2251/53; H01L 2251/552; H01L 51/504; H01L 51/5281; H01L 51/0011; H05B 33/10; H10K 59/30; H10K 59/35; H10K 71/00; H10K 71/166; H10K 71/421; H10K 50/13; H10K 50/15; H10K 50/828; H10K 50/852; H10K 50/856; H10K 50/86; H10K 2101/30; G09F 9/00; G09F 9/30; G09F 9/302

USPC ................ 257/40, 89; 438/35; 313/504, 506
  See application file for complete search history.

(56) References Cited

U.S. PATENT DOCUMENTS

| | | | |
|---|---|---|---|
| 2005/0057580 A1* | 3/2005 | Yamano | G09G 3/3241 345/690 |
| 2007/0222382 A1 | 9/2007 | Yamazaki et al. | |
| 2008/0018239 A1 | 1/2008 | Matsuda et al. | |
| 2008/0299496 A1* | 12/2008 | Hirakata | H10K 71/18 430/319 |
| 2009/0079339 A1* | 3/2009 | Kang | H10K 59/221 313/504 |
| 2009/0108741 A1 | 4/2009 | Yokoyama et al. | |
| 2010/0078629 A1* | 4/2010 | Yokoyama | H10K 50/125 257/89 |
| 2012/0242218 A1* | 9/2012 | Yoshinaga | H10K 59/351 313/504 |
| 2013/0112958 A1* | 5/2013 | Li | H10K 50/00 257/89 |
| 2014/0054556 A1 | 2/2014 | Park et al. | |
| 2015/0008411 A1* | 1/2015 | Matsumoto | H10K 71/00 438/35 |
| 2018/0212184 A1 | 7/2018 | Kondo et al. | |

FOREIGN PATENT DOCUMENTS

| | | |
|---|---|---|
| JP | 2009-245870 | 10/2009 |
| JP | 2016-195070 | 11/2016 |
| JP | 2019-129163 | 8/2019 |

* cited by examiner

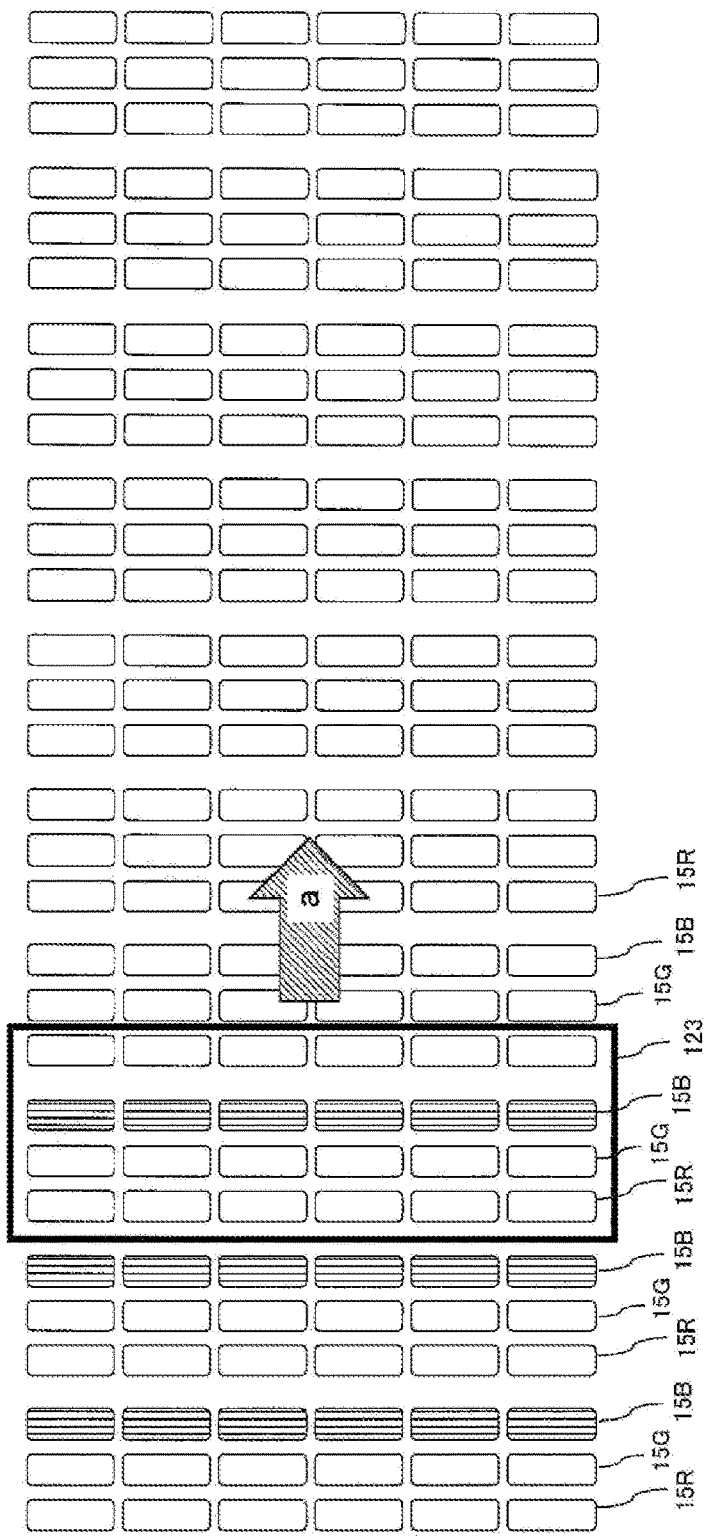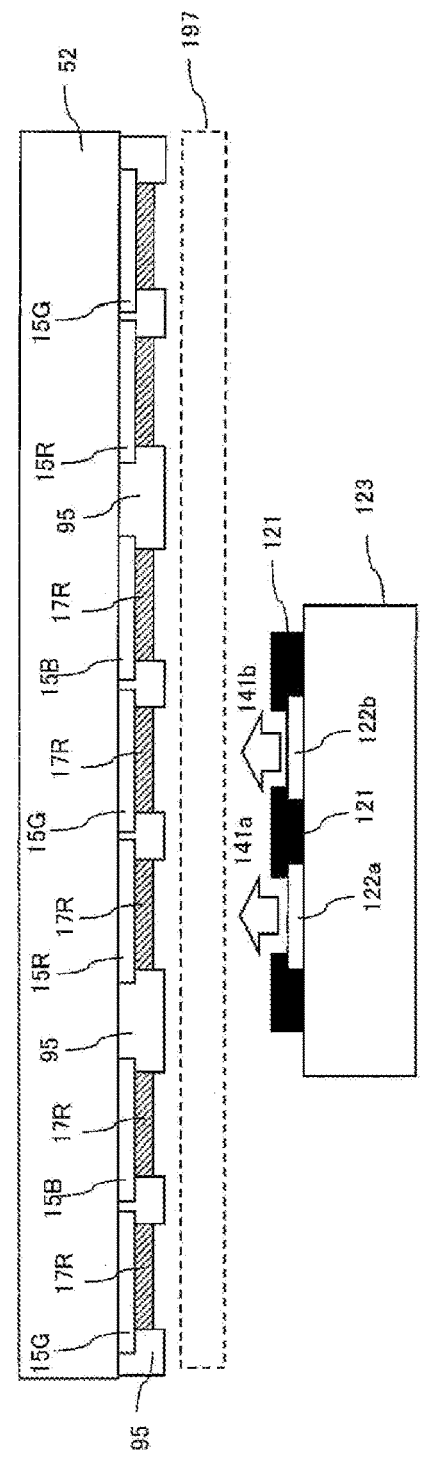
Fig. 13

ELECTROLUMINESCENT DISPLAY-PANEL MANUFACTURING METHOD

BACKGROUND OF THE INVENTION

Technical Field

The present invention relates to EL display panels; in particular it relates to EL display panels and EL display devices, and EL Display-Panel manufacturing methods and EL Display-Panel manufacturing apparatuses including organic electroluminescent (sometimes termed "organic EL" in the following) elements and suited to color-image display.

Description of the Related Art

EL display panels in which organic EL elements are arranged in matrix form have been commoditized as displays in smartphones and televisions. FIG. 30 is a structural diagram of a conventional EL display panel, an illustrative example of which is disclosed in Japanese Unexamined Pat. App. Pub. No. 2004-235138. Banks (sidewalls) 95 are formed alongside pixel electrodes 15. The banks 95 prevent a vapor-deposition fine mask 251 from contacting the pixel electrodes 15 and other constituents.

In an EL display panel, EL elements 22 are arranged in matrix form in a display screen 36 (referring to FIG. 2). The EL elements 22 have an organic-material laminated structure including a hole-transport layer (HTL) 16, an emitter layer (EML) 17, and an electron-transport layer (ETL) 18, and are in a configuration in which the laminated structure is sandwiched between pixel electrodes 15 (15R, 15B, 15G) and a light-permeable cathode electrode 19. A source driver circuit 32 (referring to FIG. 2) and a gate driver circuit 31 (referring to FIG. 2) are surface-mounted into a panel for an EL display to construct an EL display panel.

FIG. 31 is a diagram for explaining a conventional method for manufacturing an EL display panel. In order to vapor-deposit red (R) color, green (G) color, and blue (B) color EL materials in corresponding pixels during deposition, vapor-deposition fine masks 251 (251R, 251G, 251B) are employed. The vapor-deposition fine masks 251 are masks constituted from metal or synthetic resins, perforated with holes matched to the corresponding pixel geometry.

As indicated in FIG. 31A, hole-transport layers 16 are formed on the pixel electrodes 15. Subsequently, as indicated in FIG. 31B, a red vapor-deposition fine mask 251R is set into place. The red vapor-deposition fine mask 251R is perforated in locations corresponding to the red pixel electrodes 15R. It is not perforated in locations corresponding to the pixel electrodes for the other colors (green pixel electrodes 15G and blue pixel electrodes 15B). With the vapor-deposition fine mask 251R having been, as just noted, set into place, red light-emitting-layer material 172R is vaporized from a vaporization source, and through the perforations in the mask 251R the red light-emitting-layer material 172R is deposited onto the red pixels 37R. Red light-emitting layers 17R are formed by the deposited red light-emitting layer material.

For the green pixels, in the same way as with the red pixels, a green vapor-deposition fine mask 251G is set into place as indicated in FIG. 31C, and via the perforations in the mask 251G, green light-emitting layers 17G are formed on the green pixels 37G. For the blue pixels, likewise as with red pixels, a blue vapor-deposition fine mask 251B is set into place as indicated in FIG. 31D, and via the perforations in the mask 251B, blue light-emitting layers 17B are formed on the blue pixels 37B.

FIG. 31E is an explanatory diagram representing an operation subsequent to that of FIG. 31D. Electron-transport layers 18 are deposited over the red, green, and blue light-emitting layers 17. A cathode electrode (cathode) 19 composed of magnesium-silver (MgAg) etc. is formed onto the electron-transport layers 18. As illustrated in FIG. 31F, a sealing membrane 20 is formed onto the cathode electrode 19.

With conventional EL display panels, during the formation of the light-emitting layers 17 for red, green and blue EL elements, red, green and blue vapor-deposition fine masks 251 are employed. Should misregistration of the vapor-deposition fine mask 251 occur, however, color adulteration in the pixels 37 will arise. A further issue has been that the cost of the mechanisms and devices for positioning the photolithography mask is expensive. Yet another issue has been that because aligning the photolithography mask requires a lengthy amount of time, manufacturing Takt time is prolonged.

BRIEF SUMMARY OF THE INVENTION

With the present invention, in an operation of forming a light-emitting layer for at least one color—red, green, blue, etc.—in the manufacture of an EL display panel, a continuous single-color light-emitting layer 17 is formed in common among pixels 37 for a plurality of colors (referring to FIG. 2). The light-emitting layer is formed by codeposition of, principally, a guest (dopant) material and a host material. The formed light-emitting layer 17 is irradiated with a laser beam that "reforms" the light-emitting layer 17.

"Reforming" may be that the light-emitting layers 17 are quenched, or are rendered non-emitting, or else are rendered practically non-emitting. Likewise, "reforming" may be that the band gap of the guest material is greater than the band gap of the host material, and in terms of the relative dispositions of the highest occupied molecular orbitals (HOMOs) and lowest unoccupied molecular orbitals (LUMO) in the guest material and in the host material, at least one or more of relationships being that in the guest material the HOMOs are lower than in the host material, and that in the guest material the LUMOs are higher than in the host material arises. Further, "reforming" may be causing the guest material to absorb light in the ultraviolet range to make the band gap of the guest material greater than the energy-gap region where visible light is emitted.

Additionally, "reforming" may be that the film layers constituting the EL elements 22, or at least a portion of the components constituting the light-emitting layers 17, e.g., the guest materials or host materials, produces decomposition or polymerization, or produces change in the molecular structure, altering the physical properties. "Reforming" also may be that the film layers constituting the EL elements 22, for example, the guest materials or host materials for the light-emitting layers 17, are vaporized etc. to remove the materials from deposited locations. Alternatively, it may be that the film layers constituting the EL elements are removed by being transformed, or by being vaporized.

"Reforming" in cases where the light-emitting layers 17 are constituted of a single material that is not formed by codeposition of guest materials or host materials may be that at least a portion of the components constituting the EL elements 22 or the light-emitting layers 17 produces decomposition or polymerization, or produces change in the molecular structure, altering the physical properties. It may also be that the light-emitting-layer material is vaporized etc. to remove the material from deposited locations. Alternatively, it may be that the film layers constituting the EL elements 22 are removed by being decomposed, by being transformed, or by being vaporized.

The present invention forms the light-emitting layers 17 without employing any vapor-deposition fine masks 251. The light-emitting layers 17 are formed in common, continuously in pixels of a plurality of colors. The light-emitting layers 17 corresponding to the positions of the pixel electrodes 15 are irradiated with a laser beam 59 or the like to reform the light-emitting layers 17 and change the emission color of the light-emitting layers 17 in the pixels 37. Not employing any vapor-deposition fine mask 251 means that microlithography-mask misregistration is not an issue, thanks to which there is no occurrence of color adulteration in the pixels 37. What is more, since mechanisms and devices for aligning the vapor-deposition fine mask 251 are not necessary, manufacturing apparatus costs may be curtailed. A still further advantage is that with microlithography-mask positioning time being nil, manufacturing Takt time may be shortened.

BRIEF DESCRIPTION OF DRAWINGS

FIG. 13 is diagrams for explaining an EL Display-Panel manufacturing apparatus of the present invention.

DETAILED DESCRIPTION OF THE INVENTION

Figure 1:
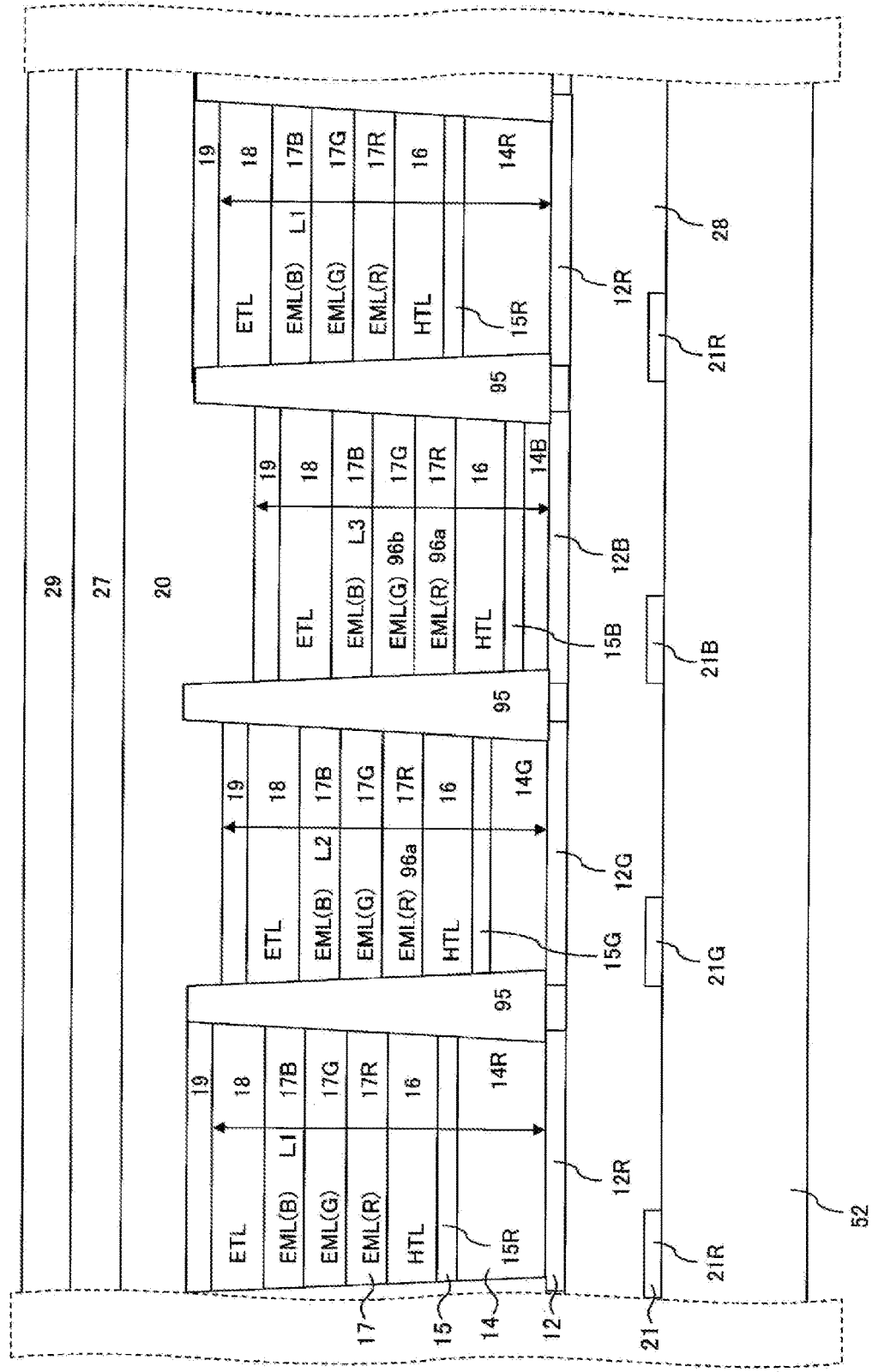
FIG. 1 is a sectional structure diagram of an EL display panel in a first embodiment example of the present invention.

In the present specification and drawings, constituent elements that exhibit the same or similar functions are labeled with the same or similar reference marks. Also, there are instances where description that would be redundant among the different embodiment examples is omitted. In the description of an embodiment example in the present specification, the explanation will center on items of distinction over, or points that differ from, the other embodiment examples. Items that have been set forth in an embodiment example of the present invention can be applied to the other embodiment examples that are given in the present specification. They also can be combined with the other embodiment examples given in the present specification.

In EL display panels and display devices of the present invention, red pixels 37R, green pixels 37G, and blue pixels 37B are arranged in the form of a matrix in a display screen 36. EL display panels and EL display devices of the present invention are not, however, limited to implementations in which the pixels are arranged in the form of a matrix. As long as its display screen 36 has a plurality of color sections, an implementation comes under the technical category of the present invention. For example, the display panel may have yellow pixels 37Y and blue pixels 37B patterned in a matrix. Further, the implementations are not limited to having display panels in which the pixels are arranged in matrix form; they may have an EL display panel that displays predetermined letters/characters and shapes. It is sufficient that the EL display panel have a display unit for a first color and a first display unit for a second color. In addition, since in the present invention the light-emitting-layer material etc. is reformed by a portion of the display region being irradiated with a laser beam or the like, an EL display panel or the like having light-emitting regions and reformed, non-light-emitting regions also comes under the technical category of the present invention.

With EL-display-panel manufacturing apparatuses or manufacturing methods of the present invention, as long as "reforming" is the directing of light onto a portion of the built EL elements 22 and the light-emitting layer 17 to "reform" the locations that are irradiated with the light, the technical concepts of the present invention may be applied to any panel structure and geometry. That the technical concepts may also be applied to, e.g., an EL display panel having a monochrome text display is a matter of course. While the present invention is described as being that after a light-emitting layer 17 is formed by vapor deposition and associated operations, the light-emitting layer 17 is irradiated with a laser beam, etc. to "reform" the light-emitting layer 17, the present invention is not thereby limited. For example, the light-emitting layer 17 may be irradiated with a laser beam, etc. to "reform" the light-emitting layer 17 even as the EL elements 22 and the light-emitting layer 17 are being formed through vapor deposition and associated operations.

The irradiation of the light-emitting layers 17 with the laser beam 59 is implemented in a vacuum. It should be understood that the process may be implemented under a nitrogen or argon atmosphere containing 20 ppm or more to 200 ppm or less oxygen. Implementing the reforming within from 20 or more to 200 or less ppm oxygen renders the reforming time shorter-term.

Figure 2:
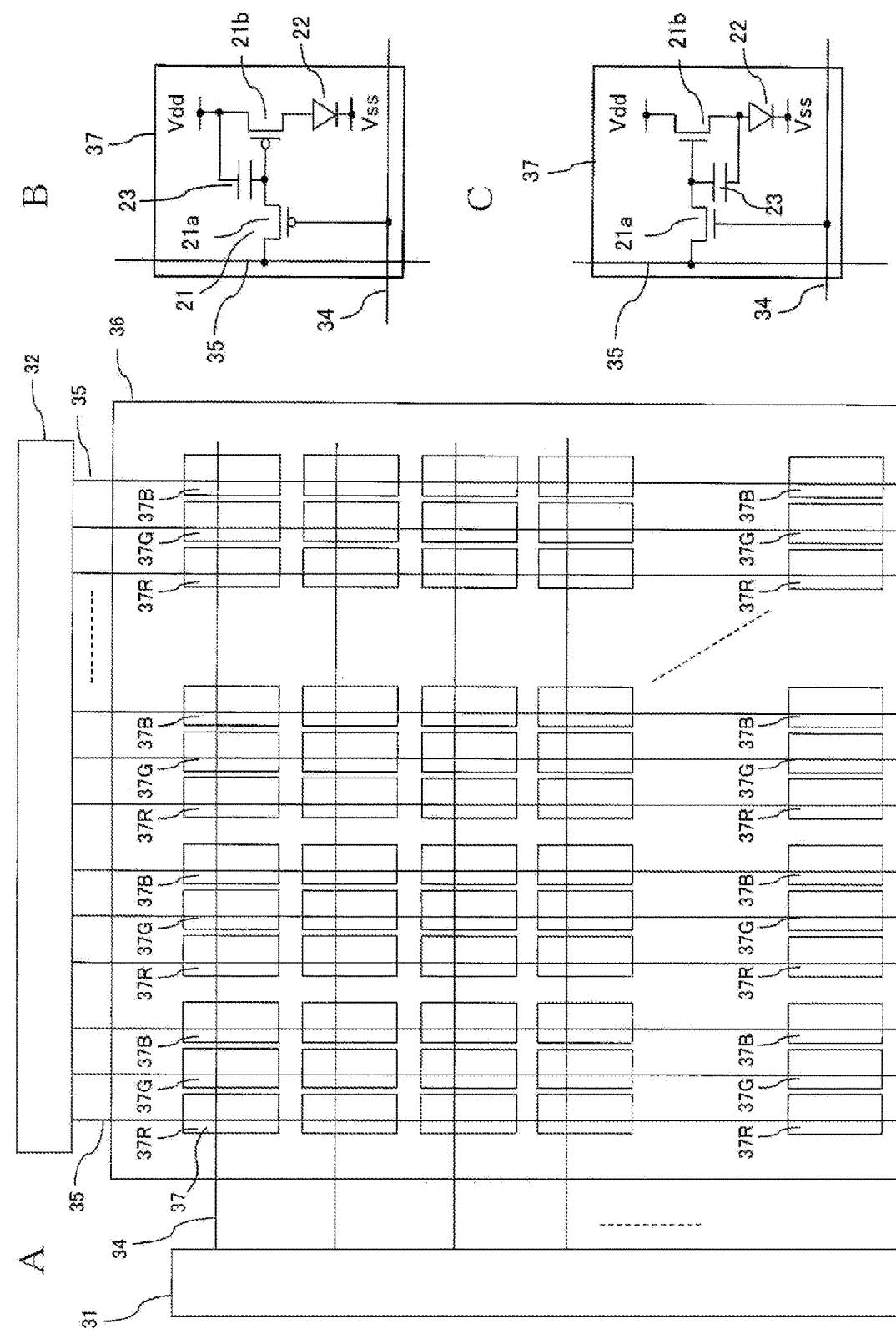
FIG. 2 is equivalent-circuit diagrams for blocks and pixels in an EL display panel of the present invention.

FIG. 2 is a structural diagram of an EL display panel, and equivalent circuit diagrams for pixels, of the present invention. Red pixels 37R, green pixels 37G, and blue pixels 37B are arranged in matrix form in the display screen 36. Pixel electrodes 15R and reflective films 12R are formed in or arranged on the red pixels 37R; pixel electrodes 15G and reflective films 12G are formed in or arranged on the green pixels 37G; and pixel electrodes 15B and reflective films 12B are formed in or arranged on the blue pixels 37B.

FIG. 2A is the structural diagram of an EL display panel of the present invention, and FIGS. 2B and 2C are the equivalent circuit diagrams for the pixels 37. FIG. 2B is an equivalent circuit diagram for cases where the transistors 21 constituting the pixels 37 consist of p-channel transistors. FIG. 2C is an equivalent circuit diagram for cases where the transistors 21 constituting the pixels 37 consist of n-channel transistors. Both n-channel transistors and p-channel transistors may be utilized to constitute the pixels 37.

In the pixels 37, thin-film transistors (TFTs) 21a and 21b, a capacitor 23, and an EL element 22 are formed. Switching transistor 21a functions as a switching element that supplies to the gate terminal of driving transistor 21b a video signal that the source driver circuit 32 outputs. The driving transistor 21b functions as a driving transistor that supplies current to the EL element 22.

In each pixel 37 the gate terminal of the switching transistor 21a is connected to a gate-signal line 34, and the source terminal and the drain terminal of the switching transistor 21a are connected to a source-signal line 35 and to the gate terminal of the driving transistor 21b. The source terminal and the drain terminal of the driving transistor 21b are connected to an electrode to which an anode voltage Vdd is applied and to the anode terminal of the EL element 22. The anode terminal of the EL element 22 is connected to the drain terminal and to the source terminal of the driving transistor 21b, and the cathode terminal of the EL element 22 is connected to a cathode electrode 19 to which a cathode voltage Vss is applied.

While in the present specification, the driving transistors 21b and the switching transistors 21a are described as being thin-film transistors, they are not limited to being thin-film transistors and may be transistors formed on a silicon wafer. The transistors 21 may be FETs, MOSFETs, MOS transistors, or bipolar transistors.

The anode electrodes (pixel electrodes) 15 constituting the EL elements 22 as illustrated in FIG. 1 are formed of ITO as a transparent electrode. Reflective films 12 are formed on the underlayer of the pixel electrodes 15. The capacitors 23 may be formed with the reflective films 12 and the pixel electrodes 15 being the electrodes. It is not necessary that the reflective film 12 be an electrode, as long as it is a film that reflects light. For example, a reflective film consisting of a multilayer membrane as with dichroic mirrors serves to illustrate. Varying the film thickness of insulating films 14 in the red, green, and blue pixels 37 makes it possible to vary the storage capacitances C in the red, green, and blue pixels 37. It should be noted that the pixel electrodes 15 are not limited to being transparent electrodes, and may be formed of aluminum, silver, or other metallic material. In that case, the pixel electrodes 15 are rendered reflective films. Also, the reflective films 12 and the pixel electrodes 15 may be formed by lamination.

While the present specification has it that insulating films 14 are formed between the pixel electrodes 15 and the reflective films 12, this is not limiting. As long as it behaves like a light-permeable substance, 14 may be any material. It may for example possess electrical conductivity.

The pixel electrodes 15R correspond to the pixels 37R in FIG. 2; likewise, the pixel electrodes 15G correspond to the pixels 37G, and the pixel electrodes 15B correspond to the pixels 37B.

The technical concepts behind the manufacturing apparatuses, manufacturing methods, EL display panels, etc. of the present invention are also applicable to bottom-emitting EL elements 22 rendered without reflective films 12, but with the cathodes 19 as reflecting membranes, and such that light is extracted only from the lower-electrode side.

The TFT substrate 52 is a glass baseplate on which the transistors 21, the pixel electrodes 15, and associated constituents are formed. It should be understood that in some implementations instead of a glass baseplate, the substrate consists of a synthetic resin. It may be, for example, a substrate formed of a polyimide resin. It may also be a substrate onto the planar surface of which a varnish has been coated and hardened. It may likewise be a substrate consisting of a metallic material or a ceramic material. It should be understood that while in the present specification, an example in which the light-emitting layers 17 etc. are formed on a TFT substrate 52 is described to illustrate, the present invention is not limited to EL display panels utilizing a TFT substrate 52. They may be, for example, simple-matrix EL display panels in which TFTs are not formed, or a text-displaying EL display panels that display fixed letters/characters.

FIG. 1 is a sectional configuration diagram of an EL display panel of the present invention. The pixels 37 made up of the transistors 21 etc. are formed atop the TFT substrate 52, and over them, a planarizing film 28 made from, as one example, a photosensitive resin is provided. The reflective films 12 may be formed on the underlayer of the planarizing film 28 or may be formed above the planarizing film 28. The red pixel electrodes 15R, green pixel electrodes 15G, and blue pixel electrodes 15B are created by forming a transparent conductive film consisting of ITO or IZO atop the planarizing film 28 and patterning the transparent conductive film. The pixel electrodes 15 are made electrically conductive with one of the terminals of the driving transistors 21b through contact holes (not illustrated) in the planarizing film 28.

The insulating films 14 formed on the underlayer of each pixel electrode 15 have a film thickness that is for adjusting the optical distance L of the EL elements. The present invention is a configuration in which in the insulating films 14 on the underlayers of the pixel electrodes 15 for a plurality of colors, the film thicknesses of any of the insulating films 14 are made dissimilar. Optical distance is also referred to as "optical path length." It is the distance (physical distance) actually that light advances, multiplied by the refractive index. It should be noted that since there are not significant discrepancies in the refractive indices of the substances in each layer constituting the EL elements for each color, for each EL element of a given color the optical distance L and the physical distance are proportional to each other. Therefore, the optical distance L may be replaced with or read by the physical distance.

The present invention is a configuration in which in an EL display panel that emits a plurality of colors, a plurality of light-emitting layers is formed on the EL elements for at least one color, distinguishing them from the light-emitting layers 17 in the EL elements for the other colors, and the optical distances L are made dissimilar. The present invention also is a configuration in which in an EL display panel that emits a plurality of colors, the optical distance L for the EL elements for at least one color is made to differ from the optical distances L for the EL elements for the other colors.

The principal wavelength $\lambda_1$ nm at which the light-emitting layers 17R (first light-emitting layers) emit light is longer compared to the principal wavelength $\lambda_2$ nm at which the light-emitting layer 17G (second light-emitting layer) emits light. The principal wavelength $\lambda_2$ is longer compared to the principal wavelength $\lambda_3$ nm at which the light-emitting layer 17B (third light-emitting layer) emits light. One example has the color of the light-emitting layer 17R emission be red, the color of the light-emitting layer 17G emission be green, and the color of the light-emitting layer 17B emission be blue.

In the embodiment example illustrated in FIG. 1, a light-emitting layer 17R, a light-emitting layer 17G, and a light-emitting layer 17B are formed onto the red pixel electrodes 15R. The distance L1 between the reflective film 12R and the cathode electrode 19R is the optical distance of the red EL elements 22. A light-emitting layer 17G and a light-emitting layer 17B are formed onto the green pixel electrodes 15G. The distance L2 between the reflective film 12G and the cathode electrode 19G is the optical distance of the green EL elements 22. A light-emitting layer 17G and a light-emitting layer 17B are formed onto the blue pixel electrodes 15B. The distance L3 between the reflective film 12B and the cathode electrode 19 is the optical distance of the blue EL elements 22.

A light-emitting layer 17R, a light-emitting layer 17G, and a light-emitting layer 17B are formed in common above the red pixel electrodes 15R, the green pixel electrodes 15G, and the blue pixel electrodes 15B. The light-emitting layer 17R is formed in common and as a continuous film in pixels for a plurality of colors (red pixels 37R, green pixels 37G, and blue pixels 37B). In the same way, the light-emitting layer 17G is formed in common and as a continuous film in the pixels for a plurality of colors, and the light-emitting layer 17B is formed in common and as a continuous film in the pixels for a plurality of colors. A vapor-deposition coarse mask (not illustrated) is employed to form a light-emitting layer 17R, a light-emitting layer 17G, and a light-emitting layer 17B over the entire display screen 36. Here, the vapor-deposition coarse mask is a mask having an opening for the display screen 36, while not having openings for the pixel units.

Red wavelengths are the longest wavelengths; blue wavelengths are the shortest wavelengths; green wavelengths are intermediate between the wavelengths of reds and blues. Accordingly, the optimum optical distances L with the colors are: optical distance L1 for reds>optical distance L2 for greens>optical distance L3 for blues. The interference order number, nevertheless, with the reds, the greens, and the blues are rendered an identical order number.

In EL display panels of the present invention, permeable metal films (MgAg) 19 are formed on the electrodes on the light-extraction side, and reflection films 12 are formed on the reverse side from the light-extraction side. Silver (Ag), a highly reflective metal, is utilized for the reflective films. Further, satisfying $L=(2m-(\varphi/\pi))\times(\lambda/4)$ with respect to the optical distance L concentrates in a frontward orientation light of wavelength λ whose extraction is desired. Therein, φ is the phase shift [rad] in the reflective film at reflection; the interference order number m is 0 or a positive integer, and when m=0, the optical distance L assumes the minimum positive value that satisfies the formula; and λ is the emission wavelength. For the interference order number m either 0 or 1 is selected. Implementations where the interference order number is 0 allow the thickness of the film constituting the EL elements to be thin, reducing the amount of organic material used, and allowing changeover to lower cost to be realized. What is more, chromatic shift depending on the view-angle direction is not liable to occur.

Hole-transport layers 16 are formed on the pixel electrodes 15. Hole injection layers (HILs; not illustrated) may be formed between the pixel electrodes 15 and the hole-transport layers 16. The film thickness of the hole-transport layers 16 on the pixel electrodes 15 may be made to differ among the red, green, and blue pixels 37. For example, a hole-transport layer 16R is formed atop the pixel electrodes 15R, a hole-transport layer 16G is formed atop the pixel electrodes 15G, a hole-transport layer 16B is formed atop the pixel electrodes 15B, and the film thicknesses of the respective hole-transport layers 16 are made to differ.

In an EL display panel according to the first embodiment of the present invention, as indicated in FIG. 1, a red light-emitting layer 17R, a green light-emitting layer 17G, and a blue light-emitting layer 17B are formed over the pixel electrodes 15. The "reformed" light-emitting layers 17—for example, the light-emitting layer 17R and the light-emitting layer 17G—include mixtures of host materials and guest materials. In the light-emitting layer 17R and the light-emitting layer 17G at least either the host materials or the guest materials differ, and the emission colors differ from each other. The absorption spectrum of the guest material that the light-emitting layer 17R contains at least partially overlaps the emission spectrum of the light-emitting layer 17G. The absorption spectrum of the guest material that the light-emitting layer 17G contain at least partially overlaps the emission spectrum of the light-emitting layer 17B.

In FIG. 1, the light-emitting layer 17R above the pixel electrodes 15G and the pixel electrodes 15B is reformed. Meanwhile, the light-emitting layer 17G above the pixel electrodes 15B is also reformed. The light-emitting layer 17R above the pixel electrodes 15R in FIG. 1 emits in a red color. The light-emitting layer 17R above the pixel electrodes 15G and the pixel electrodes 15B does not emit light. The light-emitting layer 17G above the pixel electrodes 15G emits in a green color. The light-emitting layer 17G above the pixel electrodes 15B does not emit light.

The light-emitting layer 17R above the pixel electrodes 15R in FIG. 1 contains light-emitting guest material at a concentration that is higher compared to the light-emitting layer 17R above the pixel electrodes 15G and the pixel electrodes 15B. The bulk of the guest material that the light-emitting layer 17R above the pixel electrodes 15R in FIG. 1 includes is capable of emitting light, while most of the guest material that the light-emitting layer 17R above the pixel electrodes 15G and the pixel electrodes 15B include is quenched or does not undergo excitation. Alternatively, at least one of either the hole mobility or the hole-injection efficiency of the light-emitting layer 17R above the pixel electrodes 15R is lesser compared to the light-emitting layer 17R above the pixel electrodes 15G and the pixel electrodes 15B.

The light-emitting layer 17G above the pixel electrodes 15R and the pixel electrodes 15G contains light-emitting guest material at a concentration that is higher compared to the light-emitting layer 17G above the pixel electrodes 15B. Most of the guest material in the light-emitting layer 17G above the pixel electrodes 15B is quenched or does not undergo excitation. Alternatively, the electrical properties of the light-emitting layer 17G above the pixel electrodes 15R and the pixel electrodes 15G differs from those of the light-emitting layer 17G above the pixel electrodes 15B. At least one of either the hole mobility or the hole-injection efficiency of the light-emitting layer 17G above the pixel electrodes 15R and the pixel electrodes 15G is lesser compared to the light-emitting layer 17G above the pixel electrodes 15B. The bulk of the guest material that the light-emitting layer 17G above the pixel electrodes 15R and the pixel electrodes 15G includes is capable of emitting light, while most of the light-emitting-layer 17G guest material that the light-emitting layer 17G above the pixel electrodes 15B includes is quenched or does not undergo excitation.

At least one of either the light-emitting-layer 17R hole mobility or hole-injection efficiency of the light-emitting layer 17R above the pixel electrodes 15G and the pixel electrodes 15B is greater compared to the light-emitting layer 17R above the pixel electrodes 15R. At least one of either the light-emitting-layer 17G hole mobility or hole-injection efficiency of the light-emitting layer 17G above the pixel electrodes 15B is greater compared to the light-emitting layer 17G above the pixel electrodes 15R and the pixel electrodes 15G.

While in the present specification, an example where an EL display panel having EL elements 22 of a structure in which over pixel electrodes 15, hole-transport layers 16, light-emitting layers 17, and electron-transport layers 18 are formed, and cathode electrodes 19 as common electrodes are formed is described to illustrate, this is not limiting. The EL display panel may have EL elements 22 of inverse structure in which electron-transport layers 18, light-emitting layers 17, and hole-transport layers 16 are formed above the pixel electrodes 15, and the cathode electrode 19 as a common electrode is built on. For implementations whose EL elements 22 are of inverse structure, in the drawings, and in the present specification and the description it makes, of the present invention, hole-transport layers would necessarily be replaced with electron-transport layers. And hole-injection layers would necessarily be replaced with electron-injection layers.

For implementations where the EL elements 22 are of inverse structure, in the structural section views of, and in the views for explaining methods of manufacturing, EL display panels of the present invention in FIG. 1, FIG. 10, FIG. 14, FIG. 15, FIG. 16, FIG. 17, FIG. 19, FIG. 21, FIG. 22, FIG. 23, FIG. 24, FIG. 25, FIG. 26, FIG. 27, FIG. 28, and elsewhere, the views would necessarily be switched—the electron-transport layer 18 for the hole-transport layers 16, and the hole-transport layers 16 for the electron-transport layers 18. The light-emitting layer 17R above the pixel electrodes 15G and the pixel electrodes 15B is, according to manufacturing methods of the present invention, irradiated with laser light 59 in the ultraviolet region, the violet region, or the blue region. It is principally the guest material in the light-emitting layer 17R that absorbs the laser light 59.

Ultraviolet rays are electromagnetic waves that, being invisible optical rays, are of wavelength from 10 nm to 400 nm, that is, shorter than visible light and longer than soft X-rays. Infrared rays are electromagnetic waves whose wavelength is longer (whose frequency is lower) than the reds among visible light rays, and that are of shorter wavelength than radio waves.

By the light-emitting layer 17R absorbing laser light 59, covalently bonded chains in the layers' guest material are severed. Severing the covalently bonded chains in a vapor-deposition chamber 56 free of oxygen leads to the radicals in the covalently bonded chains creating double bonds. Meanwhile, atoms in other of the covalently bonded chains drop out and bond together. Or they create a crosslinked structure with the other of the covalently bonded chains, producing a change in structure. Further, severing of the covalently bonded chains transforms the material into another substance. Accordingly, the HOMO and LUMO electric potentials of the guest material in the light-emitting layer 17R are changed, such that guest material in the light-emitting layer 17R having been irradiated with a laser beam 59 no longer emits light.

Figure 7:
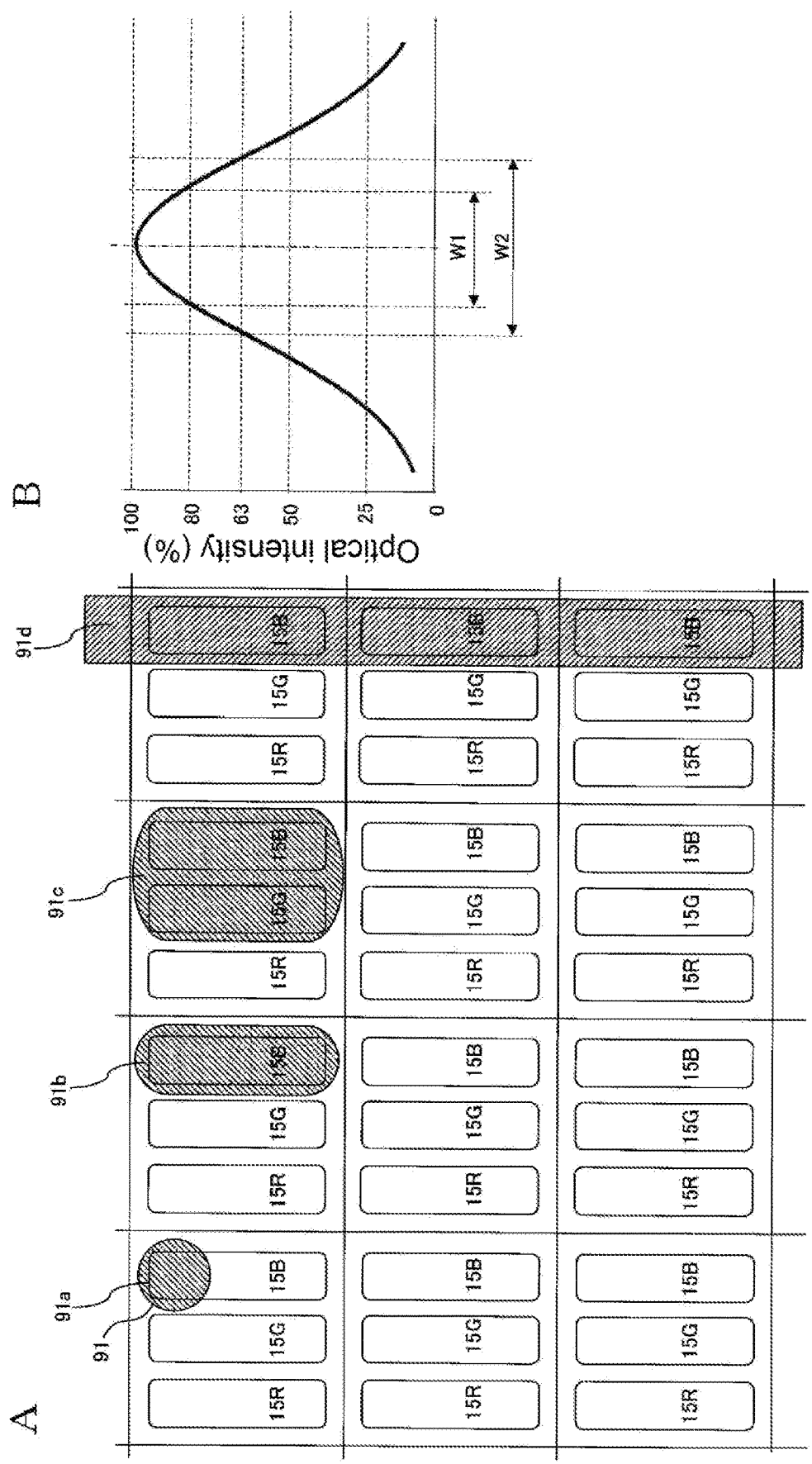
FIG. 7 is diagrams for explaining an EL Display-Panel manufacturing method of the present invention.

The laser beam 59 has narrow directivity and satisfactory recti linearity. Light-emitting layers 17 in a predetermined pixel 37 can therefore be selected and irradiated with the laser beam 59. In EL display panels including those of the present invention, pixels 37 of identical color are arrayed vertically (from the top toward the bottom of the screen) as illustrated in FIG. 7 etc. While the material of the light-emitting layers 17 is deposited also between neighboring pixel electrodes 15, source signal lines 35, among other features, are formed between neighboring pixel electrodes 15. Furthermore, a predetermined spacing exists between neighboring pixels 37. Accordingly, even if the size of the laser-beam 59 laser spot 91 is large, irradiating of the light-emitting layers 17 in sideways-neighboring pixels is nonexistent.

Controlling a mirror galvanometer 62 allows the direction along which the laser beam 59 is scanned to be controlled with high speed and accuracy. Further, the laser device 58 is disposed outside the vapor-deposition chamber 56, therefore facilitating maintenance. The laser beam 59 is generated outside the vapor-deposition chamber 56, and the generated laser light 59 is optically guided into the vacuum inside the vapor-deposition chamber 56 through a laser window 63. Accordingly, the vacuum state inside the vapor-deposition chamber 56 may be maintained optimally. It should be noted that the laser device 58 may be disposed within the vapor-deposition chamber 56. Shorter wavelengths of the irradiating beam raise the rate of optical absorption into the material. Since the spot diameter can be narrowed down to near the diffraction limit, a laser beam 59 whose light wavelength is shorter allows thermal impact on the surroundings when the material is processed to be lessened, suiting it to minute processing work, to enable processing work on ultrahigh-definition EL display panels. In addition, by scanning the area interior of a single pixel electrode 15 with the laser beam 59, the light-emitting layers 17 etc. can be favorably reformed, coinciding with the geometry of the pixel electrode 15.

The laser device 58 is preferably a device whose mode of operation is continuous-wave. With a pulsed-mode laser device 58, on the other hand, the pulse energy of the laser beam is intense. In implementations where pixels that are irradiated with the laser beam 59 are arranged discretely, as with EL display panels in which the pixels are arranged in matrix form, it is preferable to utilize a pulsed-mode laser device 58. Since the laser light 59 output from a pulsed-mode laser device 58 is on/off controlled with a Q switch, irregularities in pulse intensity are liable to occur. Consequently, reforming the light-emitting layers 17 etc. by irradiating the locations being reformed with a plurality of laser pulses is desirable.

In implementations with a pulsed laser, the same location is irradiated with a plurality of pulses. Irradiating the same location with a plurality of pulses averages the energy of the laser light 59 with which that same location is irradiated, making the condition of the reforming uniform. Here, the lasing interval between laser pulses preferably is from at least 50 nsec to not more than 5 μsec. In addition, the lasing interval between laser pulses preferably is such that the first of the laser pulses puts the light-emitting layer 17 in a semi-dissolved state, and that with the subsequent laser pulse, the light-emitting layer 17 is laser-pulse irradiated before turning solid.

In implementations with a continuous wave laser, the same location is irradiated with the laser beam a plurality of times. Irradiating the same location with the laser beam 59 a plurality of times averages the energy of the laser light with which that same location is irradiated, making the condition of the reforming uniform. Here, the lasing interval of the laser beam 59 preferably is from at least 50 msec to not more than 5 pec. In addition, the lasing interval of the laser beam 59 preferably is such that the first-time irradiating by the laser beam 59 puts the light-emitting layer 17 in a semi-dissolved state, and that the subsequent irradiating by the laser beam 59 is executed before the light-emitting layer 17 turns solid.

For the laser device 58, a laser device as one example that can be employed is the laser lift-off (LALO) apparatus commodified by Utopia Co., Ltd. The laser-device laser wavelength in the laser lift-off apparatus is 343 nm, and the line beam length is 750 mm. The line width is 30 the energy density is 250 mM/cm$^2$, and the pulse width is 15 ns. Accordingly, even with largescale EL display panels, down a one-pixel column (from the upper edge to the lower edge of the screen) the laser beam 59 can be directed onto the one-pixel column with a single laser spot 91. A pulse width for the laser beam 59 of from at least 10 nsec to not more than 80 nsec is appropriate. Illustrative as other examples of the laser device 58 are devices utilizing solid-state lasers whose wavelength is 355 nm, and devices utilizing 308-nm excimer lasers.

EL display-device manufacturing methods of the present invention utilize the laser device 58 to very accurately select the pixels 37 and reform a given light-emitting layer 17. The light intensity of the laser beam 59 per unit area is high. Accordingly, the light-emitting layers 17 etc. can be reformed in a brief time period.

With the present invention, at least in the operational step of forming a light-emitting layer 17 for a single color, a vapor-deposition fine mask 251 as with conventional manufacturing methods is not employed. Therefore, the problem of color adulteration in the emission color due to misregistration of the vapor-deposition fine mask 251 does not arise. What is more, the cost of the deposition manufacturing apparatus may be reduced. Since no vapor-deposition fine mask 251 is employed, vapor-deposition fine mask 251 positioning is not necessary, making it possible to curtail manufacturing Takt time.

With the present invention, irradiating by the laser beam 59 produces a change in the combinatorial state of the guest material and host material in the light-emitting layers 17. Light of wavelength in the ultraviolet region is preferably used for the laser beam 59.

Manufacturing methods as well as manufacturing apparatuses of the present invention lase the film layers and the light-emitting layers 17 etc. constituting the EL elements 22 with a laser or other energy beam to reform the layers.

Accordingly, the EL elements 22 and the light-emitting layers 17 that the laser light 59 has irradiated are quenched, or are rendered non-emitting, or else are rendered practically non-emitting. Recombining of electrons and holes is, in the pixels 37R, caused to occur in the light-emitting layer 17R primarily. In the pixels 37G, recombining of electrons and holes is caused to occur in the light-emitting layer 17G primarily. In the pixels 37B, it is caused to occur in the light-emitting layer 17B primarily.

In an EL display panel according to the first embodiment example of the present invention, in the pixels 37R, while recombining of electrons and holes occurs in the light-emitting layer 17R primarily, there is a possibility that recombining arises in the light-emitting layers 17G and 17B also. That is, there is a possibility that in the pixel electrodes 15R, the light-emitting layers 17R, 17G, and 17B each emit light. In the pixels 37R, the guest material that the light-emitting layer 17R includes absorbs the energy by which the light-emitting layer 17G and the light-emitting layer 17B undergo excitation and emits light. The guest material that the light-emitting layer 17G includes undergoes excitation from absorbing the light that the light-emitting layer 17B gives off, but does not, for the most part, undergo excitation from absorbing the light that the light-emitting layer 17R gives off. Further, the guest material that the light-emitting layer 17B includes for the most part does not absorb the energy by which the light-emitting layers 17R or 17G undergo excitation, nor thereby emit light.

In the pixels 37R, at least a portion out of the excitation energy that the light-emitting layer 17B gives off is converted into light having the emission spectrum of the guest material that the light-emitting layer 17R includes. At least a portion of the energy by which the light-emitting layer 17G undergoes excitation is converted into light having the emission spectrum of the guest material that the light-emitting layer 17R includes. Accordingly, with the emission color of the pixels 37R being approximately equal to the emission color of the light-emitting layer 17R, the pixels 37R give off red light.

In the pixels 37G, while recombining of electrons and holes occurs in the light-emitting layer 17G primarily, there is a possibility that recombining arises in the light-emitting layers 17R and 17B also. From having been irradiated with the laser beam 59, the light-emitting layer 17R above the pixel electrodes 15G do not contain the optically emitting guest material. Since the light-emitting layer 17R in the pixels 37G does not contain the optically emitting guest material, no color conversion occurs in the light-emitting layer 17R. In the light-emitting layer 17B, the aforementioned color conversion is produced. Accordingly, with the emission color of the pixel electrodes 15G being approximately equal to the emission color of the light-emitting layer 17G, the pixel electrodes 15G give off green light.

In the pixels 37B, while recombining of electrons and holes occurs in the light-emitting layer 17B primarily, there is a possibility that recombining arises in the light-emitting layers 17R and 17G also. Nevertheless, from having been irradiated with the laser beam 59, the light-emitting layers 17R and 17G above the pixel electrodes 15B do not contain the optically emitting guest material, consequently only the light-emitting layer 17B emits light. Since the light-emitting layer 17R and the light-emitting layer 17G in the pixels 37B do not contain the optically emitting guest material, no color conversion occurs in the light-emitting layers 17R and 17G. Accordingly, with the emission color of the pixels 37B being approximately equal to the emission color of the light-emitting layer 17B, the pixel electrodes 15B give off blue light.

Figure 3:
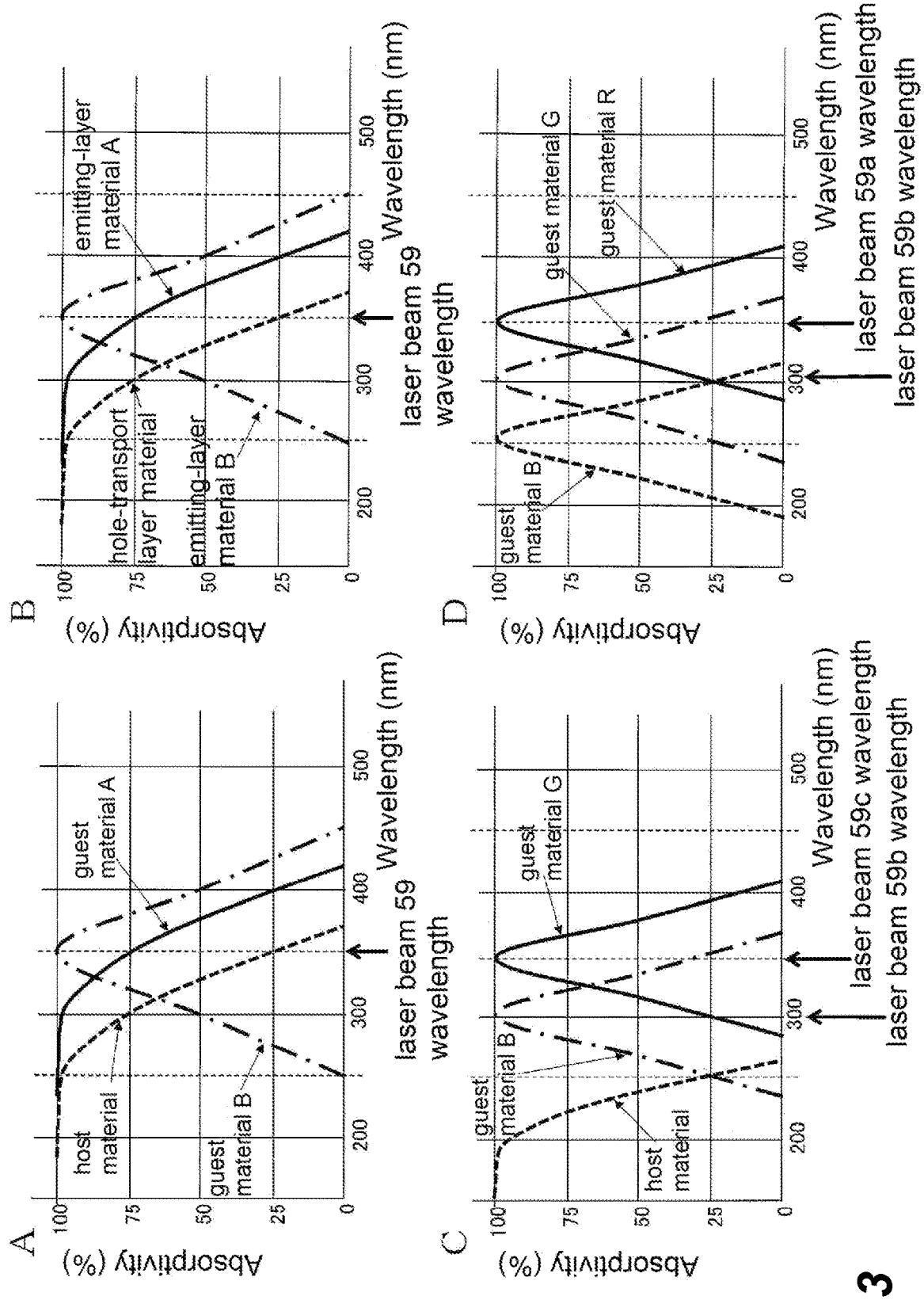
FIG. 3 is diagrams for explaining an EL Display-Panel manufacturing method of the present invention.

As indicated by the FIG. 3A graph, for the host material, a material that does not readily absorb the laser light 59 is selected, while for the guest material, one that does readily absorb the laser light 59 is. Alternatively, a wavelength that the host material does not readily absorb, yet that the guest (dopant) material does readily absorb is selected for the wavelength of the laser light 59. Preferably, the host material and the guest material are selected to be in a relationship in which, as graphed in FIG. 3A, when the absorptivity of the guest material is at least 75%, the absorptivity of the host material is not greater than 25%. It should be noted that in FIG. 3, the optical absorptances (%) of the guest materials and the host material are normalized and graphed with the optical absorptance when maximum being 100%. In FIG. 3A, guest material A is an example of a material having the property that its absorptivity (%) increases at wavelengths of 400 nm or less, and having an absorptivity of at least 75% at the wavelength of the laser beam 59. Guest material B is an example of a material having an ideal absorptivity at, and in the proximity of, the wavelength of the laser light 59. The laser-light wavelength, and the guest material and the host material are selected so that at the wavelength of the laser light 59, the optical absorptivity of the guest material and the optical absorptivity of the host material are in a relationship where the one is at least three times the other, preferably in a relationship where the one is at least four times the other. For example, given a guest-material optical absorptivity of 75% and a host-material optical absorptivity of 25% with laser light 59, then 75%/25%=3 times. Given a guest-material optical absorptivity of 50% and a host-material optical absorptivity of 10% with laser light 59, then 50%/10%=5 times. It should be understood that the features explanatorily illustrated by FIG. 3 are of course also applicable in other embodiment examples of the present invention.

For the wavelength of the laser beam 59, the optical absorptivity (%) of the hole-transport layer must also be taken into consideration. The light-emitting layers 17 are formed over the hole-transport layers 16, and the light-emitting layers 17 are irradiated with the laser beam 59. In some instances, during that process the hole-transport layer 16 may be irradiated with laser light 59 having permeated the light-emitting layers 17. The hole-transport layer 16 absorbing laser light 59 can lead to the possibility of the hole-transport layer 16 undergoing a change in properties. Accordingly, as indicated in the FIG. 3B graph, for the hole-transport layer 16 material, preferably a hole-transport layer 16 material is selected so that there will be the sort of relationship as with the host material where, when the laser-light 59 optical absorptivity of the guest material is at least 75%, the laser-light 59 optical absorptivity of the host material is not greater than 25%.

The present invention is not limited to configurations in which the light-emitting layers 17 are formed from a guest material and a host material. In some implementations, the light-emitting layers 17 are formed by a single material. In implementations where the light-emitting layers 17 are formed by a single material, that single material is reformed. A technical concept behind the present invention would be irradiating the organic films forming the EL elements 22 with a laser beam 59 or the like to reform the light-emitting layers 17 etc. Doing so requires a relationship between the laser-light 59 optical absorptivities of the light-emitting layers 17 and of the hole-transport layer material. That is, as indicated in the FIG. 3B graph, the wavelength of the laser light 59 necessitates a relationship between the optical absorptivity (%) of the hole-transport layer and the optical absorptivity (%) of the light-emitting layers 17. Accordingly, it is preferable to select a hole-transport layer material so that there will be a relationship where, as graphed in FIG. 3B, when the laser-light 59 optical absorptivity of the material in the light-emitting layers 17 is at least 75%, the laser-light 59 optical absorptivity of the hole-transport layer material is not greater than 25%.

In FIG. 3B, light-emitting layer material A is an example of a material having the property that its absorptivity (%) increases at wavelengths of 400 nm or less, and having an absorptivity of at least 75% at the wavelength of the laser beam 59. Light-emitting layer material B is an example of a material having an ideal absorptivity at, and in the proximity of, the wavelength of the laser light 59. For the hole-transport layer material, that makes the optical absorptivity at the wavelength of the laser beam 59 not greater than 25%. The foregoing gives the material that constitutes the light-emitting layers 17 and the material that constitutes the hole-transport layers a difference in optical absorptivity of 75%/25%=3 times or more at the wavelength of the reforming beam (laser light 59 or the like). It is preferable that the difference in optical absorptivity be 4 times or more.

The laser light wavelength, the light-emitting layer material, and the hole-transport layer material are selected so that at the wavelength of the laser beam 59, the relationship between the optical absorptivity of the light-emitting layers 17 and the optical absorptivity of the hole-transport layers will be three times or greater. For example, given a light-emitting layer 17 optical absorptivity of 75% and hole-transport-layer material optical absorptivity of 25% with laser light 59, then 75%/25%=3 times. Given a light-emitting layer 17 optical absorptivity of 50% and a hole-transport layer optical absorptivity of 10% with laser light 59, then 50%/10%=5 times.

In the embodiment of FIG. 1, as far as the light-emitting layers above the pixel electrodes 15R are concerned, the red light-emitting layer 17R emits red light. The green light-emitting layer 17G and the blue light-emitting layer 17B do not emit light. The red light-emitting layer 17R is "emitting," the green light-emitting layer 17G is "quenched," and the blue light-emitting layer 17B is "quenched." As far as the light-emitting layers above the pixel electrodes 15G are concerned, the green light-emitting layer 17G emits green light. The red light-emitting layer 17R and the blue light-emitting layer 17B do not emit light. The red light-emitting layer 17R is "quenched," the green light-emitting layer 17G is "emitting," and the blue light-emitting layer 17B is "quenched." As far as the light-emitting layers above the pixel electrodes 15B are concerned, the blue light-emitting layer 17B emits blue light. The red light-emitting layer 17R and the blue light-emitting layer 17B do not emit light. The red light-emitting layer 17R is "quenched," the green light-emitting layer 17G is "quenched," and the blue light-emitting layer 17B is "emitting."

For the hole-transport layers 16, which function to transport holes to the light-emitting layers 17, so that excitation energy does not travel from the light-emitting layers 17 because the hole-transport layers are in contact with the light-emitting layers, and further does not interact with other layers to form an exciplex, a material having an energy band gap larger than that of the light-emitting layers 17 is utilized. Illustrative of such materials are, e.g., TPD, α-NPD, NBP, and TCTA. The hole injection layer has a HOMO level between the HOMO level of the hole-transport layer 16 and the work function of the anode, and functions to lower the injection barrier to tunneling from the anode to the organic layer.

Electron-transport layers 18 are formed over the light-emitting layers 17. Electron-injection layers (EILs; not depicted) may be formed between the electron-transport layers 18 and the cathode electrodes 19. The types of electron-transport layer 18 may be made distinct among the red pixels 37R, the green pixels 37G, and the blue pixels 37B. The electron-transport layers 18 possess functionality for injecting and transporting electrons from the cathode electrodes (cathodes) 19. As with the hole-transport layer 16, a material having a wide band gap is likewise preferable. As materials for the electron-transport layer 18, tris(8-hydroxyquinolinato)aluminum ($Alq_3$), or derivatives or metallic coordination complexes thereof may be cited as examples.

The light-emitting layers 17 are regions where when a voltage is applied to the pixel electrodes (anodes) 15 and the cathode electrodes (cathodes) 19, holes injected from the anode side and electrons injected from the cathode side recombine. Specifically, the light-emitting layers may be constituted by single layers composed of one type or two or more types of these light-emitting materials, or may be a laminate of light-emitting layers composed of a chemical compound of a type different from that or those of the single-layer light-emitting layers. In instances where the EL elements 22 form a resonator structure, the emission light, having caused multiplex interference between the light-reflecting surface of the cathodes 19 and the light-reflecting surface of the reflecting films 12, constituted to be semi-transparent/semi-reflective, is extracted from the cathode 19 side. The optical distance L between the light-reflecting surface of the reflecting films 12 and the light-reflecting surfaces on the cathode 19 side is defined by the wavelength of light whose extraction is desired, with the film thickness and interference conditions for each layer being determined so as to satisfy this optical distance L.

In the FIG. 1 embodiment example, the insulating films 14 in the red pixels 37R, the green pixels 37G, and the blue pixels 37B are adjusted so as to create optical distances L in the red pixels 37R, the green pixels 37G, and the blue pixels 37B whereby optical cavity effects are maximally exhibited. Nevertheless, the present invention is not thereby limited.

FIG. 28A is an embodiment example in which the interference order number in the red (R) pixels and the green (G) pixels are created at the zeroth order, and the interference order number in the blue (B) pixels at the first order. The film thicknesses of the insulating films 14 are formed differentiating by red (R) pixels and green (G) pixels. Further, the hole-transport layers (HTL) in the blue (B) pixels are formed thicker. The hole-transport layers are not formed by a single-cycle deposition, but are formed by a plural-cycle depositions. Also, the hole-transport layers formed by plural-cycle depositions may be created with differing hole-transport layer materials. The cavity-effect exhibiting optical distances L the are made proportional to the emission wavelengths. Red wavelengths are longer than green wavelengths, and green wavelengths are longer than blue wavelengths. Accordingly, given that the interference order numbers are identical, the red optical distance L1 is longer than the green optical distance L2, and the green optical distance L2 is longer than the blue optical distance L3. The film thickness of the EL elements 22 is on the order of 100 nm. Given that the interference order number is the zeroth order, the film thickness of the blue pixels 37B will be thinnest. A thin optical distance L is liable to give rise to defects due to dust and the like during manufacturing. Consequently, compared with the red pixels 37R, the occurrence of defects in the blue pixels 37B is frequent, such that EL display-panel yields are degraded by defects in the blue pixels 37B.

In the manner of the embodiment example of FIG. 28A, by having the interference order number for the blue pixels 37B be the first order and making the film thickness of the EL elements 22 thicker than those of the pixels of the other colors, EL display-panel yields may be improved. What is more, in the red (R) pixels, the green (G) pixels, and the blue (B) pixels, since optimum optical distances L corresponding to the emission wavelengths may be realized, optical cavity effects may be exhibited, realizing ideal color reproducibility. It should be noted that with FIG. 28A, while the interference order number for the blue (B) pixels among the three colors is rendered the first order, the present invention is not thereby limited, and as in FIG. 28B, the interference order numbers for the red (R) pixels, the green (G) pixels, and the blue (B) pixels all together may be made the first order. Furthermore, configurations differentiating film thicknesses in the red (R) pixels, the green (G) pixels, and the blue (B) pixels are not limited to a film layer in common to each; in the red (R) pixels it may be the transport layer (HTL); in the green (G) pixels it may be the light-emitting layer (EML); and in the blue (B) pixels it may be the insulating film 14B.

Further, the interference order number in the red (R) pixels, the green (G) pixels, and the blue (B) pixels may be the same, as indicated in FIG. 28C, and the optical distance L may be adjusted with a film layer in common among them. FIG. 28C is an embodiment example in which the interference order number for the red (R) pixels, the green (G) pixels, and the blue (B) pixels is made in common the zeroth order, and in which the insulating films in the red (R) pixels, the green (G) pixels, and the blue (B) pixels are differentiated to realize optimal optical cavity effects, realizing ideal color reproducibility. The blue (B) pixels may adequately lack an insulating film. The reflective films 12B and the pixel electrodes 15B are stacked together.

Further, it will be understood that, as indicated in FIG. 28D, the interference order numbers in the red (R) pixels, the green (G) pixels, and the blue (B) pixels may be differentiated, with the interference order number in a plurality of the colors being the first order. The red (R) pixels have an interference order number that is the zeroth order, and the green (G) pixels and blue (B) pixels have an interference order number that is the first order. In the green (G) pixels, the light-emitting layer 17G is formed thicker, and in the blue (B) pixels, the insulating films 14B are formed thicker.

Banks (sidewalls) 95 are formed on the perimeter of the pixel electrodes 15. The banks 95 are created with the objective, primarily, of preventing the vapor-deposition fine masks 251 from coming into contact with the pixel electrodes 15 and like features when the vapor-deposition fine masks 251 are set into place, and of preventing the light-emitting layers 17 between neighboring pixels from becoming intermixed.

Figure 26:
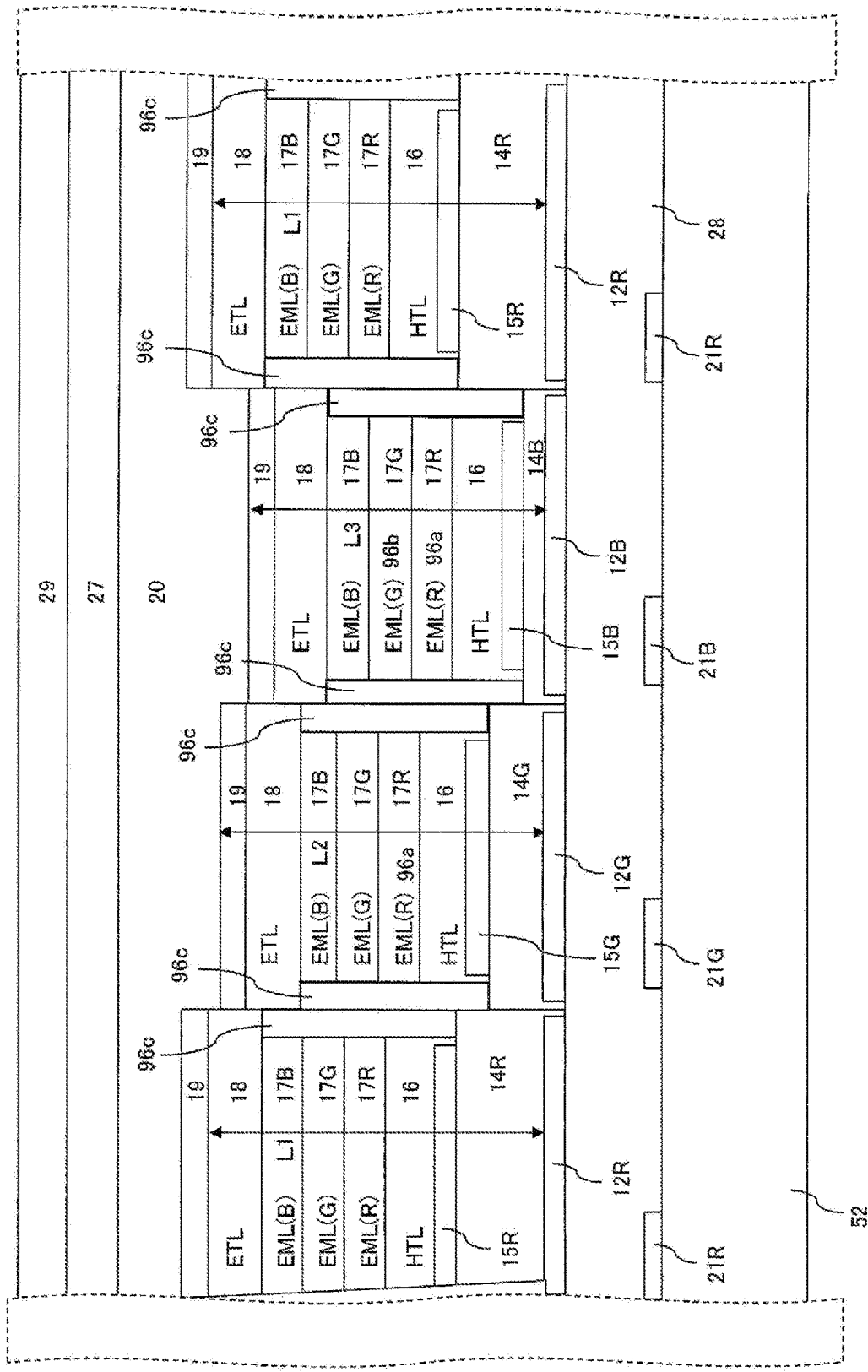
FIG. 26 is a sectional structure diagram of an EL display panel in a seventh embodiment example of the present invention.
Figure 27:
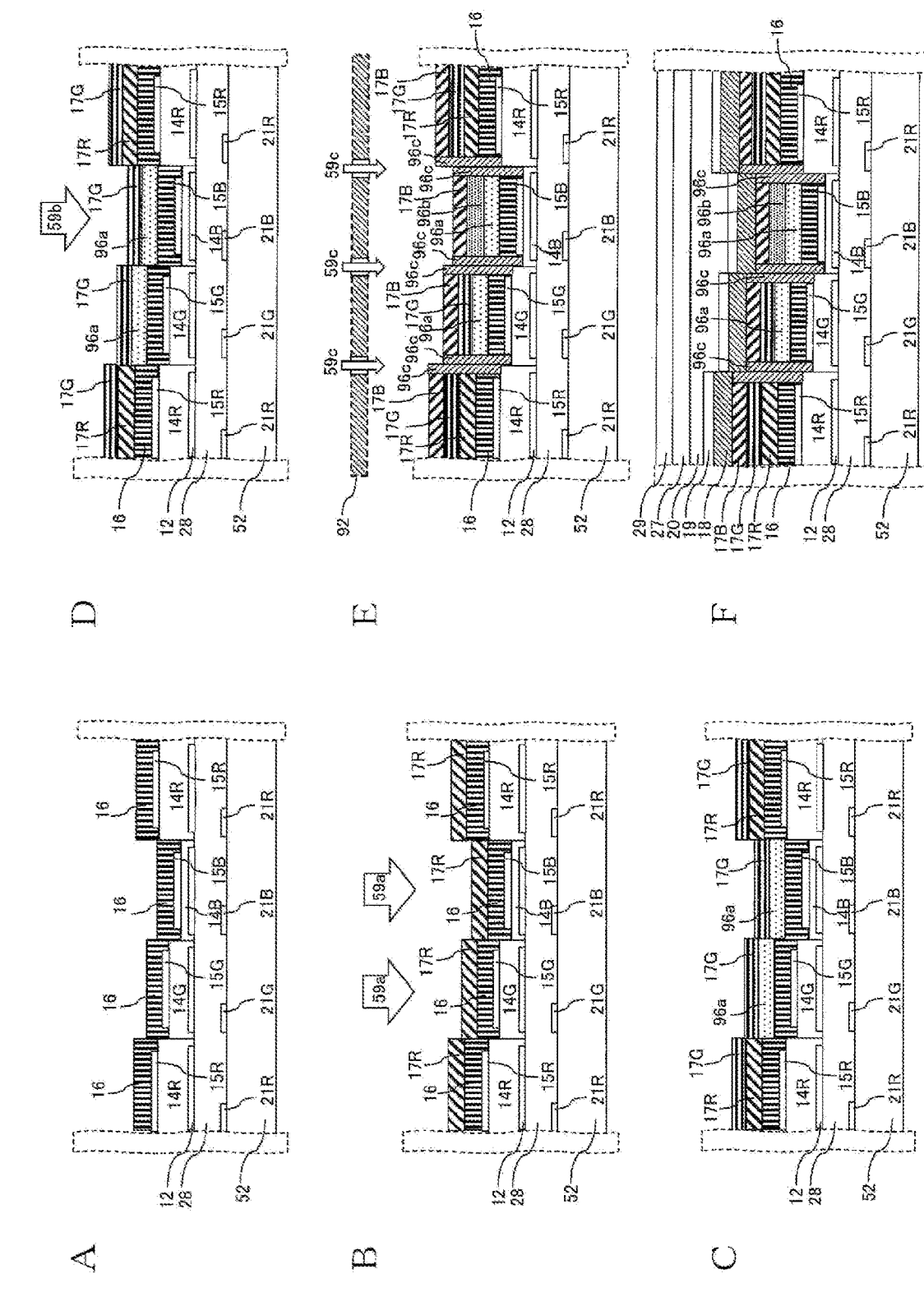
FIG. 27 is diagrams for explaining operations in the manufacture of the EL display panel in the sixth seventh embodiment example of the present invention.
Figure 28:
FIG. 28 is sectional structure diagrams of EL display panels in other embodiment examples of the present invention.

It should be understood that, as is the case with the present invention, not employing vapor-deposition fine masks 251—given that the light-emitting layers 17 are reformed by being irradiated with the laser beam 59 or other narrow-directivity beam, given that no color adulteration between pixels arises, or given that color adulteration between pixels may be prevented or kept under control, etc. etc.—means that as indicated in FIGS. 26 and 27, banks 95 need not be created.

It should be noted that the manufacturing apparatuses, manufacturing methods, EL display panels etc., of the present invention have been describing, as an illustrative example, a top-emitting type EL panel in which reflective films 12 are formed, and light generated in the light-emitting layers 17 is extracted through the transparent cathode-electrode 19 side. The present invention is not thereby limited, however, and may be applied to a bottom-emitting EL display panel rendered to have the cathodes 19 be reflective films, so that light is extracted only from the lower electrode side.

Figure 4:
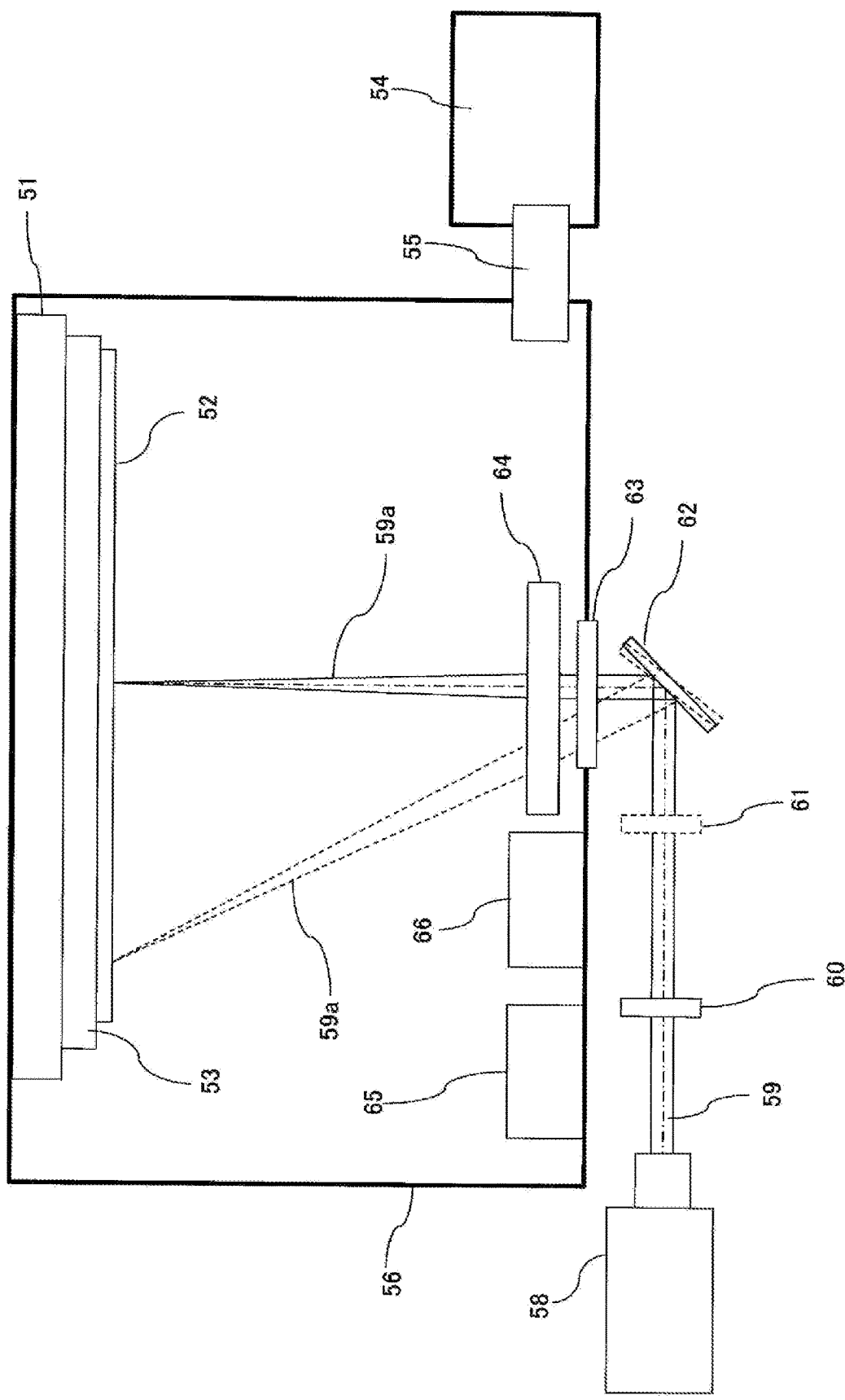
FIG. 4 is a diagram for explaining a vapor deposition apparatus and a laser device in the manufacture of an EL display panel of the present invention.

FIG. 4 is a configurational diagram and an explanatory diagram of a vapor deposition apparatus for an EL display-panel manufacturing apparatus of the present invention. An EL display-panel deposition apparatus of the present invention has a deposition chamber 56 furnished with a metal evaporation source 65 and an organic evaporation source 66. The deposition chamber 56 is furnished with a sliding stage 51 for retaining the TFT substrate 52, a temperature-adjusting plate 53 for retaining the TFT substrate 52 at or adjusting it to a predetermined temperature, a vacuum pump (vacuum exhaust device) 54, and an exhaust duct 55 that ties the vacuum pump 54 and the vapor-deposition chamber 56.

In a film-forming tool 116 (referring to FIG. 11), the vacuum levels in the vapor-deposition chamber 56, a transfer device chamber 117, and a laser device chamber 118 preferably are kept down to a level of at least $1 \times 10^{-3}$ Pa vacuum. More preferably, maintaining the chambers at vacuum level of at least $1 \times 10^{-4}$ Pa is favorable.

Under a high vacuum, due to the phenomenon that boiling points drop, the boiling point (sublimation point) is lowered, but the energy whereby the C—C bonds and other chemical bonds constituting organic molecules dissociate/break down is not affected. Given these facts, even with organic materials that in the air do not break down and cannot sublimate (vaporize), film formation is made possible by heating the materials in a high-vacuum situation where oxygen has been eliminated, to sublimate them readily and build thin films onto substrates. What is more, because the vapor-deposited organic material is in a high-vacuum situation where oxygen has been eliminated, irradiating it with a laser beam yet promotes the necessary chemical change in the organic material. Accordingly, despite the irradiating with a laser beam, there is no encroachment of oxidation reactions that would lead to carbonization.

So that organic materials of two kinds may be made into films by codeposition, a plurality of vapor-deposition power sources and film-thickness gauges for the host material and for the guest material are installed.

As to the laser beam 59 that the laser device 58 has generated, the intensity of the laser beam 59 is adjusted with an optical density filter 60, as indicated in FIG. 4. For the laser light 59 that reforms the light-emitting layers 17, primarily a laser beam 59 in the ultraviolet wavelength region is adopted. The features relating to the laser device 58, explanatorily illustrated by FIG. 4 etc., may be applied as a device, explanatorily illustrated by FIG. 20, for removing deposits 201 or a device for reforming deposits 201.

As the optical density filter 60, a variable attenuator employing a polarizing beam splitter illustrates an example. The transmittance (reflectance) is changed by rotating a λ/2 wave plate that is in front of the polarizing beam splitter. The laser beam 59 that the laser device 58 generates is shaped with a cylindrical lens 61 to be rectangular or elliptical as required. The beam is also shaped with a slit mask to be roughly rectangular or circular to match it approximately to the pixel geometry.

The laser light 59, with its intensity having been adjusted by the optical density filter 60, is incident on the mirror galvanometer 62. The mirror galvanometer 62 scans the laser beam 59 over an xy two-dimensional area (the TFT substrate 52 or a donor film 197). In the mirror galvanometer 62, a couple of motors (rotary encoders) that scan the laser beam 59 in the x- and y-axis directions are employed. The laser beam 59 enters the vapor-deposition chamber 56 through a laser window 63 disposed in the vapor-deposition chamber 56. The laser beam 59 is shone onto the TFT substrate 52 in a high-vacuum state. The laser window 63 is formed of quartz glass. The laser device 58 is disposed within the atmosphere external to the vapor-deposition chamber 56, where the laser beam 59 is introduced through the laser window 63 into the vacuum within the vapor-deposition chamber 56. Accordingly, operation and maintenance of the laser device 58 are facilitated. An fθ (f-theta) lens 64 is deployed as a lens for focusing the laser beam 59 onto the TFT substrate 52. By the reforming of the lens-surface curvature of the fθ lens 64, the lens is designed so that the scanning speed will be constant along the lens periphery and in its center. The direction of the laser beam 59 generated by the laser device 58 is varied by the mirror galvanometer 62, and through the fθ lens 64, the laser beam is cast onto the surface of the TFT substrate 52 or the donor film 197.

Figure 5:
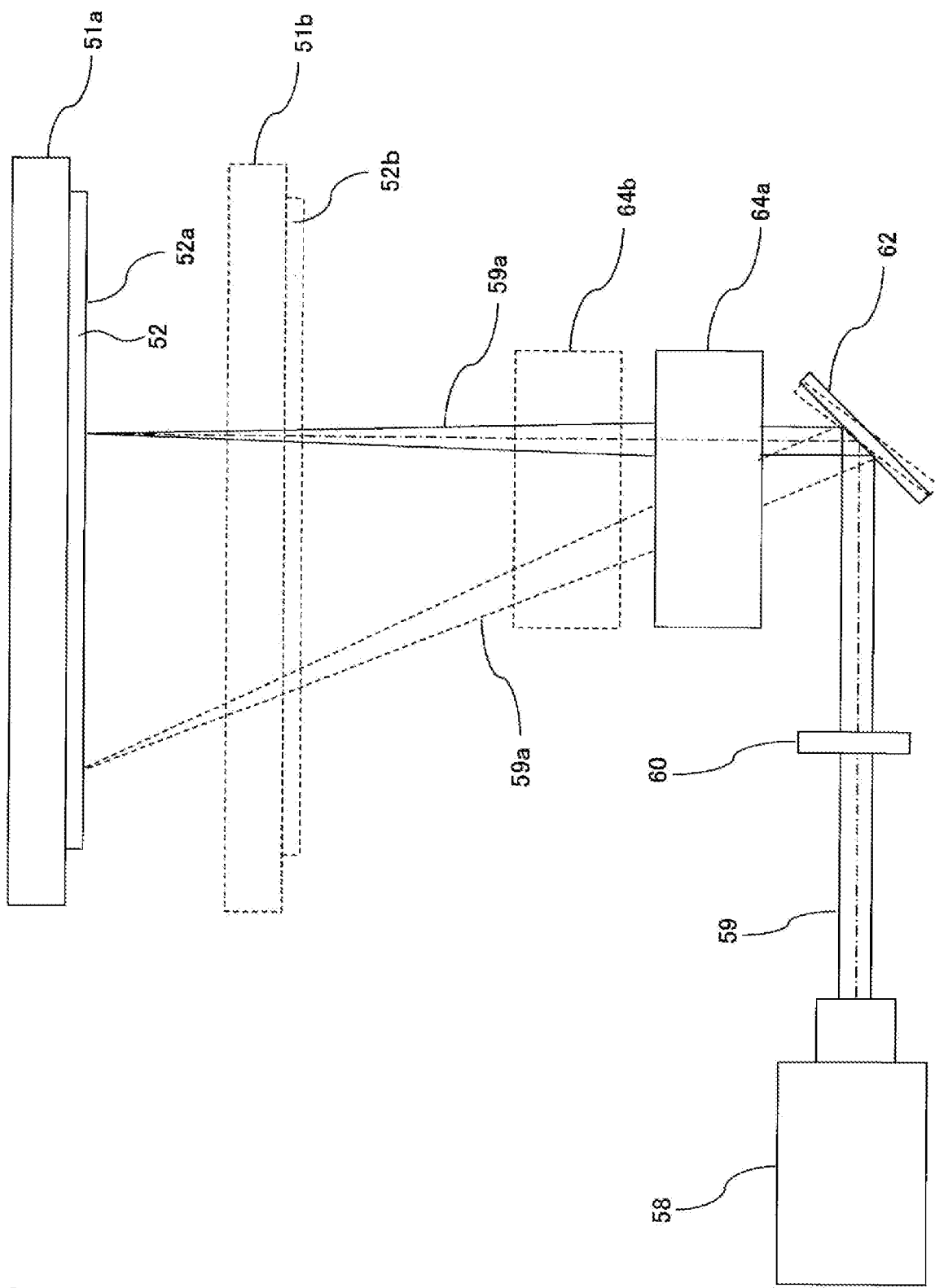
FIG. 5 is a diagram for explaining the laser device in the manufacture of an EL display panel of the present invention.

As indicated in FIG. 5, the position of the fθ lens 64 is changed along the interval from fθ lens 64a to fθ lens 64b as required. By the position of the fθ lens 64 being changed, the focus position of the laser beam 59 may be varied. Likewise, the position of the sliding stage 51 is changed along the interval from sliding stage 51a to sliding stage 51b. By the position of the sliding stage 51 being changed, the focus position of the laser beam 59 may be varied. Changing the focus position allows the lasing coverage by the laser beam 59 and the size of laser spot 91 to be varied.

Figure 6:
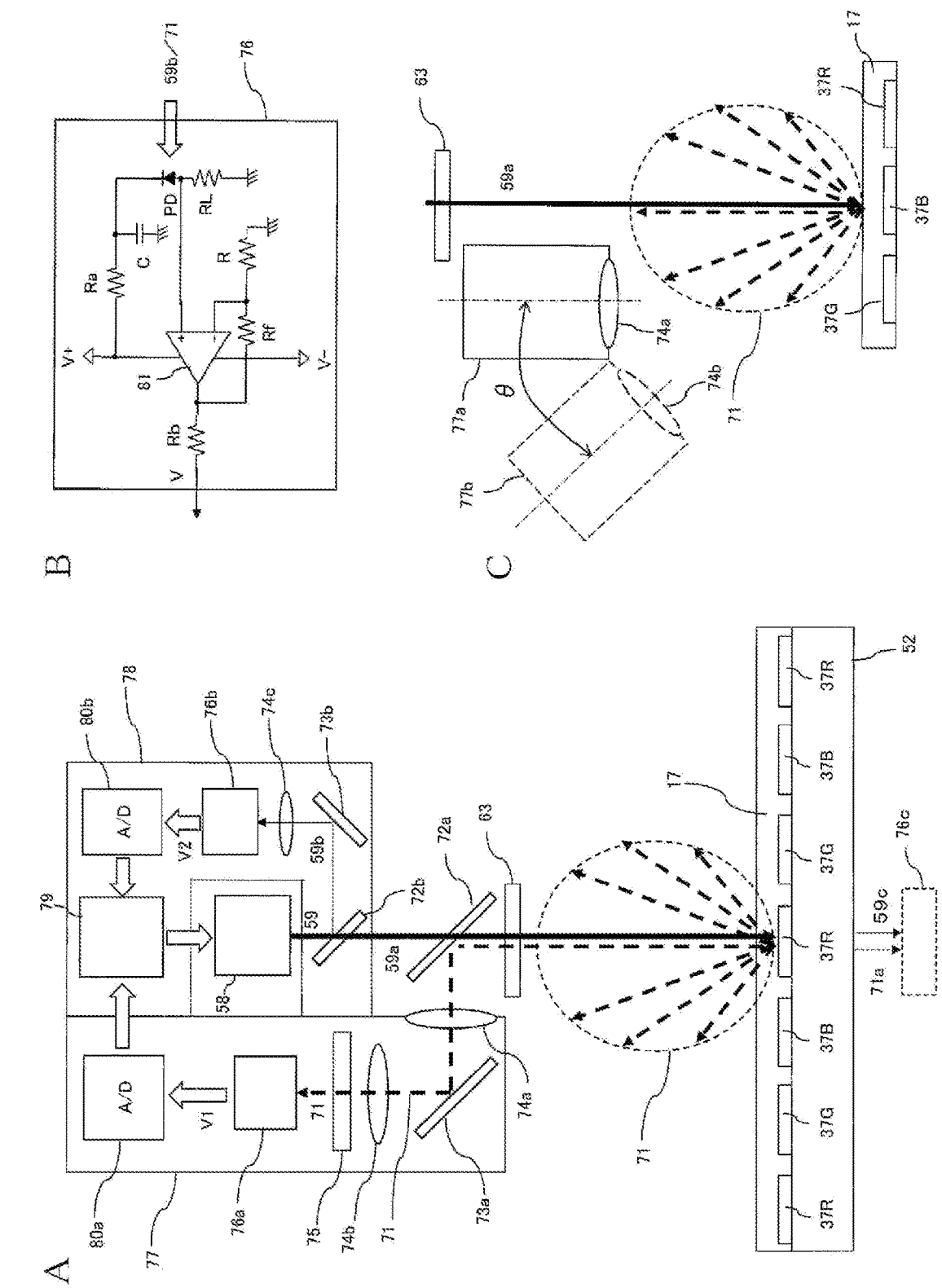
FIG. 6 is a diagram for explaining the laser device in the manufacture of an EL display panel of the present invention.

FIGS. 5 and 6 are explanatory diagrams for describing a method for reforming the light-emitting layer 17 etc. by means of the laser device 58. As illustrated in FIG. 6, an apparatus for carrying out reforming includes a beam detection device 77 and a beam control device 78. The laser device 58 generates a laser beam 59. The laser beam 59 is incident on a beam-splitting mirror 72b. The beam-splitting mirror 72b functions like a half-silvered mirror, for monitoring the intensity of the laser light 59 generated by the laser device 58. The beam-splitting mirror 72b reflects a predetermined proportion of the laser light from the laser beam 59. The laser light 59b reflected by the beam-splitting mirror 72b is reflected by a mirror 73b, concentrated by a lens 74c, and incident on an optical amplifier circuit 76b.

FIG. 6B is a circuit diagram of the optical amplifier circuit 76. The optical amplifier circuit 76 includes a photodiode (PD), an operational amplifier 81, resistors R, a capacitor C, and associated components. In the optical amplifier circuit 76, the laser light 59b is photoelectrically converted by the photodiode (PD). The laser light having been photoelectrically converted is amplified and turned into an analog signal voltage $V_2$. The analog signal voltage $V_2$ is converted into a digital signal by an A/D conversion circuit 80b, which is input into a laser control circuit 79.

The laser control circuit 79, detecting the relative strength of the laser beam 59, feedback-controls the laser device 58 so that the beam strength will be a predetermined intensity setting or within a predetermined intensity range. The feedback control conditions the intensity of the laser beam 59 to be within a predetermined settings range. Laser light 59a from the laser device 58 penetrates the beam-splitting mirror 72b and a beam-splitting mirror 72a, is guided into the vapor-deposition chamber 56 through the laser window 63 in the vapor-deposition chamber 56, and strikes the light-emitting layer 17 that is the object of the reforming process. The beam-splitting mirror 72a functions as a spectrally selective mirror. A multilayer optical film is formed on the front side of the beam-splitting mirror 72a and has the functions of transmitting wavelengths in a given band as well as reflecting wavelengths in a given band. The beam-splitting mirror 72a transmits the laser light 59a and reflects fluorescent/phosphorescent-wavelength light 71 from excitation in the light-emitting layer 17. The fluorescent/phosphorescent-spectrum light 71 is concentrated by a lens 74a, its direction is bent by a mirror 73a, and it is concentrated by a lens 74b. An optical filter 75 transmits only wavelengths within a fixed range among those of the concentrated light 71. The optical filter 75 is employed to undergo excitation and detect the optical intensity of the generated wavelengths within a predetermined band range.

The fluorescent/phosphorescent light 71 transmitted through the optical filter 75 impinges on the optical amplifier circuit 76a. Via the photodiode (PD), the optical amplifier circuit 76a photoelectrically converts the light 71. The photoelectrically converted radiant energy 71 is amplified and made into an analog signal voltage $V_1$. The analog signal voltage $V_1$ is converted into a digital signal by an A/D conversion circuit 80a and input into the laser control circuit 79.

The laser control circuit 79 detects the relative strength of the fluorescent- or phosphorescent-spectrum light 71 and detects whether the light is at a predetermined intensity setting or within a predetermined intensity range, and if the light is at the predetermined intensity setting or within the predetermined intensity range, the laser device 58 changes or shifts the lasing position of the irradiating laser beam 59a. It also changes the intensity of the laser beam 59a. The laser beam 59a is directed onto the deposited light-emitting layer 17, whereby undergoing excitation, the light-emitting layer 17 emits fluorescent/phosphorescent light 71. The laser beam 59a reforms the irradiated light-emitting layer 17. Reforming the light-emitting layer 17 lowers the intensity of the fluorescence/phosphorescence 71 that the light-emitting layer 17 generates. Accordingly, the laser beam 59a dually possesses the functions of both exciting the light-emitting layer 17 and reforming the light-emitting layer 17. Especially, because it is light within the ultraviolet region, the laser beam 59a readily excites the light-emitting layer 17.

Because the wavelength of the laser beam 59a is fixed, it can be readily separated from the wavelengths of the generated fluorescence/phosphorescence 71. That means that the fluorescent/phosphorescent light 71 is easy detected. Further, the fact that the beam detection device 77 is equipped with the optical filter 75 and the beam-splitting mirror 72a, as illustrated in FIG. 6, for separating the fluorescence/phosphorescence 71 facilitates detection.

The transmission wavelength of the optical filter 75 is switched to correspond to the wavelength of the fluorescence/phosphorescence 71 that the light-emitting layers 17 generates. This is because the amplification factor of the optical amplifier circuit 76a differs with the wavelength/intensity of the fluorescence/phosphorescence 71 that the light-emitting layers 17 emit. With the light-emitting layers, since the wavelength/intensity of the fluorescence/phosphorescence 71 that the light-emitting layer 17R emits, the wavelength/intensity of the fluorescence/phosphorescence 71 that the light-emitting layer 17G emits, and the wavelength/intensity of the fluorescence/phosphorescence 71 that the light-emitting layer 17B emits differ, they are controlled to optimum values corresponding to the fluorescence/phosphorescence 71 of each light-emitting layer 17.

Measuring or detecting the intensity of the fluorescence/phosphorescence 71 allows the status of the reforming of the light-emitting layer 17 to be grasped. Once the reforming status has exceeded a predetermined set value, the reforming of the pixel 37 that is the object of irradiating by the laser beam 59a is determined to be completed, and the laser beam 59a is operated to position it onto the next pixel to be reformed.

The beam detection device 77 and the beam control device 78 are attached to the same component. Accordingly, along with the movement of the lasing position of the laser beam 59, the beam detection device 77 also moves at the same time. It will be appreciated, however, that the beam detection device 77 may be installed inside the vapor deposition chamber 56, while the beam control device 78 may be installed outside the vapor deposition chamber 56. The optical amplifier circuit 76 may be situated at the rear side of the TFT substrate 52. Laser light 59c would be detected by an optical amplifier circuit 76c disposed to the rear of the TFT substrate 52. Likewise, fluorescence/phosphorescence 71a would detected by the optical amplifier circuit 76c situated along the rear side of the TFT substrate 52.

The beam detection device 77 is configured so that the angle θ of the lenses 74 that detecting the fluorescence/phosphorescence 71, as indicated in FIG. 6C, may be variable. Varying of the angle θ is conveyed out by a control device installed outside the vapor deposition chamber 56. The angle θ is automatically adjusted to an angle at which the fluorescence/phosphorescence 71 can be detected most strongly. The positions of the lenses 74a to 74b and the beam detection devices 77a to 77b are varied or set so that the intensity of the fluorescence/phosphorescence 71 can be detected most strongly. It is preferable that the beam detection device 77 be configured so that it may discriminate not only the intensity but also the wavelength of the fluorescence/phosphorescence 71. For example, the proportion to which the reds' emission wavelength has changed into greens' emission wavelength, or the amount of the change is detected. If it has changed into greens' emission wavelength, reds' emission wavelength resultantly is put into a "quenched" state and may be detected as having become non-emitting. It should be noted that, distinct from the laser beam 59a shone on the light-emitting layers 17, light for exciting the light-emitting layers 17 may be separately generated, and the light-emitting layer 17G may be irradiated with the light. An example that illustrates is a configuration in which a laser-beam 59 generation device for fluorescent/phosphorescent emission is set up separately, and in which the laser beam 59 is directed onto the light-emitting layers 17 being reformed.

When the intensity of the generated fluorescence/phosphorescence 71 goes to a predetermined value or less, the light-emitting layer 17 has been put into a quenched state. With the layer having been put into a quenched state, the reforming of the light-emitting layer 17G is determined to be completed, and the lasing position of the laser beam 59a is shifted to the next pixel. Further, the time necessary for the reforming is gauged, whereby the intensity of the laser beam 59a is controlled. Monitoring the intensity/wavelength of the fluorescence/phosphorescence 71 with the beam detection device 77 makes it possible to put the light-emitting layer 17 in the pixel that is the object of the reforming very precisely into a quenched state. And because monitoring, with the beam control device 78, the intensity of the laser beam 59 that the laser device 58 outputs makes it possible to put the intensity of the laser light directed onto the light-emitting layer 17 at a stabilized, constant setting, the light-emitting layer 17 in the pixel that is the reform target can be put very precisely into a quenched state.

The laser device 58 has the function of generating light of wavelength from at least 310 nm to not more than 400 nm in the ultraviolet-A (UV-A) proximity, and of directing the generated light onto a predetermined pixel electrode 15. Thanks to the energy that their photons possess being large, ultraviolet-ray generating laser devices can perform photolytic processing in which irradiating materials (mainly organic substances) that possess areas where the bonds are weak directly dissociates the molecular bonds. In photolytic processing, since the energy striking a workpiece does not heat it, but is used chiefly by the decomposition, the processed surface is left extremely keen. As laser devices that generate light having wavelengths in the ultraviolet region, ultraviolet lasers (frequency-tripled and frequency-quadrupled YAG lasers), solid-state ultraviolet lasers, and excimer lasers illustrate some examples. The fact that the laser beam 59 can be concentrated and directed onto the process site makes it possible readily to reform or vaporize organic material etc. in the process site. Thanks to the vaporizing of the organic material etc. being conveyed out within a vacuum, carbonizing of the organic material is nonexistent, and there is no impact on the area surrounding the site irradiated with the laser beam.

The configuration is preferably such that laser beam 59 may be shone onto the TFT substrate 52 from above it. Despite the guest material being heated by the laser beam 59 and the heated guest material sublimating, clinging of the material onto the surrounding area can be kept to a minimum.

A femtosecond laser device may be utilized for the laser device 58. A femtosecond laser device, a pulse laser, is laser device whose pulse width is at the femtosecond level. Laser intensity is expressed by $I=E/(S \cdot t)$, wherein E is the pulse energy, S is the surface area of the beam spot, and t is the time width of the laser pulse. Unlike $CO_2$ laser devices and YAG laser devices employed in ordinary manufacturing processes, femtosecond laser devices are characterized by nonthermal processes. When a $CO_2$ laser beam or a YAG laser beam strikes a processing-target object, it is worked by the object's molecules absorbing the photoenergy and vibrating, and by the light energy being converted into thermal energy melting and vaporizing the object. In the case of femtosecond lasers, manufacturing processes can be done by virtue of a phenomenon called "ablation" in which molecular bonds are severed by the photoenergy and the molecules are removed without thermally diffusing to the peripheral regions. Accordingly, only the location irradiated with the laser beam 59 is reformed, with the periphery not being thermally influenced or affected.

The laser-spot size, as indicated by the laser spot 91a in FIG. 7, of the laser beam 59 could be smaller than the pixel electrodes 15. This is because the entire area of a pixel electrode 15 can be irradiated with the laser beam 59a by shifting the laser spot 91a within the pixel electrode 15.

The distribution of the laser beam 59a intensity is a Gaussian distribution. If the entirety of the location that is reformed is irradiated with the laser beam 59, it is preferable that as graphed in FIG. 7B, the span $W_1$ at intensity 63% in the Gaussian distribution of the laser beam 59a be made the width of the light-emitting layer 17 to be reformed. More preferably, the span $W_2$ at intensity 80% in the Gaussian distribution of the laser light 59a is favorably set to the width of the light-emitting layer 17 to be reformed.

Whether the guest material in the light-emitting layers 17 will be reformed or vaporized may be easily realized by the laser device 58 generating and controlling the intensity of the laser beam 59 directed onto the TFT substrate 52. Varying of the laser beam 59a intensity takes place in the optical density filter 60. Here, the optical density filter 60 preferably is constituted so that the intensity of the laser beam 59a may be varied in units of the laser beam 59a pulses.

Having the laser spots be oval or rectangular so as to surround the entirety of a pixel electrode(s) 15, as with 91b and 91c in FIG. 7 is advantageous. Making the laser beam 59a elliptical or rectangular may be realized easily by employing the cylindrical lens 61. Laser spot 91b is of geometry whereby a single pixel electrode 15 is irradiated over its entire range. Laser spot 91c is of geometry whereby a plurality of pixel electrodes 15 is irradiated simultaneously. Having the laser spot be in stripe form, as with laser spot 91d in FIG. 7, and irradiating the TFT substrate 52 with line of laser light 59 is also advantageous.

The laser spot 91 from the laser beam 59 is directed onto a pixel 37 to be reformed, and the position of the laser spot 91 is shifted to reform the light-emitting-layer guest material or host material in the pixel 37. Alternatively, the host material and the guest material that form the light-emitting layer 17 are vaporized.

Figure 8:
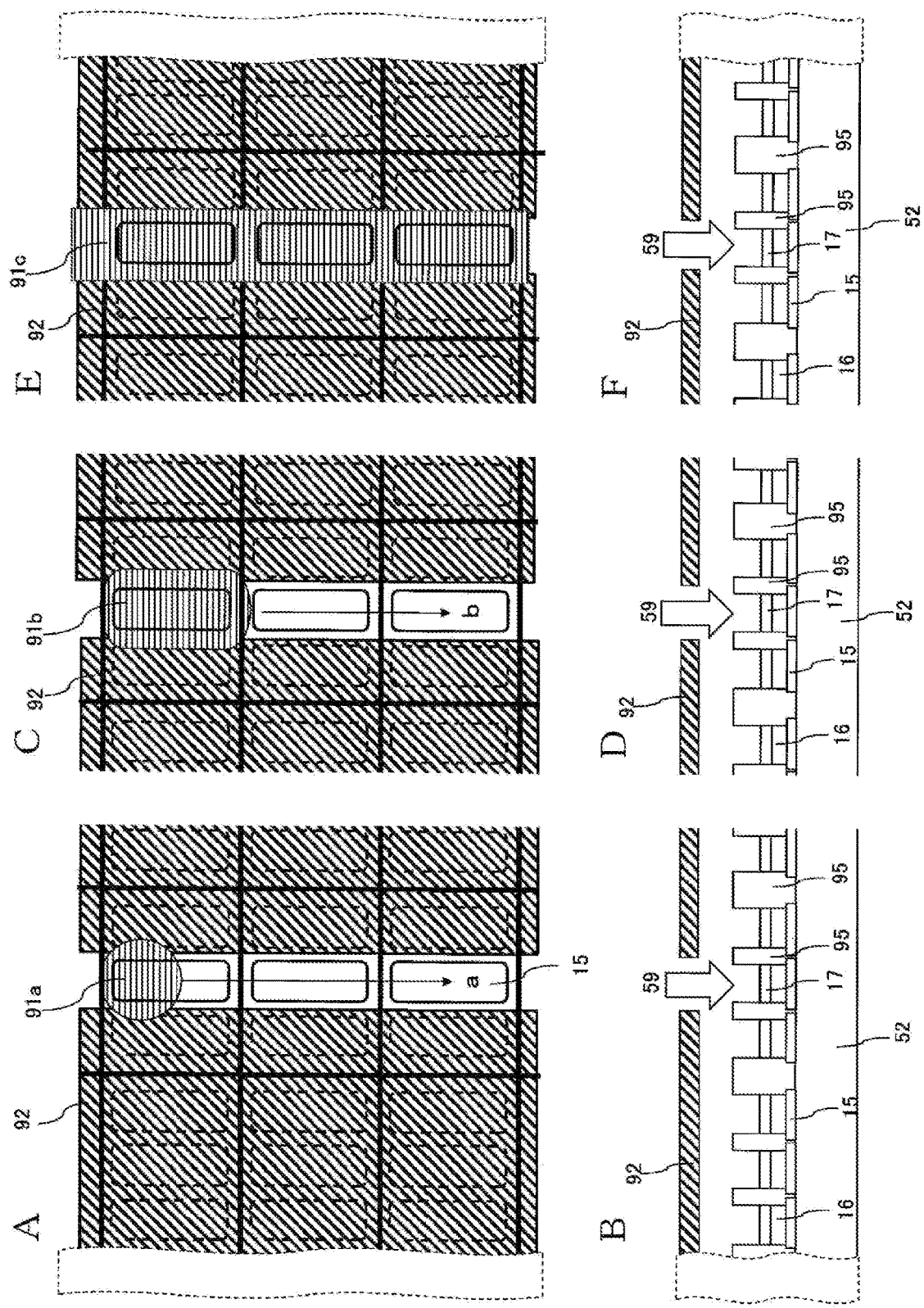
FIG. 8 is diagrams for explaining an EL Display-Panel manufacturing method of the present invention.

With the horizontal width of the pixels 37 being a narrow 30 μm or less, in some cases directing the laser-beam 59 laser spot 91 onto a pixel 37 irradiates a neighboring column of pixels 37 with the laser light. In those cases, a slit mask 92 as illustrated in FIG. 8 is employed to make it so that the neighboring pixel columns are not irradiated with the laser light 59. As illustrated in the plan view and the sectional view of FIGS. 8A and 8B, with the laser spot 91a through the slit in the slit mask 92, the laser beam 59 is directed onto the light-emitting layer 17. The laser spot 91a is scanned in the α-direction, whereby the pixels down the pixel column are reformed in sequence. As illustrated in the plan view and the sectional view of FIGS. 8C and 8D, with the laser spot 91b through the slit in the slit mask 92, the laser beam 59 is directed onto the light-emitting layer 17. The laser spot 91a is scanned in the β-direction, whereby the pixels down the pixel column are reformed in sequence. As illustrated in the plan view and the sectional view of FIGS. 8E and 8F, with the rectangular laser spot 91c through the slit in the slit mask 92, the laser beam 59 is directed onto the light-emitting layer 17. The rectangular laser spot 91c simultaneously lases the pixels in a single row of the display screen 36. As to the light-emitting layers 17 in the pixel example that the laser light 59 irradiates, the light-emitting layers 17 in the pixels of a single row are simultaneously reformed.

The slit mask 92 is shifted to accord with the travel of the laser spot 91, reforming the light-emitting layer 17 in a predetermined-color pixel in the display screen 36. Alternatively, the laser spot 91 is shifted to align with the position of the hole in the slit mask, to reform the light-emitting layer 17 in a predetermined-color pixel in the display screen 36. The slit mask 92 is formed by a thin metal membrane or a synthetic resin film. For this reason, because the slit mask 92 is situated to correspond to the position of the pixels 37, it is necessary to place the mask under tension and retain it in a planar condition.

Figure 9:
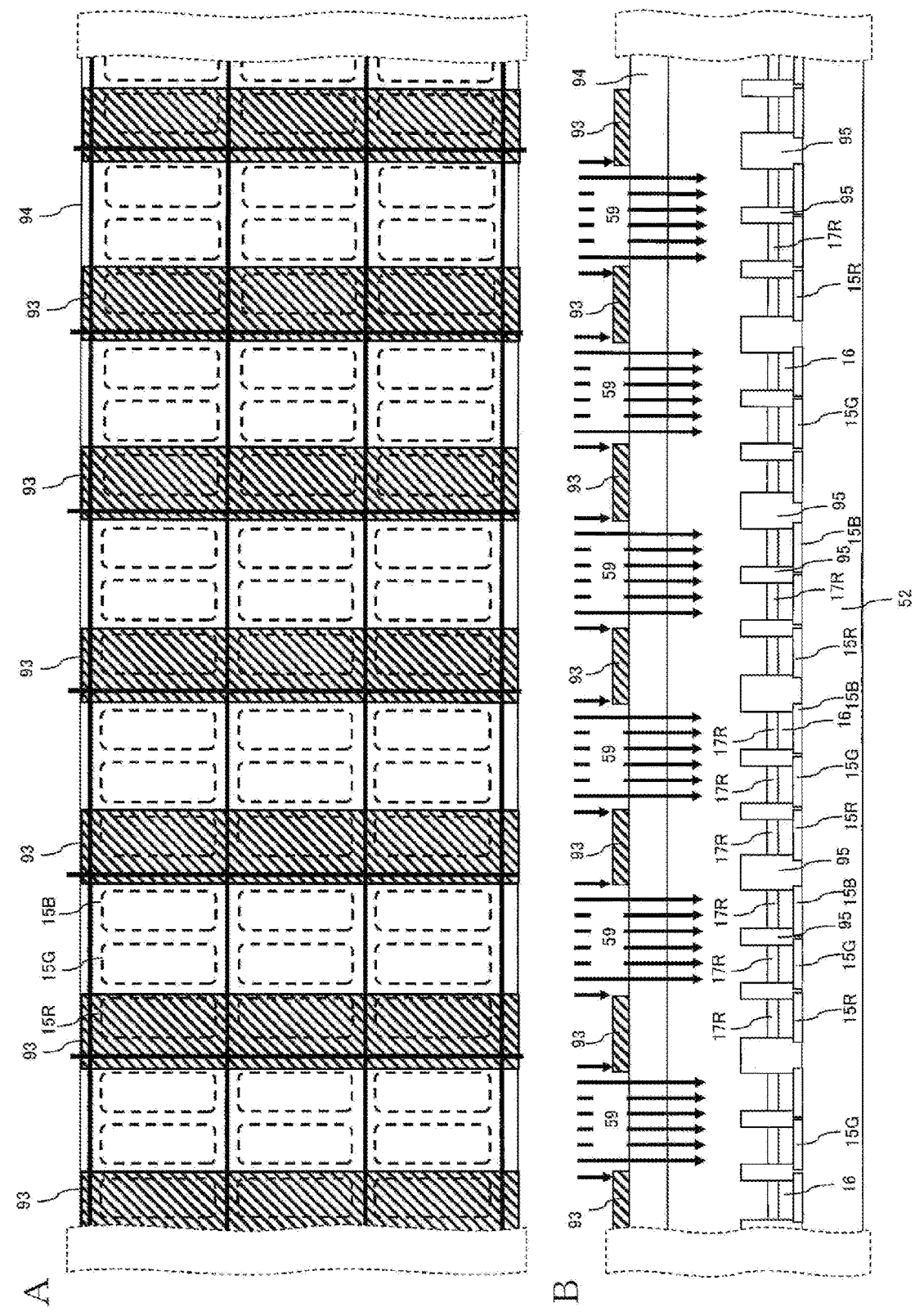
FIG. 9 is diagrams for explaining an EL Display-Panel manufacturing method of the present invention.

As shown in FIG. 9, a transparent substrate 94 on which is formed a slit-patterned sheet 93 of metal or other suitable material may be utilized. As the transparent substrate 94, a baseplate that transmits the laser beam 59 or other light of wavelength in the ultraviolet region is employed. As the transparent substrate 94, quartz glass, soda-lime glass, and the like illustrate examples. As illustrated in the plan view and the sectional view of FIGS. 9A and 9B, through the slit openings in the slit-patterned sheet 93, the laser beam 59 is directed onto the light-emitting layer 17. The laser beam 59 penetrating the slit openings is of rectangular form and simultaneously illuminates the pixels in a single row of the display screen 36. As to the light-emitting layers 17 in the pixel example that the laser light 59 irradiates, the light-emitting layers 17 in the pixels of a single row are simultaneously reformed.

Figure 10:
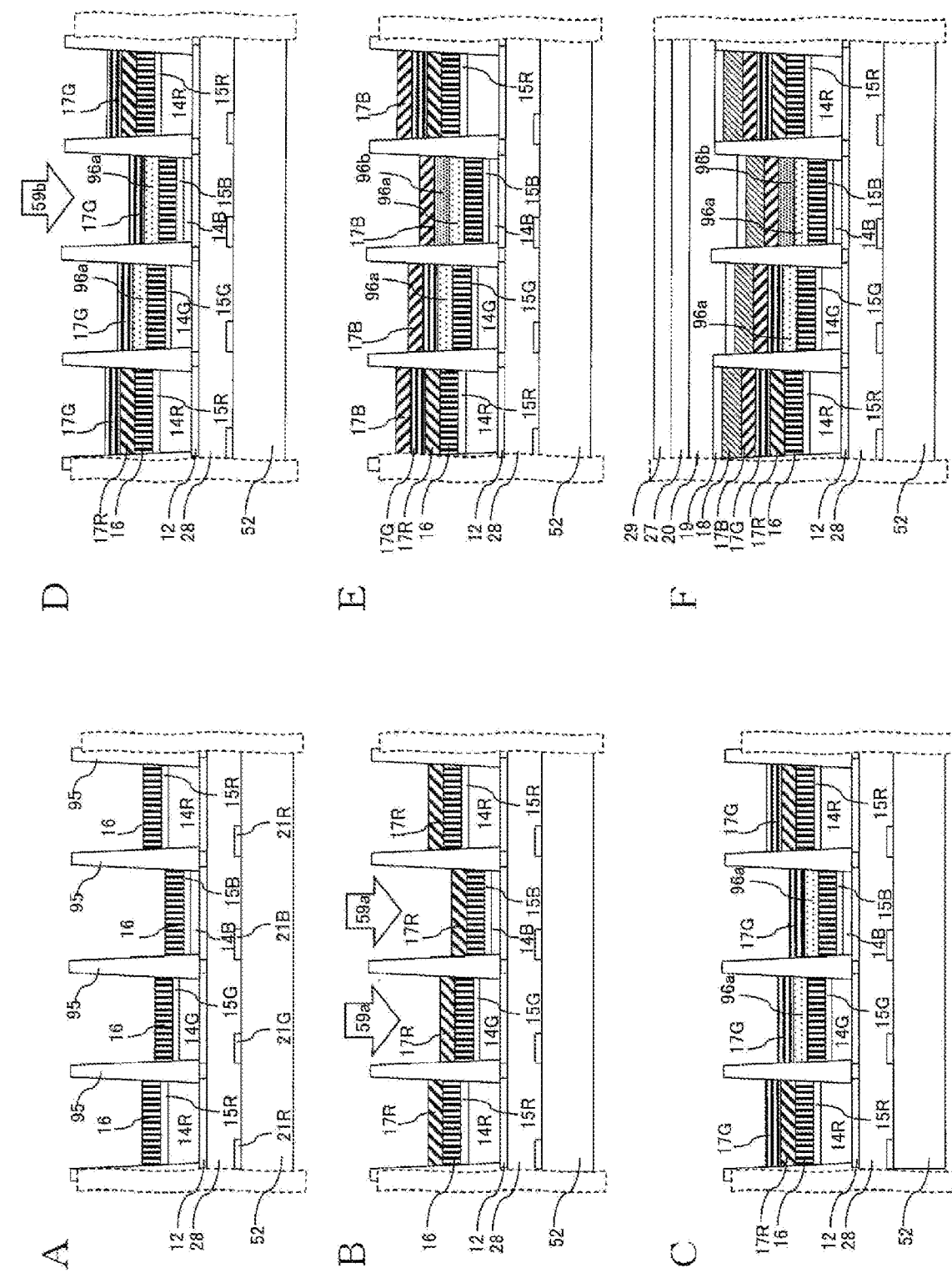
FIG. 10 is diagrams for explaining operations in the manufacture of the EL display panel in the first embodiment example of the present invention.
Figure 11:
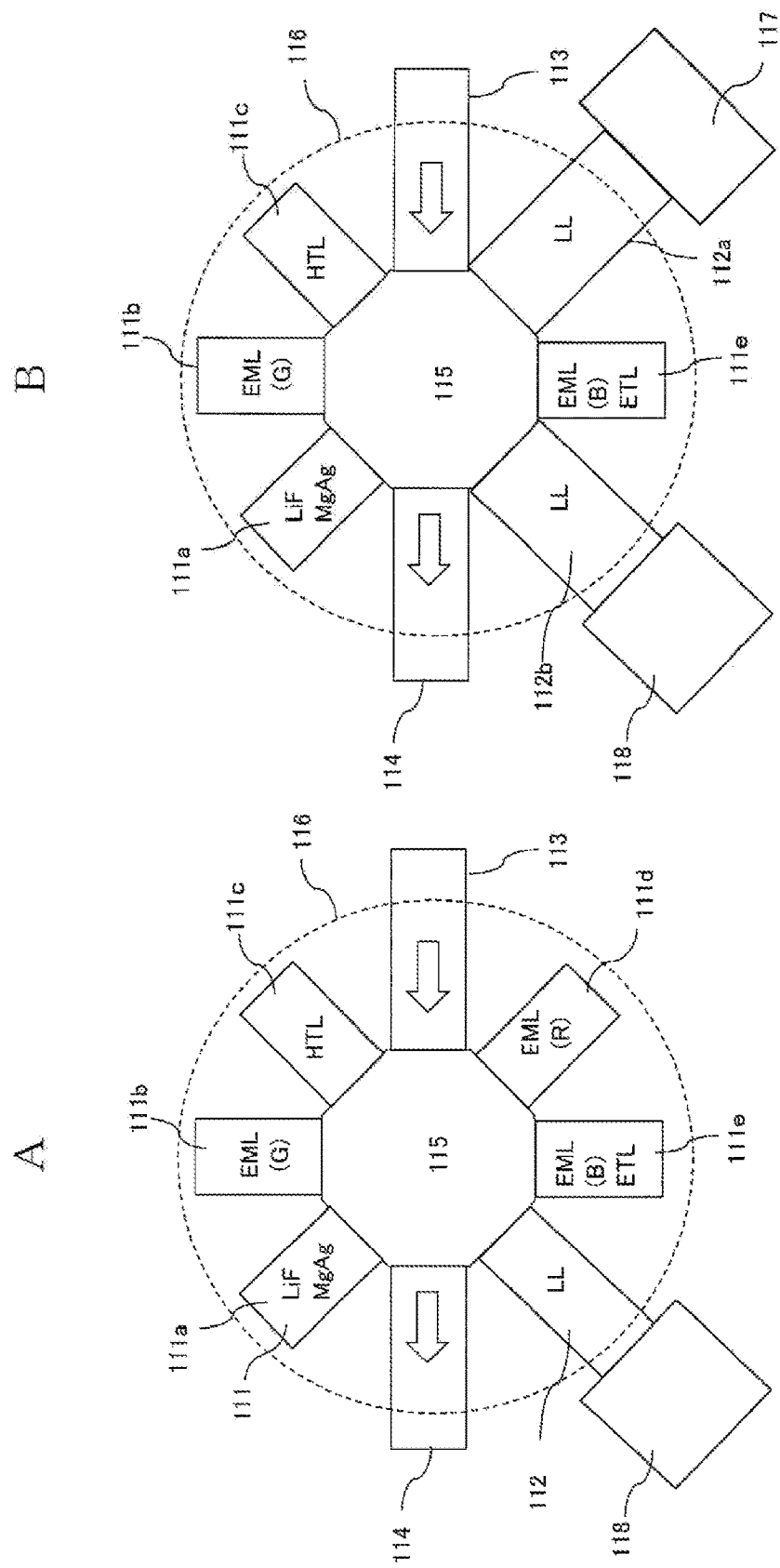
FIG. 11 is diagrams for explaining an EL Display-Panel manufacturing apparatus of the present invention.

The EL display-panel manufacturing method of the present invention in the first embodiment example will be described. FIG. 10 is a diagram for explaining the EL display-panel manufacturing method of the present invention in the first embodiment example. FIG. 11 is also a diagram for explaining the EL display-panel manufacturing method of the present invention. As indicated in FIG. 4, in a manufacturing method of the present invention, the TFT substrate 52 is set into place in a vacuum state such as in the vapor deposition chamber 56. Each of the organic films constituting the EL elements 22 is formed by vapor deposition.

In FIG. 11, the TFT substrate 52 is conveyed into the film-forming tool 116 from a convey-in chamber 113. The film-forming tool 116 interior is maintained in an ultra-vacuum state. In the middle of the film-forming tool 116 is a central chamber 115, and installed in the central chamber 115 interior is a transport robot (not illustrated) that conveys TFTs to compartment chambers 111, as well as conveys them out of the compartment chambers 111. The transfer robot conveys the sliding stage 51 with associated components out from a compartment chamber 111, changes its direction, and conveys it into a compartment chamber 111 for a subsequent process operation.

The laser device 58 for reforming the light-emitting layers 17 etc. is installed inside the laser device chamber 118, wherein the TFT substrate 52 is conveyed into the laser device chamber 118 via a load-lock (LL) chamber. Following formation of the cathode electrodes 19 on the TFT substrate 52 or following sealing of the substrate with a sealing membrane 20 and a sealing film 27, the substrate is conveyed out from a convey-out chamber 114. Having been conveyed in from the convey-in chamber 113, the TFT substrate 52 is conveyed into a hole-transport-layer 16 deposition chamber (HTL) 111c. In the compartment chamber 111c, as illustrated in FIGS. 10A and 11A, the hole-transport layer 16 is formed over the pixel electrodes 15 on the TFT substrate 52.

Next, the TFT substrate 52 is conveyed into a compartment chamber (EML (R)) 111d where emission-layers (EML) R are deposited. By means of a vapor-deposition technique, as illustrated in FIG. 10B the light-emitting layer 17R is laminated onto the hole-transport layers 16. The light-emitting layer 17R is formed by codeposition of a host material and a red guest material. In the manufacturing step of forming the light-emitting layer 17R, a vapor-deposition fine mask 251R provided with openings in positions corresponding to the pixels 37R, as with conventional manufacturing methods, is not employed. The light-emitting layer 17R is formed as a continuous film on the entire display screen 36 by the employing of a vapor deposition technique. That is, the light-emitting layer 17R is formed continuously and in common on the pixel electrodes 15R, the pixel electrodes 15G, and the pixel electrodes 15B. For the formation of the light-emitting layer 17R, a vapor-deposition coarse mask (not depicted) having an opening for the display screen 36 is employed so that the light-emitting layer 17R will be vapor-deposited inside the display screen 36.

In the present-invention embodiment examples of FIG. 10 etc., in the EL display panel banks 95 are depicted, but the banks 95 are not necessarily required constituent elements. The banks 95, formed onto the source signal lines 35, onto the gate signal lines 34, and on the periphery of the pixel electrodes 15, exhibit an electric-field shielding effect. The banks formed of a material into which pigments and dyes that absorb visible light has been added. The TFT substrate 52 in the central chamber 115 is directionally switched around by the transport robot, then is conveyed into the laser device chamber 118 via the load-lock chamber 112. In the laser device chamber 118, irradiating of the light-emitting layer 17 on the TFT substrate 52 with the laser beam 59a is carried out, as indicated in FIG. 10B. The laser beam 59a is directed onto the light-emitting layer 17R where it is above the pixel electrodes 15G and the pixel electrodes 15B. The laser beam 59a is not directed onto the light-emitting layer 17R where it is above the pixel electrodes 15R. Reformed with the lasing portion of the laser beam 59a, the light-emitting layer 17R is made into reformed sections 96a.

Absorbing the laser light 59a, the covalently bonded chains in the guest material in the light-emitting layer 17R over the pixel electrodes 15G and the pixel electrodes 15B are severed. In the oxygen-free deposition chamber 56, when the covalently bonded chains break, radicals from the covalently bonded chains, creating double bonds, stripping away and bonding with atoms from other covalently bonded chains, and otherwise creating crosslinked structures with other covalently bonded chains, produce change in structure. The guest material in the light-emitting layer 17R corresponding to the pixel electrodes 15R is not irradiated with the laser beam 59a. Accordingly, as a light-emitting guest material its capacity is maintained.

In exemplary implementations of the present invention, each organic film by which the EL elements 22 are built is described as being formed by a vapor deposition technique, but the implementations are not thereby limited. It will be appreciated that the electron-transport layers 18, the hole-transport layers 16, and the light-emitting layers 17 etc. may be formed by an inkjet scheme or a printing scheme. For example, for the light-emitting layer 17, a host material and a guest material are dissolved in a solvent and by an inkjet scheme are formed over the pixel electrodes 15 as the light-emitting layer 17. Procedures whereby, as well as EL display-panel (device) configurations in which, the light-emitting layer 17R is formed by an inkjet scheme and the light-emitting layer 17R is reformed by being irradiated with the laser beam 59 also come under the technical category of the present invention.

Further, while the present invention has had it that, for the sake of facilitating comprehension, the light-emitting layers 17 are reformed principally by the guest material absorbing light, it is not thereby limited. Procedures whereby, as well as EL display-panels (devices) in which, the light-emitting layer 17 is formed of a solitary organic film such as Alq$_3$, for example, in which case the solitary organic film is irradiated with light to reform the solitary organic film, also come under the technical category of the present invention. Also, procedures whereby, as well as EL display-panels (devices) in which, the hole-transport layers etc. are reformed by being irradiated with the laser beam 59 also come under the technical category of the present invention.

The laser beam 59 is ultraviolet light having a wavelength λ of from at least 300 nm to not more than 420 nm. More preferably, the laser beam 59 is ultraviolet light having a wavelength λ of from at least 310 nm to not more than 400 nm.

Next, the TFT substrate 52 is conveyed into the central chamber 115 via the load-lock chamber 112, then conveyed into the compartment chamber (EML (G)) 111b. In the compartment chamber 111b, the light-emitting layer 17G is laminated over the light-emitting layer 17R, as illustrated in FIG. 10C, by a vapor deposition technique. In the manufacturing step of depositing the light-emitting layer 17G, a vapor-deposition fine mask 251R is not employed. A vapor-deposition coarse mask (not depicted) is employed to deposit the light-emitting layer 17G on the display screen 36 in the display panel. Accordingly, the light-emitting layer 17G is formed in common above the pixel electrodes 15R, the pixel electrodes 15G, and the pixel electrodes 15B.

The TFT substrate 52 in the central chamber 115 is directionally switched around by the transport robot, then is conveyed into the laser device chamber 118 via the load-lock chamber 112. In the laser device chamber 118, irradiating of the light-emitting layer 17G on the TFT substrate 52 with the laser beam 59b is carried out, as indicated in FIG. 10D. The laser beam 59b is directed onto the light-emitting layer 17G where it is above the pixel electrodes 15B. The laser beam 59b is not directed onto the light-emitting layer 17G where it is above the pixel electrodes 15R and the pixel electrodes 15G. Reformed by the lasing portion of the laser beam 59b, the light-emitting layer 17G is made into reformed sections 96b. In many cases the excitation energy of the guest material in the light-emitting layer 17G is greater compared with that of the guest material in the light-emitting layer 17R. A guest material whose excitation energy is greater can mean that the wavelengths absorbed will be shorter. In those cases, for the laser-beam 59b wavelength, a laser beam whose wavelength is shorter than that of the laser beam 59a is selected. For example, the laser beam 59b is ultraviolet light of wavelength λ from at least 300 nm to not more than 380 nm. The laser beam 59a is ultraviolet light of wavelength λ from at least 310 nm to not more than 400 nm. Alternatively, the wavelengths of the laser beam 59a and the laser beam 59b may be the same, while the per-unit-surface-area intensities of the laser beam 59a and the laser beam 59b are made to differ.

Absorbing the laser light 59b, the light-emitting layer 17G where it is above the pixels 37B (pixel electrodes 15B) is reformed. The light-emitting layer 17G where it is above the pixels 37B (pixel electrodes 15B) is made into reformed sections 96b. Consequently, having been reformed the guest material in the light-emitting layer 17G may not undergo excitation. The light-emitting layer 17G behaves as a host material. The light-emitting layer 17R above the pixel electrodes 15G is set forth as being reformed sections 96a, while the light-emitting layer 17G above the pixel electrodes 15B is set forth as being reformed sections 96b. The reformed sections 96a and the reformed sections 96b differ in their guest and associated materials and frequently differ physically or in terms of physical properties. Nevertheless, it often happens that the physical properties of the reformed sections 96a and of the reformed sections 96b are the same or are similar. Accordingly, the reformed sections 96a and the reformed sections 96b may be assumed to be the same and be "reformed sections 96."

The TFT substrate 52 is conveyed into the compartment chamber (EML (B) ETL) 111e, as illustrated in FIG. 11A, via the central chamber 115. The light-emitting layer 17B, as illustrated in FIG. 10E, is laminated over the light-emitting layer 17G. As to the deposition of the light-emitting layer 17B material, a host material and a blue-light-emitting guest material within a vacuum are co-deposited and laminated onto the light-emitting layer 17G by vacuum vapor deposition. In the manufacturing step of vacuum vapor-depositing the light-emitting layer 17B, a vapor-deposition fine mask 251R is not employed. A vapor-deposition coarse mask (not depicted) is employed to deposit the light-emitting layer 17B on the entirety of the display screen 36 in the display panel. Accordingly, the light-emitting layer 17B is formed in common above the pixel electrodes 15R, the pixel electrodes 15G, and the pixel electrodes 15B.

Next, an electron-transport layer 18 as represented in FIG. 10F is formed over the light-emitting layer 17B, following which LiF or Liq or the like as an electron injection membrane is built on, and a cathode electrode 19 is laminated onto the electron-transport layer 18. For the cathode electrode 19, aluminum, silver, a silver-magnesium (MgAg) alloy, calcium, or the like is utilized. The cathode electrode 19 is laminated over the light-emitting layer 17B by, for example, vacuum vapor deposition. In the vacuum vapor deposition, a vapor-deposition coarse mask is used so that the cathode-electrode material will be deposited in the display area of the EL display panel. A cathode electrode 19 is thereby formed as a continuous film over the entire display area.

Next, after the cathode electrode (cathode) 19 as illustrated in FIG. 10F has been formed, a sealing membrane 20 is built on to an extent that will not exert an influence on the groundwork, by a film forming method in which the energy of the film-forming particles is small—e.g., physical vapor deposition or CVD. For example, in cases where a sealing membrane 20 made from amorphous silicon nitride is built on, it is formed to a film thickness of 2 to 3 μm by CVD. Therein, in order to prevent degradation in luminance due to deterioration of the organic layer, the film forming temperature is set to within a range of from Celsius 15° C. to 25° C., near normal temperatures.

Also, the sealing membrane 20 may be rendered by building on SiON or the like by CVD, and thereafter building on an acrylic or epoxy organic material or the like. Preferably a moisture-proofing measure is taken by pasting a sealing film 27 onto the sealing membrane 20. Next, the TFT substrate 52 and a sealing substrate are glued together with a sealing layer intervening so that the EL display elements are encompassed by the TFT substrate 52, the sealing substrate, and the sealing layer. Alternatively, the TFT substrate 52 is sealed by thin-film sealing technology. With thin-film sealing technology, extremely thin inorganic membranes and organic membranes are formed laminated in multiple layers onto the TFT substrate 52. A multilayer structure is imparted in which inorganic membranes (ordinary thickness less than 1 µm) and organic membranes (ordinary thickness 6 µm and above) are overlaid in alternation. The inorganic membranes protect the EL elements 22 chiefly by preventing intrusion of oxygen and moisture.

The TFT substrate 25 is conveyed out from the film-forming tool 116 via the convey-out chamber 114. It should be noted that in order to have the display contrast be excellent, a circularly polarizing plate (circularly polarizing film) 29 is pasted on or otherwise arranged on the light-exiting side of the EL display panel.

With the embodiment example of FIG. 10, it was explained that a laser device for generating a laser beam 59a and a laser device 58 for generating a laser beam 59b are set up, but the present invention is not thereby limited. The laser beam 59a and the laser beam 59b may be generated by a single laser device 58 that generates a variable-wavelength beam. And it will be appreciated that a plurality of laser devices 58 that generate laser light either as laser beam 59a or laser beam 59b may be set up. The wavelengths of the laser beam 59a and the laser beam 59b may be made to differ. In the foregoing embodiment example, it was explained that after the light-emitting layer 17 is formed, the laser beam 59 is directed on it to reform the light-emitting layer 17, but the present invention is not thereby limited. For example, while the light-emitting layer 17 is being formed by vapor deposition, the laser beam 59 may be directed on it to reform or remove the light-emitting layer 17.

In an EL display panel of the present invention, pixels 37 for a plurality of colors are arranged in matrix form. In the EL display panel, on pixels for at least one color, a light-emitting layer 17a for a first color is layered, and atop it a light-emitting layer 17b for a second color is layered. The emission wavelength from the first-color light-emitting layer 17a is longer than the emission wavelength from the second-color light-emitting layer 17b. The guest material in the first-color light-emitting layer 17a absorbs the energy whereby the second-color light-emitting layer 17b undergoes excitation, and emits light. In an EL display panel of the present invention, the light-emitting layer 17a for the first color is layered on pixels for at least one color, and atop it the light-emitting layer 17b for the second color is layered. The laser beam 59 or other beam having narrow directivity is directed onto the light-emitting layer 17a of the first color to reform the first-color light-emitting layer 17a and render it a non-emitting layer. The light-emitting layer 17b of the second color is light-emitting. In a case where, for example, a bilaminar light-emitting lamina being the red light-emitting layer 17R and the green light-emitting layer 17G has been laminated over the pixel electrodes 15, by reforming the red light-emitting layer 17R, the red light-emitting layer 17R does not emit light; the green light-emitting layer 17G alone emits light, and the pixels 37 having the aforesaid pixel electrodes 15 emit green light.

The present invention is not limited by EL display panels in which pixels 37 for a plurality of colors are arranged in matrix form. In display panels of the present invention, a section that emits light in a plurality of locations is formed in a display unit or else a display screen 36, wherein a plurality of light-emitting layers 17 is laminated on the light-emitting section. The light-emitting section is characterized in that, without a vapor-deposition fine mask 251 etc. being employed, a laser beam 59 or other beam of narrow directivity is directed onto the light-emitting layers 17 of longer wavelength among the plurality of light-emitting layers 17, whereby the longer wavelength light-emitting layers 17 are reformed.

With manufacturing methods and manufacturing apparatuses of the present invention, during the formation of at least any of the light-emitting layers 17 in order to build the light-emitting layer 17R, the light-emitting layer 17G, and the light-emitting layer 17B, no vapor-deposition fine mask 251 is employed. In the present invention, in order to form a light-emitting layer 17R, light-emitting layer 17G, or light-emitting layer 17B that emits light, at least any one of the light-emitting layers 17 is irradiated with the laser beam 59 or other ultraviolet beam of narrow directivity. For control of the lasing position of the laser beam 59, positioning with a high level of precisions can be carried out by means of the mirror galvanometer 62 or a sliding stage (linear stage or the like). Further, the positioning can be easily set to correspond to the position of a pixel 37 on the TFT substrate 52. Accordingly, EL display panels in which the form of the pixels 37, the arrangement of the pixels 37, or the number of the pixels 37 differ can be readily manufactured by changing the product variety. What is more, the equipment cost of the manufacturing apparatus is extraordinarily inexpensive.

In conventional manufacturing schemes employing vapor-deposition fine masks 251, in cases where the pixels 37 are high-definition, the fact that the deposition openings (mask apertures) in the vapor-deposition fine mask 251 are smaller means that fabricating the vapor deposition openings in the vapor-deposition fine mask 251 is arduous. A further issue has been that positioning the vapor-deposition fine mask 251 to accord with the positions of the pixels 37 in the EL display panel is challenging. Still further, vapor-deposition fine masks 251 employed in the manufacture of large EL display panels for televisions are large in surface area and heavy in weight. A consequent issue has been that the transport robot that positions the vapor-deposition fine masks 251 is also large-scale.

In manufacturing schemes and manufacturing apparatuses of the present invention, the emission colors of the light-emitting layers 17 is determined by irradiating the pixels 37 with the laser beam 59. With ultraviolet-wavelength laser beams 59, spot sizes of 10 µm or less diameter are realizable. Further, such laser beams 59 may be positioned at high speed by mirror-galvanometer 62 control. And even with the EL display-panel dimensions being wide-area, by mirror-galvanometer 62 control or by shifting of the sliding stage 51 etc., the laser beam 59 may be positioned at high speed into any site on the EL display panel, from its periphery to its midportion. What is more, since only control of the laser beam 59, not positioning of the vapor-deposition fine mask 251, is required, manufacturing facilities are inexpensive and manufacturing Takt time can be shortened. Through the foregoing features, with the manufacturing schemes of the present invention, EL display panels can be manufactured at low cost even with the pixels 37 being high-definition and the EL display-panel dimensions being wide-area. What is more, outstanding display grade and high manufacturing yield may be realized.

The embodiment illustrated with FIGS. 1 and 10 was an example in which the light-emitting layers 17 are irradiated with a laser beam 59 to reform the light-emitting layers 17. Nevertheless, the present invention is not thereby limited. A light-emitting layer 17 continuing over neighboring pixels 37 may be formed, and by irradiating the light-emitting layer 17 in those pixels 37 with the laser beam 59, light-emitting layer 17 there may be removed. For example, in FIG. 10B, on the TFT substrate 52 the light-emitting layer 17R is laminated onto the hole-transport layer 16. The light-emitting layer 17R is formed as a light-emitting layer 17R continuing over the red pixels 37R, the green pixels 37G, and the blue pixels 37B. Next, the laser beam 59a is directed onto the light-emitting layer 17R above the green pixel electrodes 15G and the blue pixel electrodes 15B. The irradiating by the laser beam 59a superheats the light-emitting layer 17R, vaporizing it. By being vaporized, the light-emitting layer 17R is removed.

Further, as indicated in FIG. 10D, the light-emitting layer 17G above the blue pixel electrodes 15B is irradiated with the laser beam 59b. By being irradiated with the laser beam 59b, the light-emitting layer 17G absorbs the laser light 59b and is thereby superheated and vaporized. By being vaporized, the light-emitting layer 17G is removed from atop the hole-transport layer 16.

By means of the foregoing manufacturing steps, three light-emitting layers, the light-emitting layer 17R, the light-emitting layer 17G, and the light-emitting layer 17G, are laminated over the red pixel electrodes 15R. Two light-emitting layers, the light-emitting layer 17G and the light-emitting layer 17G, are laminated over the green pixel electrodes 15G. The light-emitting layer 17G is laminated over the blue pixel electrodes 15B.

It should be noted that in the manufacturing step of FIG. 10B, although the light-emitting layer 17R is removed by being vaporized, in some cases a portion of the light-emitting layer 17R may be left remaining. Because light-emitting layer 17R remaining is reformed by the laser beam 59a, however, it does not contribute to optical emission. In the manufacturing step of FIG. 10D, although the light-emitting layer 17G is removed by being vaporized, in some cases a portion of the light-emitting layer 17G may be left remaining. Because light-emitting layer 17G remaining is reformed by the laser beam 59b, however, it does not contribute to optical emission.

In the pixels 37R, at least a portion of the excitation energy that the light-emitting layer 17B releases is converted into light having the emission spectrum of the guest material that the light-emitting layer 17R contains. At least a portion of the energy whereby by the light-emitting layer 17G is excited is converted into light having the emission spectrum of the guest material that the light-emitting layer 17R contains. Accordingly, with the emission color of the pixels 37R being about equal to the emission color of the light-emitting layer 17R, the pixels 37R give off red light. In the pixels 37G, recombination of electrons and holes occurs mainly in the light-emitting layer 17G, but there is a possibility that the recombining emits light in the light-emitting layer 17B. At least a portion of the excitation energy that the light-emitting layer 17B releases is converted into light having the emission spectrum of the guest material that the light-emitting layer 17G contains. Accordingly, with the emission color of the pixel electrodes 15G being about equal to the emission color of the light-emitting layer 17G, the pixel electrodes 15G give off green light. In the pixels 37B, recombination of electrons and holes occurs mainly in the light-emitting layer 17B. Because the light-emitting layers 17 for the other colors have been removed, the pixels 37B give off blue light. Accordingly, by the ablating of the light-emitting layers 17 with the laser beams 59, EL display panels having the three primary colors red, green and blue may be manufactured.

In the foregoing embodiment example, a description has been made with the laser device 58 being utilized to reform the light-emitting layers 17. Nevertheless, the present invention is not thereby limited. For example, an LED (light-emitting diode) that generates ultraviolet light may be used as the reforming beam. Because their light-emitting elements are tiny, LEDs can generate narrow-directivity beams.

Figure 12:
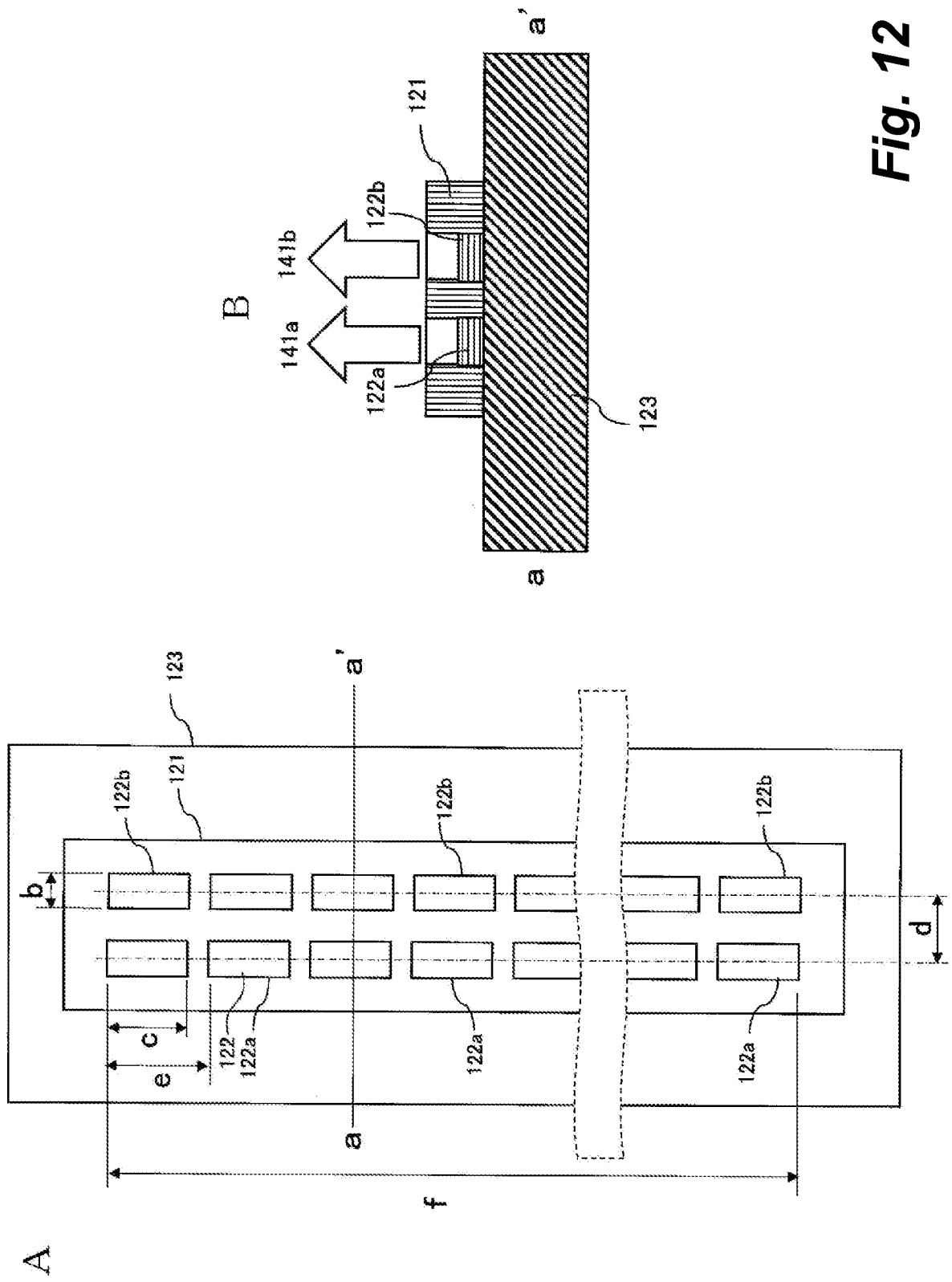
FIG. 12 is diagrams for explaining an optical illuminator in an EL Display-Panel manufacturing apparatus of the present invention.

FIG. 12 is a diagram for explaining an optical generator using LEDs 122. FIG. 13, meanwhile, is a diagram for explaining a method of reforming a light-emitting layer 17 utilizing the optical generator of FIG. 12. For the substrate 123 of the optical generator, a metal plate or a ceramic plate is employed as a base element in order to dissipate the heat that the LEDs 122 generate. A heat-dissipating plate (not depicted) is attached to the back side of the substrate. LEDs 122 that generate ultraviolet light are attached to the substrate 123. The dimensions (vertical length c, horizontal length b) of the light-emitting sections of the LEDs 122 are approximately matched to the dimensions of the pixel 37 areas that undergo reforming. Alternatively, the dimensions (vertical length c, horizontal length b) of the light-emitting sections are made smaller than the dimensions of the pixel 37 areas that undergo reforming. Further, the generator may be a configuration in which lenses (not depicted) or the like are arranged in front of the light emitting sections of the LEDs 122 so that the approximate entirety of the pixels 37 may be irradiated with the ultraviolet light that the LEDs 122 generate. The LEDs 122 emitting light allows the light-emitting layers 17 formed above the pixel electrodes 15 in pixels 37 of a predetermined color to be reformed.

The LED 122 surface-mounting position e along the vertical orientation is matched to the pitch of the pixels 37. The LED 122 surface-mounting position d along the horizontal orientation is approximately matched to the column pitch of the pixels 37. An alternative is to have the LED 122 vertical surface-mounting position e and the LED 122 horizontal surface-mounting position d be n times the pixel pitch (n: a positive number 1 or greater). The length f along which the LEDs are mounted is the length from the first row to the last pixel row on the EL display panel. Accordingly, the number of LEDs mounted down the length f matches the number of pixel rows on the EL display panel. An alternative is to make the length f be 1/n (n: a positive number 1 or greater) of the length from the first row to the last pixel row on the EL display panel.

In FIG. 12, for ease of illustration, the surface-mounting columns for the LEDs 122 are rendered as two lines, but the present invention is not thereby limited. For example, the LED 122 surface-mounting columns may be made three or more lines. The number of LED 122 surface-mounting columns or surface-mounting rows may be the number of pixel columns or pixel rows on the display panel. Such implementations eliminate the necessity of, as indicated in FIG. 13, shifting the optical generator in the direction a. The optical generator should be positioned on the EL display panel and the LEDs 122 caused to emit light. The wavelengths of the light generated by LEDs 122a and LEDs 122b as illustrated in FIG. 12 may be made to differ. For example, the optical generator may be configured to cause the LEDs 122a to generate light whose principal wavelength is that of the laser beam 59a, and to cause the LED 122b to generate light whose principal wavelength is that of the laser light 59b, explanatorily illustrated by FIG. 10.

FIG. 12B is a section view along the line a-a' in FIG. 12A. A light-absorbing element 121 for absorbing ultraviolet light that the LEDs 122 have generated is formed surrounding the LEDs 122. The LEDs 122a generate ultraviolet light 141a, and the LEDs 122b generate ultraviolet light 141b. As the light absorbing element 121 an example in which carbon has been added to an acrylic or epoxy resin is illustrative.

As illustrated in FIGS. 13A and 13B, the optical generator is arranged so as to coincide with the position of the pixel electrodes 15 on the TFT substrate 52. And by shifting the optical generator by a pixel-column or pixel-row pitch, and in the position into which the LEDs 122 have been shifted, causing them to emit light, the light-emitting layers 17 in the pixels 37 are reformed. In instances where a pair of pixel columns or a pair of pixel rows are reformed simultaneously, both the LEDs 122a and the LEDs 122b emit light. In instances where a single pixel column or a single pixel row is reformed, either the LEDs 122a or the LEDs 122b emit light.

As given in the foregoing, with the present invention, the light-generating means for generating ultraviolet light 59 is not limited to the laser device 58. As long as it is a light-generating means whereby beams of light in and near the ultraviolet range may be radiated in correspondence with the pixel 37 positions without a vapor-deposition fine mask 251 intervening, it may be any means. And it will be appreciated that by having the light-generating means be a means for generating infrared light, it may find application as a light-generating source 58 for the thermal transfer device of FIG. 18 and related figures.

Figure 18:
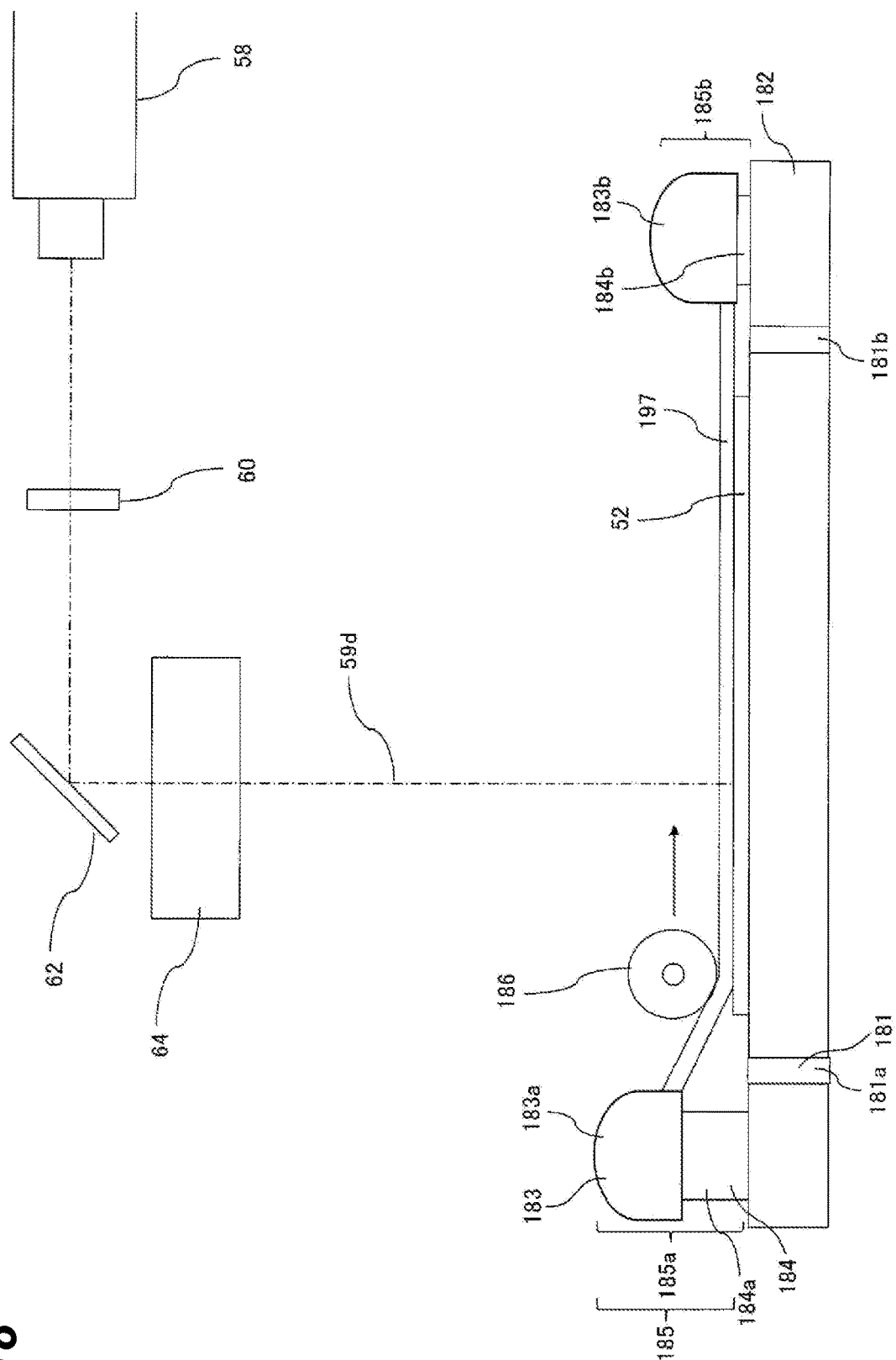
FIG. 18 is a diagram for explaining a transfer device in an EL display-panel manufacturing apparatus of the present invention.
Figure 19:
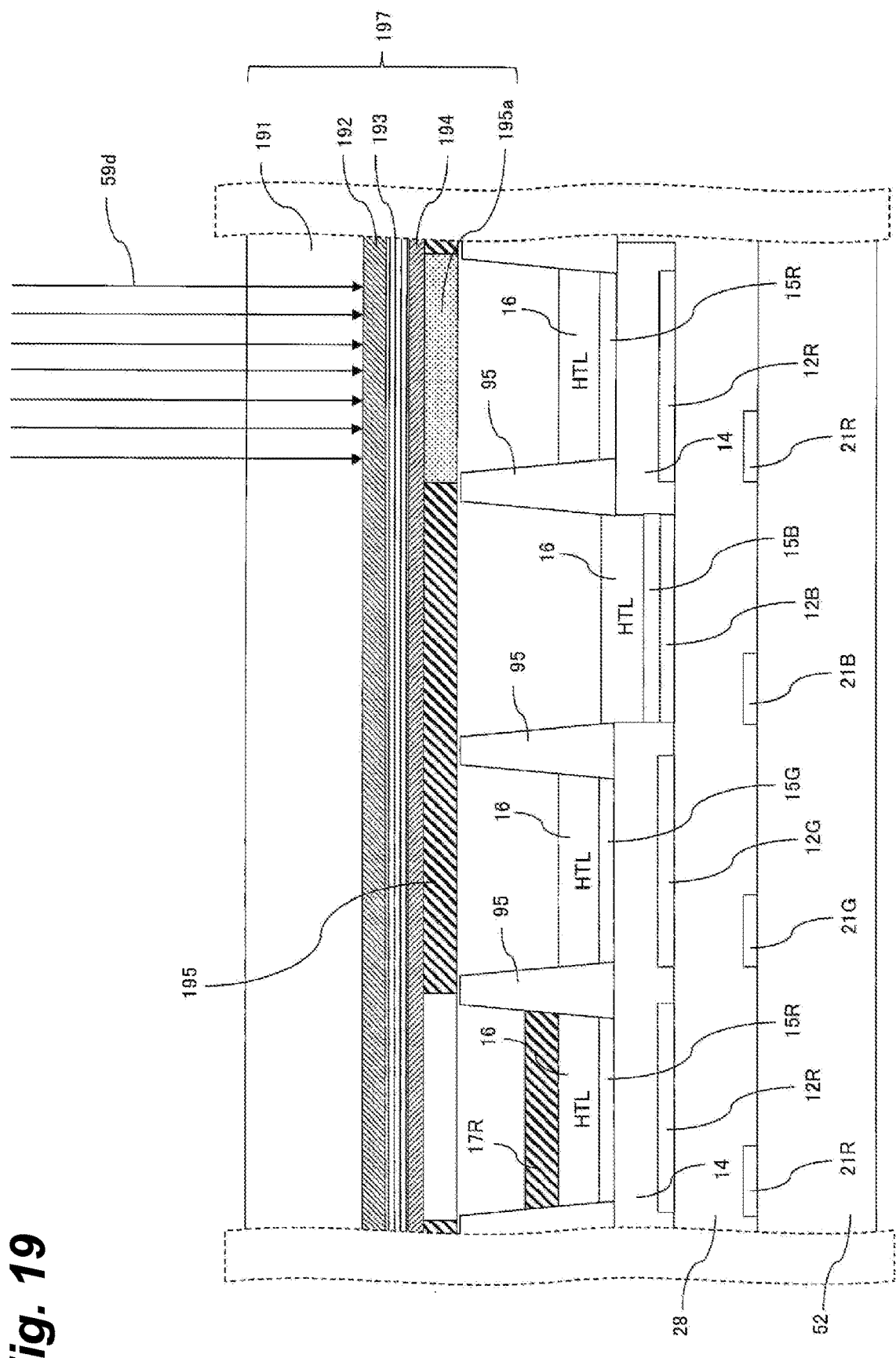
FIG. 19 is a diagram for explaining a method of manufacturing an EL display panel in a fourth embodiment example of the present invention.
Figure 20:
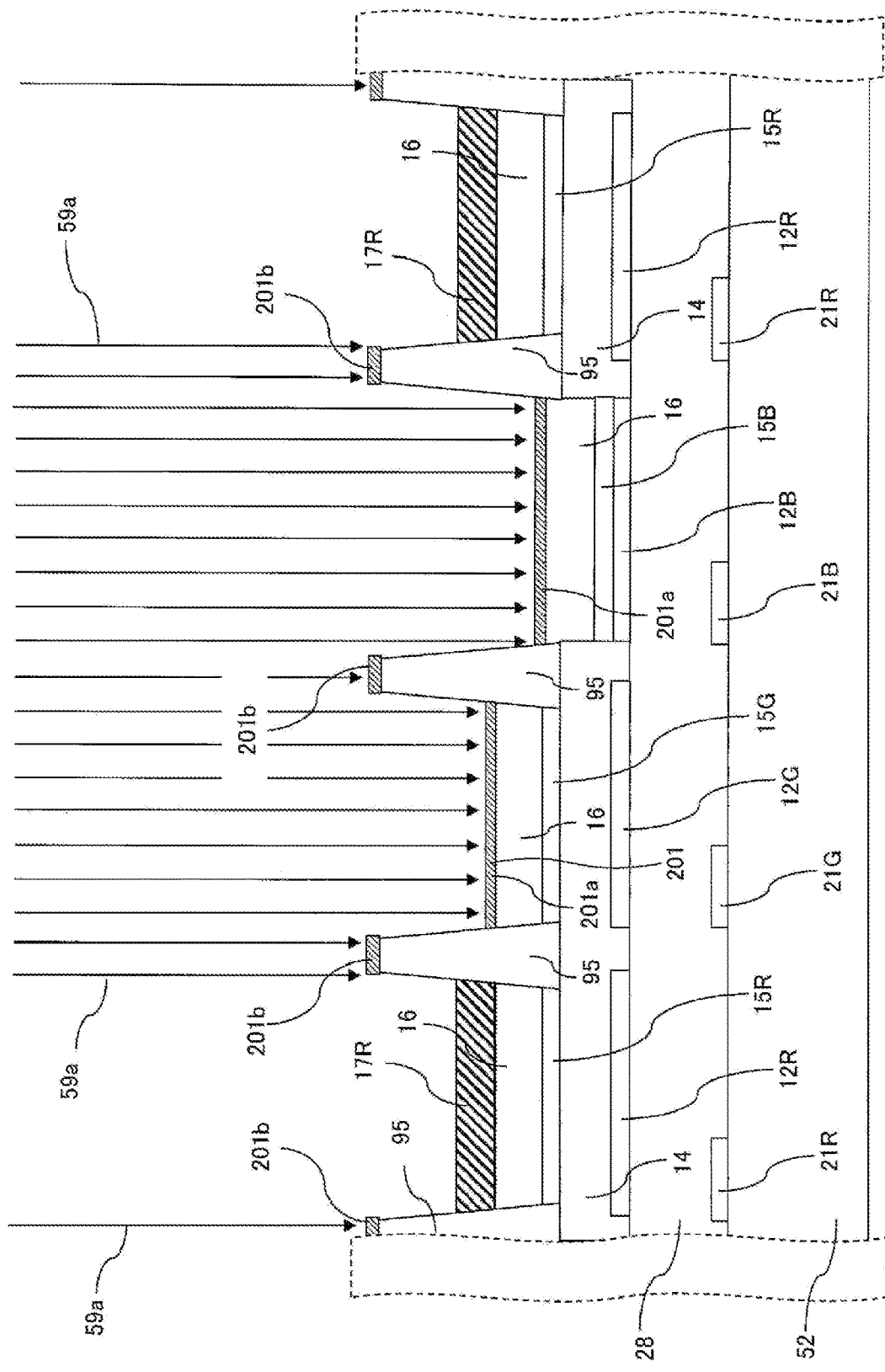
FIG. 20 is a diagram for explaining the method of manufacturing an EL display panel in the fourth embodiment example of the present invention.

It will be appreciated that by having the optical-generator LEDs 122 be infrared light-emitting LEDs, they may be employed as the light-generating source 58 for the thermal transfer device illustrated in FIG. 18, FIG. 19 and FIG. 20. Likewise as with FIG. 13, a donor film 197 should be arranged between the TFT substrate 52 and the optical generator, wherein a transfer organic film 195 in the donor film 197 is superheated by the light that the infrared-emitting LEDs of the optical-generator generates, forming the light-emitting layer 17.

By having the LEDs 122a in the optical generator illustrated in FIG. 12A be infrared light-emitting LEDs and having the LEDs 122b be ultraviolet light-emitting LEDs, the optical generator may be configured as a dual-use device both for reforming and for thermal transferring the constituent material of the light-emitting layers 17. What is more, the device can be used as an optical generator, explanatorily illustrated by FIG. 20, for removing deposits 201. The light that the LEDs 122 generate has a fixed band of wavelengths rather than a single wavelength as with laser light. Accordingly, the generating of ultraviolet light whose dominant wavelength is from 310 nm to 400 nm is adopted for the light that the LEDs 122 produce.

Figure 14:
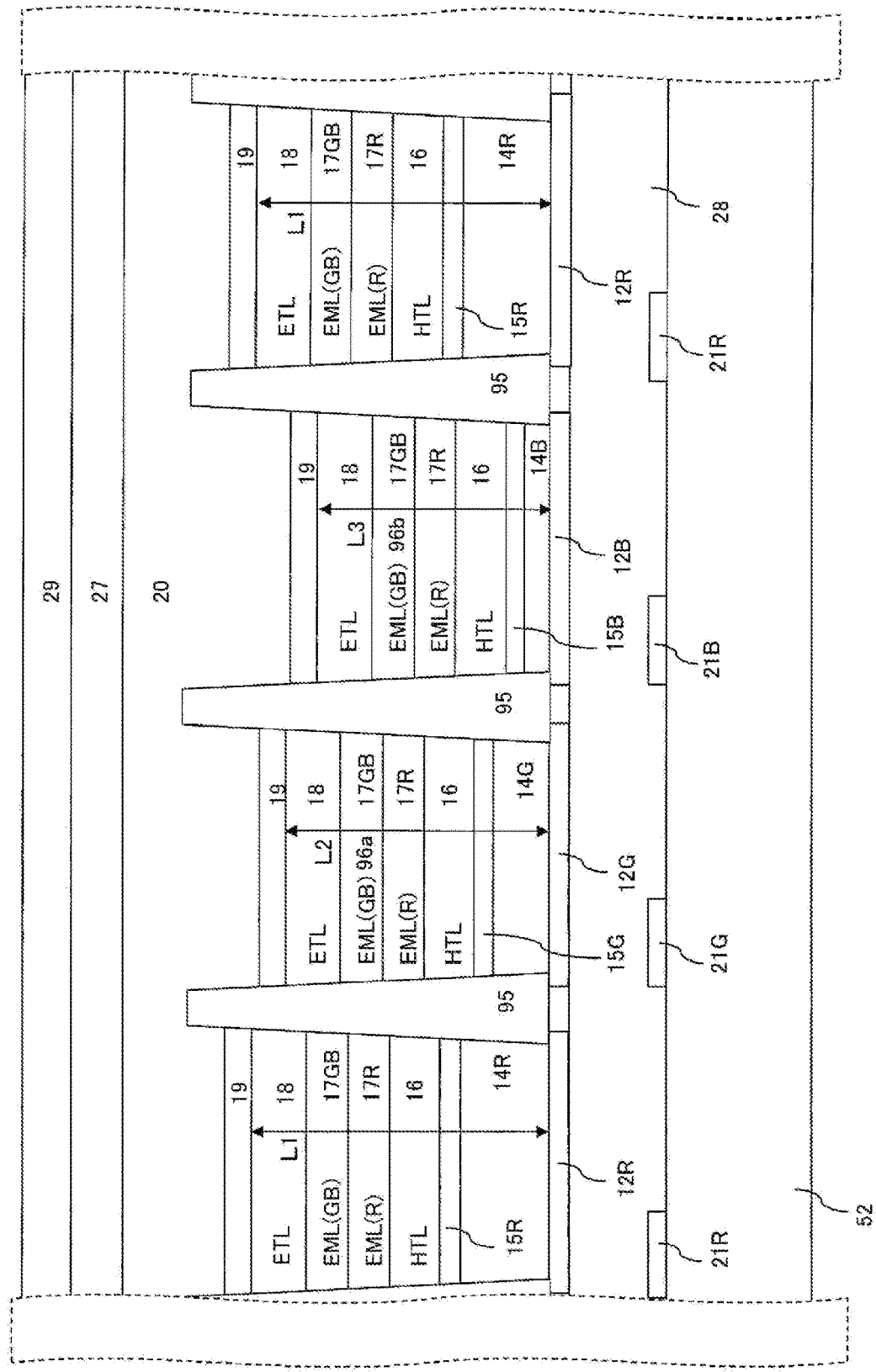
FIG. 14 is a sectional structure diagram of an EL display panel in a second embodiment example of the present invention.
Figure 15:
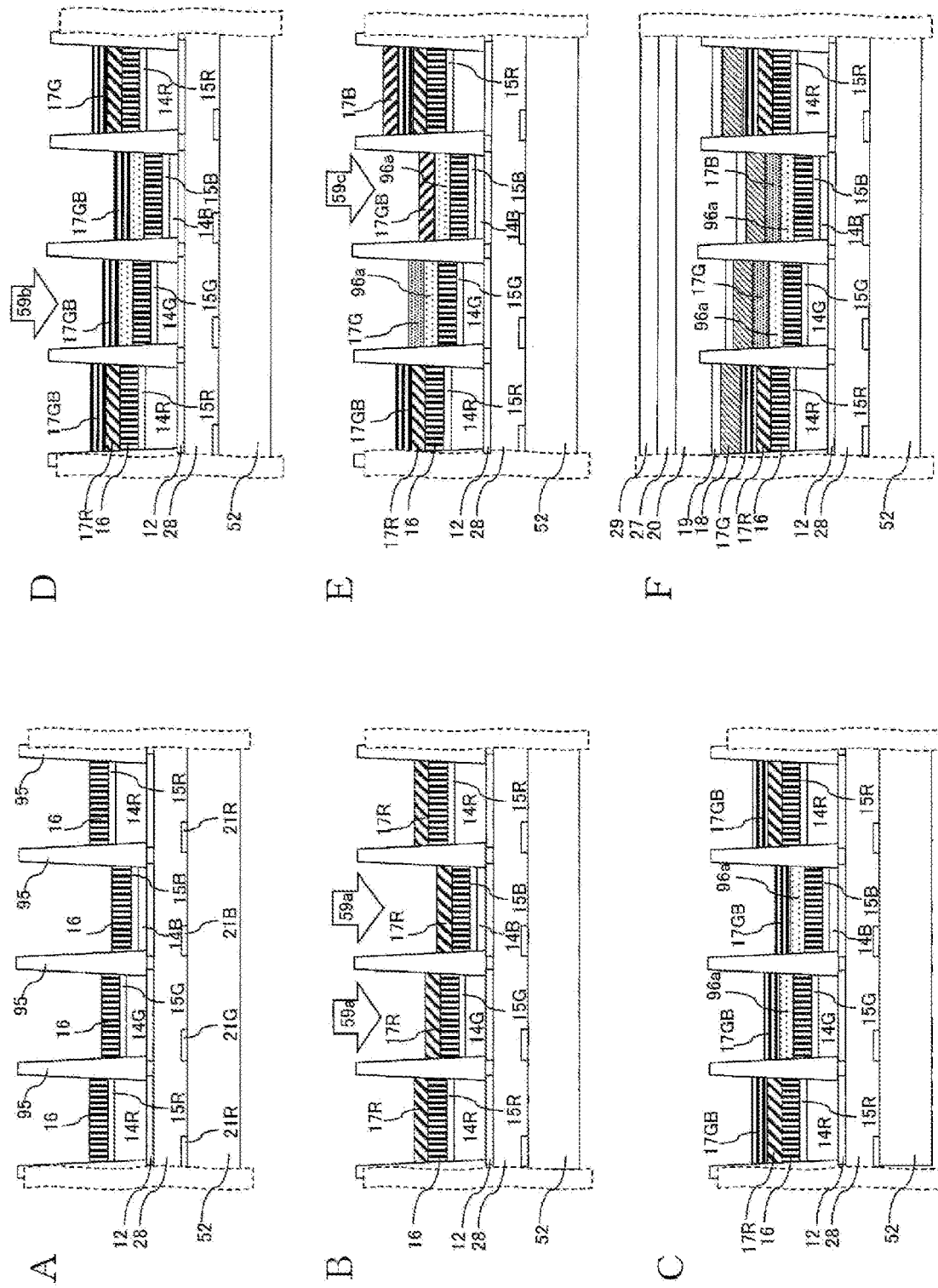
FIG. 15 is diagrams for explaining operations in the manufacture of the EL display panel in the second embodiment example of the present invention.

While referring to the drawings, a description of a second embodiment example of the present invention will be made in the following. FIGS. 14 and 15 are a sectional configuration diagram of, and a diagram for explaining a method of manufacturing, an EL display panel in the second embodiment of the present invention. In FIG. 14, a light-emitting layer (EML (R)) 17R and a light-emitting layer (EML (GB)) 17GB are formed above the red pixel electrodes 15R. A light-emitting layer (EML (R)) 17R and a light-emitting layer (EML (GB)) 17GB are formed above the green pixel electrodes 15G and the blue pixel electrodes 15B.

The light-emitting layer (EML (GB)) 17GB contains a blue guest material and a green guest material. The wavelengths of the light that the blue guest material and the green guest material absorb differ. Above the green pixel electrodes 15G, the light-emitting layer (EML (R)) 17R is reformed by being irradiated with laser beam 59a. Likewise, the blue guest material in the light-emitting layer (EML (GB)) 17GB is reformed by the light-emitting layer (EML (GB)) 17GB being irradiated with laser beam 59b. Above the blue pixel electrodes 15B, the light-emitting layer (EML (R)) 17R is reformed by being irradiated with the laser beam 59a. Likewise, the green guest material in the light-emitting layer (EML (GB)) 17GB is reformed by the light-emitting layer (EML (GB)) 17GB being irradiated with laser beam 59c.

While referring to the drawings, a description of a manufacturing method in the second embodiment example of the present invention will be made in the following. The TFT substrate 52 is conveyed in from the convey-in chamber 113 in FIG. 11A and conveyed into the chamber (HTL) 111c. As illustrated in FIG. 15A, the hole-transport layer 16 is formed over the pixel electrodes 15 on the TFT substrate 52. Next, the TFT substrate 52 is conveyed into the emission-layer (EML) R deposition compartment chamber (EML (R)) 111d. By means of a vapor-deposition technique, as illustrated in FIG. 10B the light-emitting layer 17R is laminated onto the hole-transport layer 16. The light-emitting layer 17R is formed by codeposition of a host material and a red guest material. The light-emitting layer 17R is formed as a continuous film across the display screen 36 entirety.

Next, the TFT substrate 52 is conveyed into the laser device chamber 118. In the laser device chamber 118, irradiating of the TFT substrate 52 light-emitting layer 17R is carried out with laser beam 59a, as indicated in FIG. 15B. The laser beam 59a is directed onto the light-emitting layer 17R above the pixel electrodes 15G and the pixel electrodes 15B. The laser beam 59a is not directed onto the light-emitting layer 17R above the pixel electrodes 15R. Reformed with the lasing portion of the laser beam 59a, the light-emitting layer 17R is made into reformed sections 96a. Because the light-emitting layer 17R where it is above the pixel electrodes 15R is not irradiated with the laser beam 59a, as a light-emitting guest material its capacity is maintained. Next, the TFT substrate 52 is conveyed into the central chamber 115 via the load-lock chamber 112, then conveyed into the compartment chamber (EML (G)) 111b. In the compartment chamber 111b, the light-emitting layer (EML (GB)) 17GB is laminated over the light-emitting layer 17R, as illustrated in FIG. 15C. The light-emitting layer (EML (GB)) 17GB contains a blue guest material and a green guest material. The wavelengths of the laser beams 59 that the blue guest material and the green guest material absorb differ. Changing the wavelength of the laser beam 59 directed onto the light-emitting layer (EML (GB)) 17GB, enables selecting between the blue guest material and the green guest material to reform.

As indicated by the FIG. 3C graph, for the host material, a material that does not readily absorb the laser beam 59a, the laser beam 59b, and the laser beam 59c is selected. Alternatively, a material that transmits the laser beam 59 is selected. The concept that the material "does not readily absorb" laser light and similar optical radiation includes, apart from the material not absorbing light, reflecting said laser light and similar optical radiation, as well as transmitting said laser light and similar optical radiation. Further, the concept also includes that the material or its constituents does not change despite absorbing laser light and similar optical radiation. For the guest material R, a material that readily absorbs the laser light 59a is selected. For the guest material B, a material that readily absorbs the laser light 59b but does not readily absorb the laser light 59c is selected. For the guest material G, a material that readily absorbs the laser light 59c but does not readily absorb the laser light 59b is selected. Preferably, given that the guest-material B absorptivity, as graphed in FIG. 3C, is 100% at the wavelength of the laser beam 59b, a guest-material G stuff whose guest-material G absorptivity will be not greater than 25% is selected. Likewise, given that the guest-material G absorptivity is 100% at the wavelength of the laser beam 59c, a guest material B whose guest-material B absorptivity will be not greater than 25% is selected. Further, given that the guest-material B absorptivity is 100% at the wavelength of the laser beam 59b, a host material whose host-material absorptivity will be not greater than 25% is selected. Absorptivity being 100% may be read as transmittance being 0%; absorptivity being 0%, as transmittance being 100%; absorptivity being 75%, as transmittance being 25%; absorptivity being 25%, as transmittance being 75%.

The light-emitting layer (EML (GB)) 17GB is formed above the green pixel electrodes 15G, as illustrated in FIG. 15D. The light-emitting layer (EML (GB)) 17GB contains a guest material B that contributes to blue light emission and a guest material G that contributes to green light emission. As indicated in FIG. 3C, the laser beam 59b wavelength is a shorter wavelength than the laser beam 59c wavelength. Guest material B absorbs light of shorter wavelengths better than the guest material G. With the light-emitting layer (EML (GB)) 17GB above the green pixel electrodes 15G being irradiated with laser beam 59b, the guest material B in the light-emitting layer (EML (GB)) 17GB, absorbing the laser light 59b, is reformed. The guest material G in the light-emitting layer (EML (GB)) 17GB does not absorb the laser light 59b. Because the light-emitting layer (EML (GB)) 17GB is maintained in a state in which the guest material G is capable of emitting light, the light-emitting layer (EML (GB)) 17GB acts as a green-emitting light-emitting layer 17G.

The light-emitting layer (EML (GB)) 17GB is formed above the blue pixel electrode 15B, as illustrated in FIG. 15E. With the light-emitting layer (EML (GB)) 17GB being irradiated with laser beam 59c, the guest material G in the light-emitting layer (EML (GB)) 17GB, absorbing the laser light 59c, is reformed. The guest material B does not absorb the laser light 59b. Since the light-emitting layer (EML (GB)) 17GB is maintained in a state in which the guest material B is capable of emitting light, the light-emitting layer (EML (GB)) 17GB acts as a blue-emitting light-emitting layer 17B.

Next, an electron-transport layer 18 as represented in FIG. 15F is formed over the light-emitting layers 17G and B, following which LiF or Liq or the like as an electron injection membrane is built on, and a cathode electrode 19 is laminated onto the electron-transport layer 18. The cathode electrode 19 is formed onto the electron-transport layer 18.

The bulk of the guest material that the light-emitting layer 17R above the pixel electrodes 15R includes is capable of emitting light. The red guest material included in the light-emitting layer 17R above the pixel electrodes 15G and the pixel electrodes 15B for the most part is quenched or does not undergo excitation. By being irradiated with the laser beam 59b, the blue guest material B included in the light-emitting layer 17GB above the pixel electrodes 15G for the most part is quenched or does not undergo excitation. By being irradiated with the laser beam 59c, the green guest material G included in the light-emitting layer 17GB above the pixel electrodes 15B for the most part is quenched or does not undergo excitation.

In the light-emitting layer 17GB above the pixel electrodes 15R, it is possible for the green guest material G and the blue guest material B also to undergo excitation. The green guest material G in the light-emitting layer 17GB absorbs the energy whereby by the blue guest material B undergoes excitation. Absorbing energy whereby by the green guest material G is excited, the red guest material R included in the light-emitting layer 17R above the pixel electrodes 15R emits light.

In the light-emitting layer 17R above the pixel electrodes 15G, because the contained red guest material R has been irradiated with the laser beam 59a, it does not undergo excitation. Likewise, because the blue guest material B in the light-emitting layer 17GB has been irradiated with the laser beam 59b, it does not undergo excitation. Therefore, the light-emitting layer 17GB optically emits in green. Accordingly, the pixel-electrode 15G pixels 37 optically emit in green. It should be understood that with the light-emitting layer 17GB above the pixel electrodes 15G, the green guest material G in the light-emitting layer 17GB is a material that optimally absorbs the energy whereby the blue guest material B undergoes excitation, and otherwise that with the configuration of the EL element 22, the green guest material G included in the upper light-emitting layer 17GB above the pixel electrodes 15G absorbs the energy whereby the blue guest material B undergoes excitation and emits light. Accordingly, the light-emitting layer 17GB optically emits in green. In this case, the manufacturing step of irradiating the light-emitting layer 17GB above the pixel electrodes 15G with the laser light 59b in FIG. 15D can be eliminated.

In the light-emitting layer 17R above the pixel electrodes 15B, because the contained red guest material R has been irradiated with the laser beam 59a, it does not undergo excitation. Likewise, because the green guest material G in the light-emitting layer 17GB has been irradiated with the laser beam 59c, it does not undergo excitation. Therefore, the light-emitting layer 17GB optically emits in blue. Accordingly, the pixel-electrode 15B pixels 37 optically emit in blue.

Figure 16:
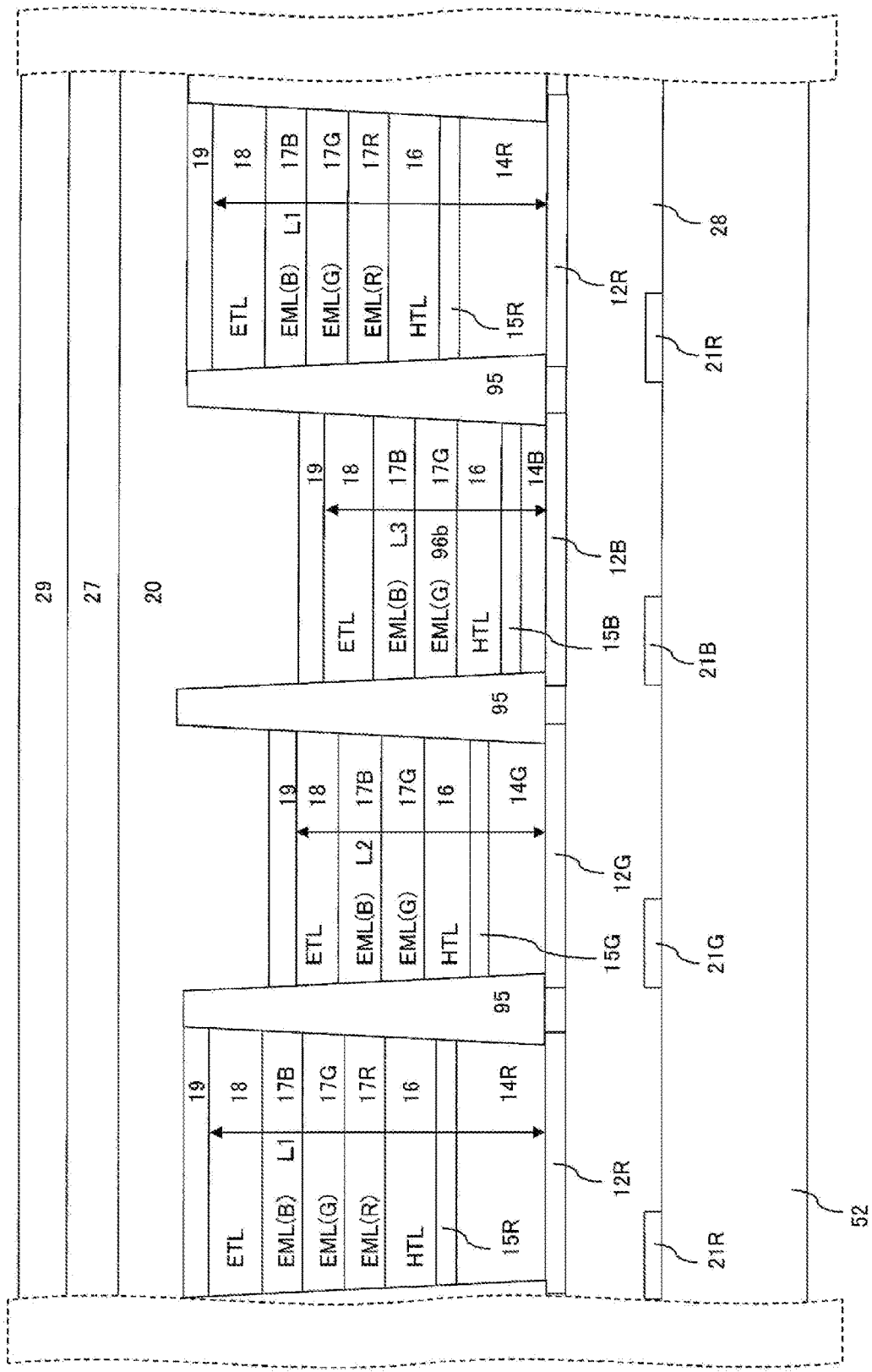
FIG. 16 is a sectional structure diagram of an EL display panel in a third embodiment example of the present invention.
Figure 17:
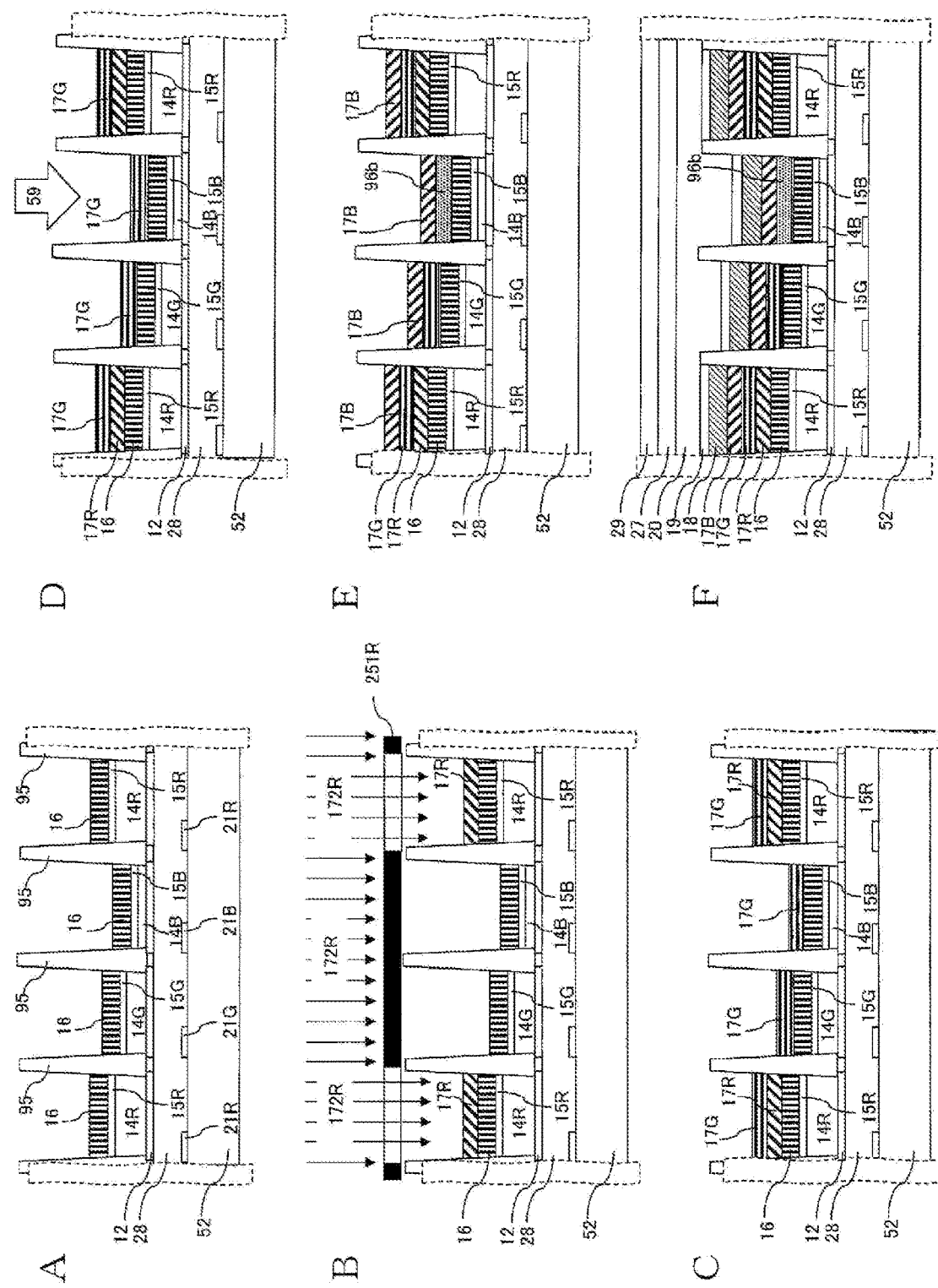
FIG. 17 is diagrams for explaining operations in the manufacture of the EL display panel in the third embodiment example of the present invention.

While referring to the drawings, a description of a third embodiment of the present invention will be made in the following. FIGS. 16 and 17 are a sectional structure diagram of, and diagrams for explaining the manufacture of, an EL display panel in the third embodiment of the present invention. In FIG. 16, a light-emitting layer 17R, a light-emitting layer 17G, and a light-emitting layer 17B are formed above the red pixel electrodes 15R. A light-emitting layer 17G and a light-emitting layer 17B are formed above the green pixel electrodes 15G and the blue pixel electrodes 15B. The light-emitting layer 17G above the blue pixel electrodes 15B has been irradiated with light to reform the green guest material in the light-emitting layer 17G.

While referring to the drawings, a description of a manufacturing method in the third embodiment example of the present invention will be made in the following. As illustrated in FIG. 17A, as for the TFT substrate 52, the hole-transport layer 16 is formed over the pixel electrodes 15. Next, the TFT substrate 52 is conveyed into the emission-layer (EML) R deposition compartment chamber (EML (R))

111d. As illustrated in FIG. 17B, a vapor-deposition fine mask 251R is arranged on the TFT substrate 52 in order to form the red light-emitting layer 17R. The vapor-deposition fine mask 251R is a mask having apertures in the red-pixel positions. Red light-emitting layer material 172R is vaporized to laminate a light-emitting layer 17R onto the hole-transport layer 16. The light-emitting layer 17R is formed by codeposition of a host material and a red guest material. The codeposition is implemented in a vacuum process step.

Next, the TFT substrate 52 is conveyed into the compartment chamber 111b. In the compartment chamber 111b, as shown in FIG. 17C, the light-emitting layer 17G is laminated. The light-emitting layer 17G contains a green guest material. Next, the TFT substrate 52 is conveyed into the laser device chamber 118 shown in FIG. 11A. As illustrated in FIG. 17D, the light-emitting layer 17G above the blue pixel electrode 15B is irradiated with the laser light 59. When the laser beam 59 is irradiated, the guest material G of the light-emitting layer 17G absorbs the laser beam 59 and is reformed. Since the light-emitting layer 17G above the green pixel electrode 15G is not irradiated with the laser light 59, the guest material G of the light-emitting layer 17G is in a state capable of emitting light.

Next, as illustrated in FIG. 17E, a light-emitting layer 17B is formed. Since the light-emitting layer 17B is maintained in a state in which the guest material B can emit light, the light-emitting layer 17B becomes a light-emitting layer that emits blue light.

Next, as illustrated in FIG. 17F, the electron-transport layer 18 is formed above the light-emitting layer 17GB, then the electron-injection layer is formed, and the cathode electrode 19 is laminated onto the electron-transport layer 18. In the embodiment of FIG. 17, it has been described that the light-emitting layer 17 is formed using the vapor-deposition fine mask 251, but the present invention is not limited to this. For example, it goes without saying that other layers such as the hole-transport layer 16 may be formed using the vapor-deposition fine mask 251. For example, the step of forming the hole-transport layer (HTL) of the blue pixel 37B of FIG. 28A, the step of forming the hole-transport layer (HTL) of the red pixel 37R of FIG. 28B, and the step of forming the hole-transport layer (HTL) of the blue pixel 37B of FIG. 28D, and the step of forming the insulating film 14B are exemplifying.

In the light-emitting layer 17R above the pixel electrode 15R in FIG. 16, recombination of electrons and holes mainly occurs in the red guest material R of the light-emitting layer 17R. It may also occur in the blue guest material B of the layer 17B. The green guest material G of the light-emitting layer 17G absorbs energy that excites the blue guest material B of the light-emitting layer 17B. The red guest material R included in the light-emitting layer 17R above the pixel electrode 15R absorbs energy that excites the green guest material G and emits light. The light-emitting layer 17 of the pixel electrode 15R of the EL display panel of the present invention shown in FIG. 16 emits red light.

The green guest material G of the light-emitting layer 17G above the pixel electrode 15G absorbs energy that excites the blue guest material B of the light-emitting layer 17B. The light-emitting layer 17 of the pixel electrode 15G of the EL display panel of the present invention shown in FIG. 16 emits green light. In the light-emitting layer 17G above the pixel electrode 15B, the contained green guest material G is not excited by being irradiated with the laser beam 59. The light-emitting layer 17B emits blue light. Therefore, the pixel 37 of the pixel electrode 15B emits blue light.

In the manufacturing method of the present invention shown in FIG. 17, the formation of the light-emitting layer 17R with the vapor-deposition fine mask 251 is described as an example. However, the present invention is not limited to this. For example, the light-emitting layer 17R may be formed by a laser thermal transfer method, an ink jet method, or a printing method. It is also a technical category of the present invention to form other light-emitting layers such as the light-emitting layer 17G and the light-emitting layer 17B with a vapor-deposition fine mask. Moreover, it is not limited to the light-emitting layer 17. For example, the positive hole-transport layer 16 may be formed. By forming the hole-transport layer 16 using the vapor-deposition fine mask 251, for example, as shown in FIG. 1, the film thicknesses of the hole-transport layer 16R, the hole-transport layer 16G, and the hole-transport layer 16B may be easily varied and formed.

A fourth embodiment of the present invention will be described below with reference to the drawings. First, a laser thermal transfer apparatus which is one of the EL display panel manufacturing apparatuses of the present invention will be described. FIG. 18 is an explanatory diagram of a laser thermal transfer apparatus which is one of the EL display panel manufacturing apparatuses of the present invention. Items related to the laser device 58 of the laser thermal transfer device, the control device, the control method, the operation, and the like have been described with reference to FIGS. 4, 5, 6 etc. The laser light 59 generated by the laser device 58 is light in the ultraviolet region when reforming the light-emitting layer 17 and the like, whereas it is different from light in the infrared region in the case of laser thermal transfer.

FIG. 11B is an explanatory diagram of an EL display panel manufacturing apparatus according to the fourth embodiment of the present invention. The laser thermal transfer device is disposed in the transfer device chamber 117 of FIG. 11B. The TFT substrate 52 is conveyed into the transfer device chamber 117 via the load lock chamber 112a. Here, FIGS. 11A and 11B are that the compartment chamber 111d is a load lock chamber 112a and a transfer device 117.

As shown in FIG. 18, the transfer device for the transfer organic film 195 includes a laser device 58 that generates laser light 59d for irradiating the donor film 197. FIG. 19 is an explanatory diagram for explaining the operation of irradiating the donor film 197 with the laser beam 59d by the laser device 58 in the transfer process.

The laser thermal transfer apparatus includes a sliding stage 182 on which the TFT substrate 52 is placed and a control mechanism 185. The support mechanism 183 of the control mechanism 185 holds the donor film 197 disposed on the TFT substrate 52. The support mechanism 183 includes a raise/lower mechanism 184 so that the distance between the TFT substrate 52 and the donor film 197 can be adjusted. Further, the sliding stage 182 has an exhaust port 181 for exhausting the gas existing between the TFT substrate 52 and the donor film 197 to the outside. The control mechanism 185a includes a support mechanism 183a that supports one end of the donor film 197 and a raise/lower mechanism 184a. The control mechanism 185b includes a support mechanism 183b that supports the other end of the donor film 197 and a raise/lower mechanism 184b. The support mechanism 183a and the support mechanism 183b can move the donor film 197 up and down on the sliding stage 182 independently.

The raise/lower mechanism 184a moves up and down on the sliding stage 182. The support mechanism 183b fixes the other end of the donor film 197. The raise/lower mechanism 184b moves the donor film 197 up and down on the sliding stage 182. The support mechanism 183 supports the donor film 197 so that the donor film 197 is disposed on the TFT substrate 52. The support mechanism 183 and the raise/lower mechanism 184 can support both ends of the donor film 197 and move the donor film 197 up and down with respect to the TFT substrate 52.

The sliding stage 182 includes two exhaust ports 181a and 181b. The exhaust port 181 is a passage that connects the inside and the outside of the transfer device chamber 117. The gas existing between the TFT substrate 52 placed on the sliding stage 182 and the donor film 197 disposed on the TFT substrate 52 through the exhaust port 181 is exhausted to the outside of the transfer device chamber 117. The sliding stage 182 further includes driving means (not shown) for moving. For example, when the laser beam 59 is irradiated in the normal direction of the TFT substrate 52, a driving unit (mechanism) for moving the sliding stage 182 in the lateral direction is provided.

The support mechanism 183 can be raised or lowered in the normal direction of the TFT substrate 52 by the raise/lower mechanism 184. The control mechanism 185a and the control mechanism 185b can be independently controlled in operation, and can be controlled to rise and fall independently. The pressure roller 186 is disposed on the donor film 197 and can apply pressure on the donor film 197 toward the TFT substrate 52. The pressure roller 186 applies pressure to the donor film 197 toward the TFT substrate 52 during the bonding process between the donor film 197 and the TFT substrate 52 to bring the donor film 197 and the TFT substrate 52 into close contact with each other. The pressure roller 186 can prevent the transfer organic film 195 transferred to the TFT substrate 52 from being peeled off during the peeling process between the donor film 197 and the TFT substrate 52.

The support mechanism 183 moves the donor film 197 so as to be separated from the TFT substrate 52 before the bonding step between the TFT substrate 52 and the donor film 197. The exhaust port 181 exhausts gas existing in the space between the TFT substrate 52 and the donor film 197 to the outside. The support mechanism 183 pulls in a direction extending from one end and the other end of the donor film 197 to the outside. By pulling the donor film 197 taut, the support mechanism 183 prevents the donor film 197 from sagging toward the TFT substrate 52.

As shown in FIG. 18, at the time of the peeling process, first, the support mechanism 183 a lifts one end of the donor film 197, so that the pressure roller 186 is opposed to one end from one end of the donor film 197. Move along. By applying pressure to the donor film 197 by the pressure roller 186, it is possible to prevent the transfer organic film 195 transferred to the TFT substrate 52 from being peeled off during the peeling process. During the peeling process of the donor film 197 and the TFT substrate 52, the support mechanism 183a is raised while the support mechanism 183b is stopped. In the donor film 197, the TFT substrate 52 is separated from one end of the donor film 197 from the side close to the support mechanism 183a. When the raising of the support mechanism 183a is completed, the support mechanism 183b starts to rise. As for the donor film 197, the donor film 197 closer to the support mechanism 183b is raised, and the donor film 197 and the TFT substrate 52 are separated.

The EL display panel manufacturing method according to the fourth embodiment of the present invention uses a laser thermal transfer method. In the laser thermal transfer method, the step of disposing the TFT substrate 52 on the sliding stage 182, the step of removing the gas existing between the TFT substrate 52 and the donor film 197, and the step of the bonding of the donor film 197 and the TFT substrate 52 are performed. A step of transferring the transfer organic film 195 of the donor film 197 to the TFT substrate 52, and a step of peeling the donor film 197 and the TFT substrate 52 are performed.

FIG. 19 is an explanatory diagram for explaining a configuration of a donor film 197 used in the fourth embodiment of the present invention and a manufacturing method using the donor film 197. The base film 191 of the donor film 197 is made of a transparent polymer material. As the base film 191, it is particularly preferable to use a polyethylene terephthalate film. The thickness of the base film 191 is preferably from 10 µm to 500 µm. Although the base film 191 constituting the donor film 197 is described as a film made of a resin material, the present invention is not limited to this. It will be appreciated that the base film 191 may be formed of an inorganic material plate such as glass. Therefore, the donor film is not limited to a film, and may be any component as long as it is a sheet-like material on which the photoconversion film 192 and the transfer organic film 195 are formed.

A photoconversion film 192 is formed on the base film 191. The photoconversion film 192 is a layer that absorbs the laser light 59d in the infrared-visible light region and converts part of the light into heat. Examples of the photoconversion film 192 include a metal film containing aluminum oxide and aluminum sulfide as a light-absorbing substance, carbon black, and graphite. An intermediate film 193 can be formed on the photoconversion film 192. The intermediate film 193 serves to prevent the light-absorbing substance contained in the photoconversion film 192, such as carbon black, from contaminating the transfer organic film 195 formed in the subsequent process. The intermediate film 193 can be formed of an acrylic resin or an alkyd resin. In the case where the intermediate film 193 is formed on the photoconversion film 192, it is preferable to further form a buffer film 194 on the intermediate film 193. The buffer film 194 is formed to prevent damage to the organic film or the like formed on the transfer organic film 195 and to effectively adjust the adhesive force between the intermediate film 193 and the transfer organic film 195. The buffer film 194 is made of metal or metal oxide having a laser beam transmittance of 20% or less, and the thickness of the buffer film 194 is 0.05 µm or more and 1 µm or less.

A transfer organic film 195 is formed on the buffer film 194. The transfer organic film 195 is an organic material for forming the light-emitting layer 17, the hole injection layer, the hole-transport layer 16, the electron-injection layer, the electron-transport layer 18, and the like. In one embodiment, the transfer organic film 195 is manufactured by coating an organic thin film forming substance. As the transfer organic film 195, two or more organic layers can be laminated as needed instead of one organic layer.

As shown in FIG. 19, after a donor film 197 is disposed at a position spaced apart from the TFT substrate 52 by a predetermined distance, the donor film 197 is irradiated with laser light 59d having an infrared wavelength or a visible wavelength. In the embodiment of the present invention, description will be made by exemplifying the formation of the light-emitting layer 17R of the pixel 37R by thermal transfer, but the present invention is not limited to this. It will be appreciated that the light-emitting layers 17 of the pixels 37 of other colors may be formed. The formation by thermal transfer is not limited to the light-emitting layer 17, and it goes without saying that another organic film such as the hole-transport layer 16 may be formed.

As shown in FIG. 19, a donor film 197 is disposed on the TFT substrate 52. As shown in FIG. 18, the alignment between the TFT substrate 52 and the donor film 197 is performed by a control mechanism 185 or the like. The laser beam 59*d* passes through the base film 191 and heats the photoconversion film 192. The photoconversion film 192 emits heat by the laser beam 59*d*. The photoconversion film 192 expands, and the transfer organic film 195 peels from the donor film 197. The peeled transfer organic film 195*a* is laminated as the light-emitting layer 17R above the pixel electrode 15 of the TFT substrate 52. The thickness of the laminated light-emitting layer 17 is proportional to the thickness of the transfer organic film 195. Therefore, by defining the thickness of the transfer organic film 195, the thickness of the light-emitting layer 17 can be defined. Alternatively, a plurality of donor films 197 may be used and the transfer organic film 195 may be transferred onto the hole transport layer 16 a plurality of times. The film thickness of the light-emitting layer 17 can be accurately formed to a prescribed film thickness by transferring a plurality of times.

As the laser beam 59*d*, all general-purpose laser beams such as solid, gas, semiconductor, and dye can be used. Among these, it is preferable to use laser light having a wavelength in the infrared region having a wavelength of 800 nm or more. For example, a YAG laser, a glass laser, and a carbon dioxide laser are exemplified. A helium neon (He—Ne) laser can also be employed.

Figure 21:
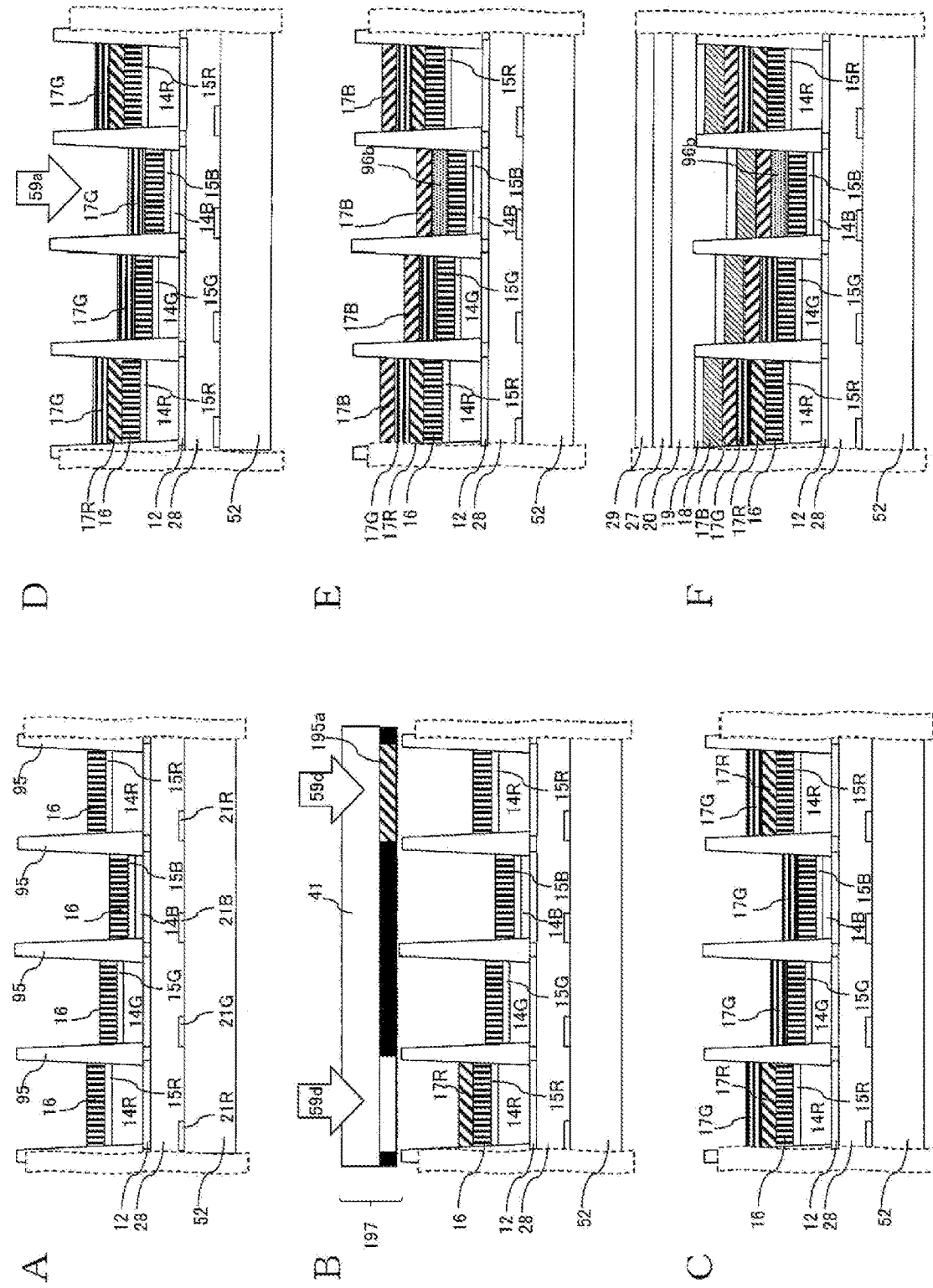
FIG. 21 is diagrams for explaining operations in the manufacture of the EL display panel in the fourth embodiment example of the present invention.

FIG. 11B and FIG. 21 are explanatory views of the EL display panel manufacturing method and manufacturing apparatus in the fourth embodiment. In FIG. 11B, the TFT substrate 52 is conveyed into the film forming apparatus 116 from the convey-in chamber 113. The thermal transfer device that thermally transfers the light-emitting layer 17 is installed in the transfer device chamber 117. The TFT substrate 52 is conveyed into the transfer device chamber 117 via the load lock chamber 112*a*. The TFT substrate 52 is conveyed into a chamber (HTL) chamber 111 *c* in which the hole transport layer 16 is deposited. In the compartment chamber 111*c*, as shown in FIG. 21A, the hole transport layer 16 is formed above the pixel electrode 15 of the TFT substrate 52.

Next, the TFT substrate 52 is conveyed into a transfer device chamber 117 to which the light-emitting layer R is transferred. As shown in FIG. 21B, after the donor film 197 is disposed at a position separated from the TFT substrate 52, the donor film 197 is irradiated with laser light 59*d* having a wavelength in the infrared region or the visible light region. The laser beam 59*d* passes through the base film 191 and heats the photoconversion film 192. The released heat causes the photoconversion film 192 of the donor film 197 to expand, and the transfer organic film 195*a* peels from the donor film 197. The peeled transfer organic film 195 is transferred onto the hole transport layer 16 of the TFT substrate 52 to a desired pattern and thickness as the light-emitting layer 17R. The transfer organic film 195*a* becomes the light-emitting layer 17R.

As shown in FIG. 21B, the transfer organic film 195 is thermally transferred to the TFT substrate 52 as the light-emitting layer 17R.b However, as illustrated in FIG. 20, the transfer organic film 195 may adhere as an adherent 201*b* on the bank 95 as well as above the red pixel electrode 15R. Further, in some cases, the adhering material 201*a* is attached not only to the red pixel electrode 15R but also above the green pixel electrode 15G and above the blue pixel electrode 15B. The deposit 201*b* adhering to the bank 95 may peel off and adhere to the pixel electrode 15 and cause a defect. Further, the adhering material 201*a* attached above the green pixel electrode 15G and above the blue pixel electrode 15B emits light, which may cause a color adulteration problem.

FIG. 20 is an explanatory view of a method for reforming or removing the deposit 201 generated in the manufacturing process of the EL display panel of the present invention. The deposit 201 adhered to an unnecessary portion by thermal transfer is irradiated with a laser beam 59*a* to be reformed. The deposit 201 is irradiated with laser light 59*a* in the ultraviolet band. The guest material of the deposit 201 is reformed by irradiation with laser light 59*a* having an ultraviolet wavelength. Due to the reforming, the deposit 201 does not emit light or is removed. The laser beam 59*a* can be the same as the laser beam 59 in FIG. 4. The same laser device 58 can be used. The wavelength of the laser beam 59*a* is in the ultraviolet region. The deposit 201 is reformed by the irradiation of the laser beam 59*a*. Alternatively, the deposit 201 is heated and evaporated by irradiation with the laser beam 59*a*, and is removed from above the pixel electrode 15.

Next, the TFT substrate 52 is conveyed into the compartment chamber (EML (G)) 111*b*. In the compartment chamber 111*b*, as shown in FIG. 21C, the light-emitting layer 17G is laminated above the light-emitting layer 17R by a vapor deposition method. The vapor-deposition fine mask 251 is not used in the vacuum vapor deposition step of the light-emitting layer 17G. The light-emitting layer 17G is deposited on the entire display screen 36 of the display panel using a rough deposition mask (not shown). Accordingly, the light-emitting layer 17G is formed in common above the pixel electrode 15R, the pixel electrode 15G, and the pixel electrode 15B.

The TFT substrate 52 is conveyed into the laser device chamber 118 via the load lock chamber 112*b*. In the laser device chamber 118, as shown in FIG. 21D, the light-emitting layer 17G of the TFT substrate 52 is irradiated with laser light 59*a*. The laser light 59*a* irradiates the light-emitting layer 17G above the pixel electrode 15B. The laser light 59*a* is not applied to the light-emitting layer 17G above the pixel electrode 15R and the pixel electrode 15G. The light-emitting layer 17G is reformed by the irradiated portion of the laser light 59*a* to become a reformed portion 96*b*. Since the light-emitting layer 17G corresponding to the pixel electrode 15R and the pixel electrode 15G is not irradiated with the laser light 59*a*, the performance as the light-emitting layer is maintained.

Next, the TFT substrate 52 is conveyed into a compartment chamber (EML (B) ETL) 111*e*. In the compartment chamber 111*e*, as shown in FIG. 21E, the light-emitting layer 17B is laminated above the light-emitting layer 17G by a vapor deposition method. The vapor-deposition fine mask 251 is not used in the vacuum vapor deposition process of the light-emitting layer 17B. The light-emitting layer 17B is deposited on the entire display screen 36 of the display panel using a rough deposition mask (not shown). Therefore, the light-emitting layer 17B is formed in common above the pixel electrode 15R, the pixel electrode 15G, and the pixel electrode 15B.

Next, as illustrated in FIG. 21F, the electron-transport layer 18 is formed above the light-emitting layer 17B, then the electron-injection layer is formed, and the cathode electrode 19 is stacked on the electron-transport layer 18. The panel structure manufactured by the EL display panel manufacturing method described in FIG. 21 is the same as that in FIG. 16. Since the structure and operation of the EL display panel in FIG. 16 have been described, description thereof will be omitted. The fourth embodiment is different in that the light-emitting layer 17 of FIG. 16 is formed by a thermal transfer method.

In the manufacturing method of the present invention shown in FIG. 21, the formation of the light-emitting layer 17R using the donor film 197 or the like has been described as an example. For example, it is also a technical category of the present invention to form other light-emitting layers such as the light-emitting layer 17G and the light-emitting layer 17B with the donor film 197 or the like. Moreover, it is not limited to the light-emitting layer 17. For example, the insulating film 14 may be formed. By forming the insulating film 14 using the donor film 197 or the like, for example, as shown in FIG. 1, the thicknesses of the insulating film 14R, the insulating film 14G, and the insulating film 14B can be easily set.

Figure 22:
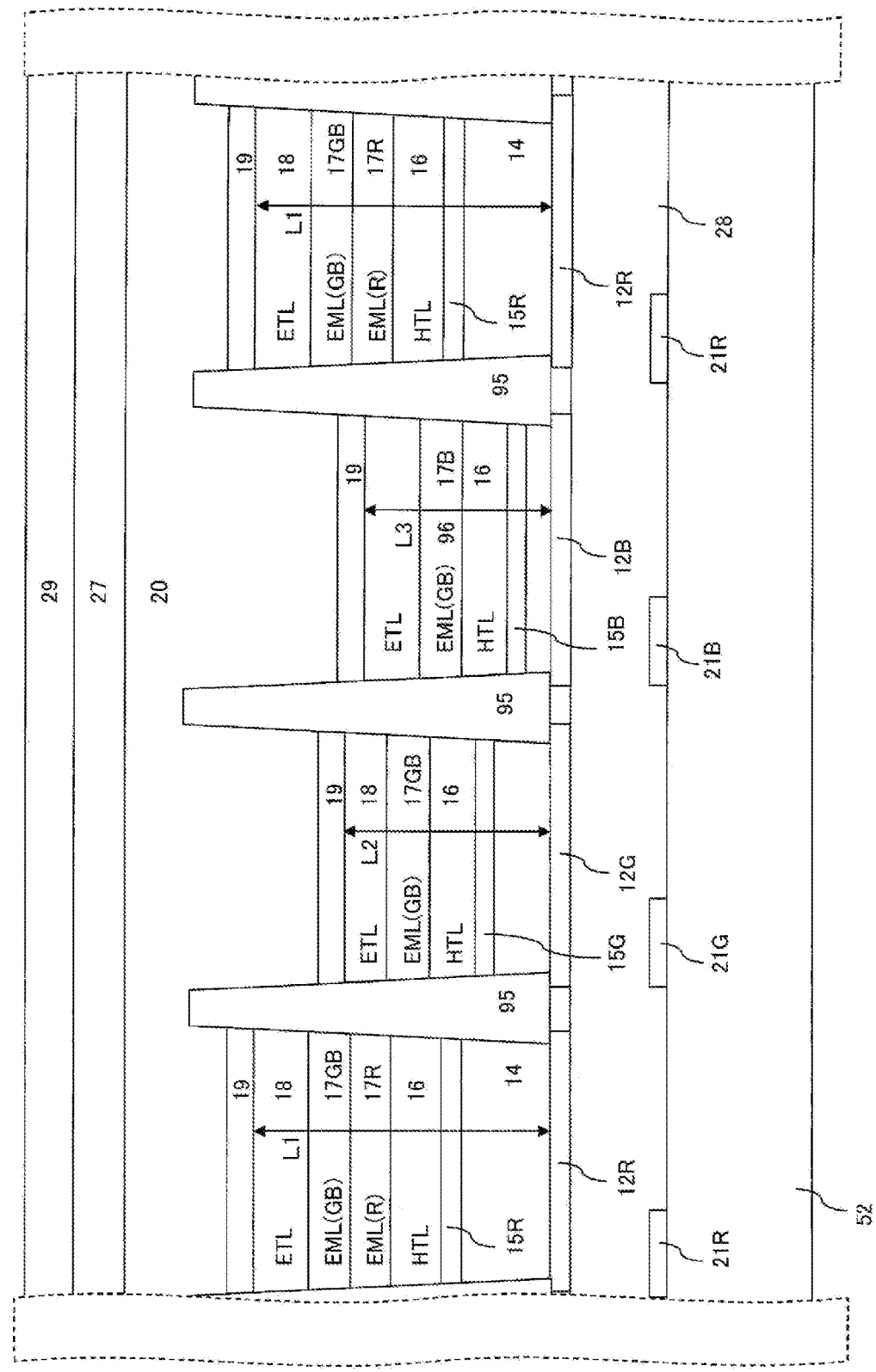
FIG. 22 is a sectional structure diagram of an EL display panel in a fifth embodiment example of the present invention.
Figure 23:
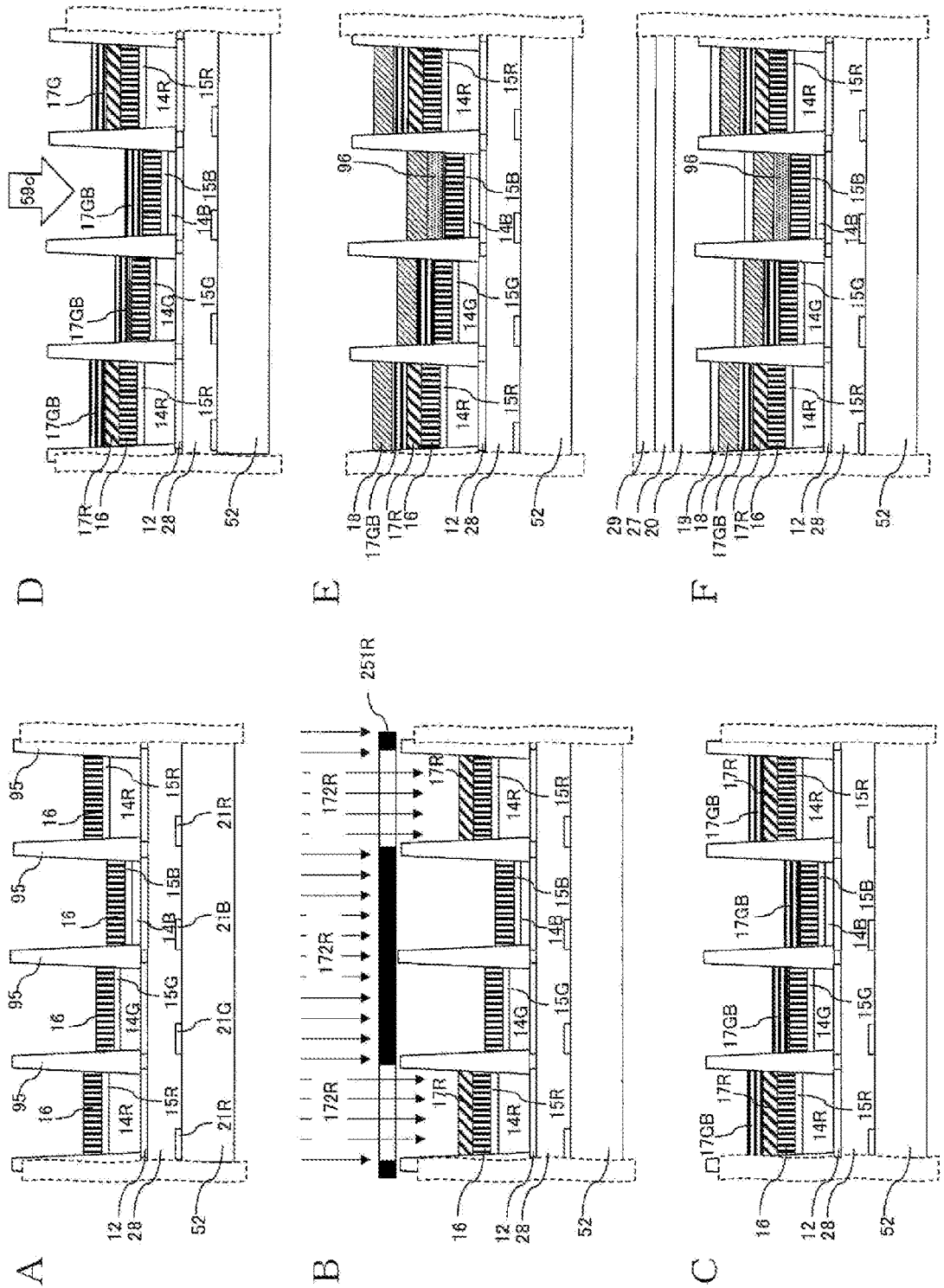
FIG. 23 is diagrams for explaining operations in the manufacture of the EL display panel in the fifth embodiment example of the present invention.

FIGS. 22 and 23 are a cross-sectional view of an EL display panel and an explanatory view of a manufacturing method according to the fifth embodiment of the present invention. In FIG. 22, a light-emitting layer 17R and a light-emitting layer EML (GB) are formed above the red pixel electrode 15R. A light-emitting layer EML (GB) is formed above the green pixel electrode 15G and the blue pixel electrode 15B. The light-emitting layer EML (GB) is formed by codepositing a host material, a green light emitting guest material, and a blue light emitting guest material.

Hereinafter, a manufacturing method of the fifth embodiment of the present invention will be described with reference to the drawings. As illustrated in FIG. 23A, the hole transport layer 16 is formed on the TFT substrate 52 above the pixel electrode 15. Next, as illustrated in FIG. 23B, a vapor-deposition fine mask 251R is disposed on the TFT substrate 52 in order to form the red light-emitting layer 17R. The red light-emitting layer material 172R is evaporated, and the light-emitting layer 17R is laminated on the hole transport layer 16. The light-emitting layer 17R is formed by codepositing a host material and a red guest material.

Next, as illustrated in FIG. 23C, a light-emitting layer EML (GB) is laminated. The light-emitting layer EML (GB) contains a green light emitting guest material and a blue light emitting guest material. The light-emitting layer EML (GB) is formed by codepositing a host material, a green light emitting guest material, and a blue light emitting guest material. Next, the TFT substrate 52 is conveyed into the laser device chamber 118, and as shown in FIG. 23D, the light-emitting layer EML (GB) above the blue pixel electrode 15B is irradiated with the laser light 59c. When the laser beam 59c is irradiated, the green guest material G in the light-emitting layer EML (GB) absorbs the laser beam 59c and becomes the reformed portion 96.

As shown in FIG. 3C, a material that hardly absorbs the laser beam 59c is selected as the host material and the green guest material B. As the green guest material G, a material that easily absorbs the laser light 59c is selected. Preferably, as shown in FIG. 3C, the guest material B is selected such that the absorptance of the guest material B is 25% or less when the absorptivity of the guest material G is 100% at the wavelength of the laser beam 59c. Further, the material is selected so that the difference between the absorption rate of the guest material G and the absorption rate of the guest material B is three times or more. Since the light-emitting layer 17G above the green pixel electrode 15G is not irradiated with the laser light 59c, the guest material G of the light-emitting layer 17G is in a state capable of emitting light.

Next, as illustrated in FIG. 23E, the electron-transport layer 18 is formed above the light-emitting layer EML (GB), and as illustrated in FIG. 23F, the electron-injection layer is formed, and the cathode electrode 19 is laminated onto the electron-transport layer 18.

The absorption spectrum of the red guest material R included in the light-emitting layer 17R above the pixel electrode 15R in FIG. 22 at least partially overlaps the emission spectrum of the green guest material in the light-emitting layer EML (GB). Further, the emission spectrum of the green guest material of the light-emitting layer EML (GB) at least partially overlaps the emission spectrum of the blue guest material B of the light-emitting layer EML (GB). In the light-emitting layer 17R above the pixel electrode 15R, recombination of electrons and holes mainly occurs in the red guest material R of the light-emitting layer 17R, but recombination occurs in the green guest material G and blue of the light-emitting layer EML (GB). This may also occur in the guest material B.

The green guest material G of the light-emitting layer EML (GB) absorbs energy for exciting the blue guest material B. The red guest material R included in the light-emitting layer 17R above the pixel electrode 15R absorbs energy that excites the green guest material G and emits light. The light-emitting layer 17R of the pixel electrode 15R of the EL display panel of the present invention shown in FIG. 22 emits red light. In the light-emitting layer EML (GB) above the pixel electrode 15G, recombination of electrons and holes mainly occurs in the green guest material G of the light-emitting layer 17G, but recombination occurs in the blue guest material of the light-emitting layer EML (GB). It may also occur in the blue guest material B of B. The green guest material G of the light-emitting layer EML (GB) absorbs energy that excites the blue guest material B of the light-emitting layer EML (GB). The light-emitting layer EML (GB) of the pixel electrode 15G of the EL display panel of the present invention shown in FIG. 22 emits green light. In the light-emitting layer EML (GB) above the pixel electrode 15B, the contained green guest material G is not excited by being irradiated with the laser beam 59c. In the light-emitting layer EML (GB) above the pixel electrode 15B, the blue guest material B emits light. Therefore, the pixel 37 of the pixel electrode 15B emits blue light.

Figure 24:
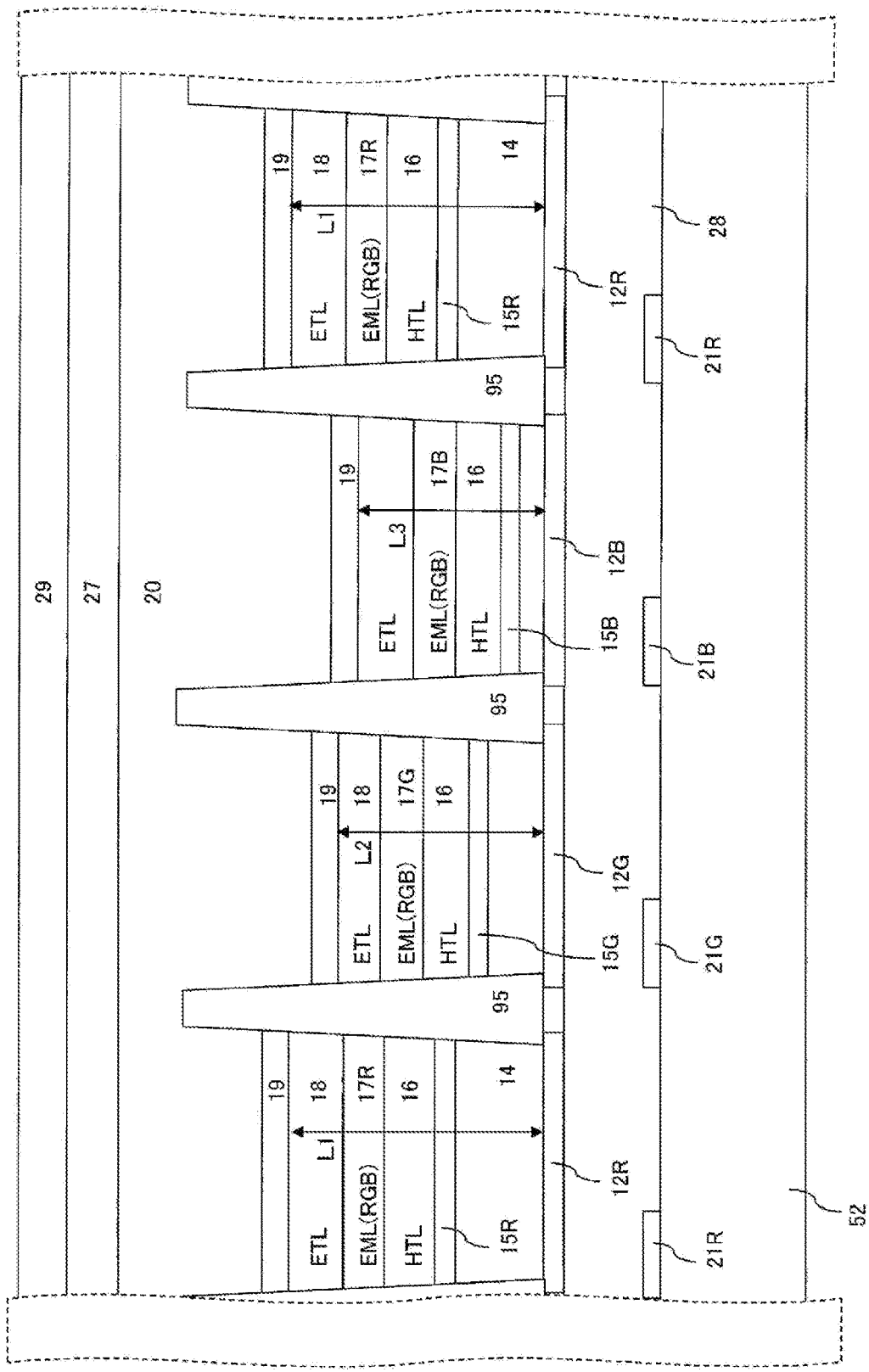
FIG. 24 is a sectional structure diagram of an EL display panel in a sixth embodiment example of the present invention.
Figure 25:
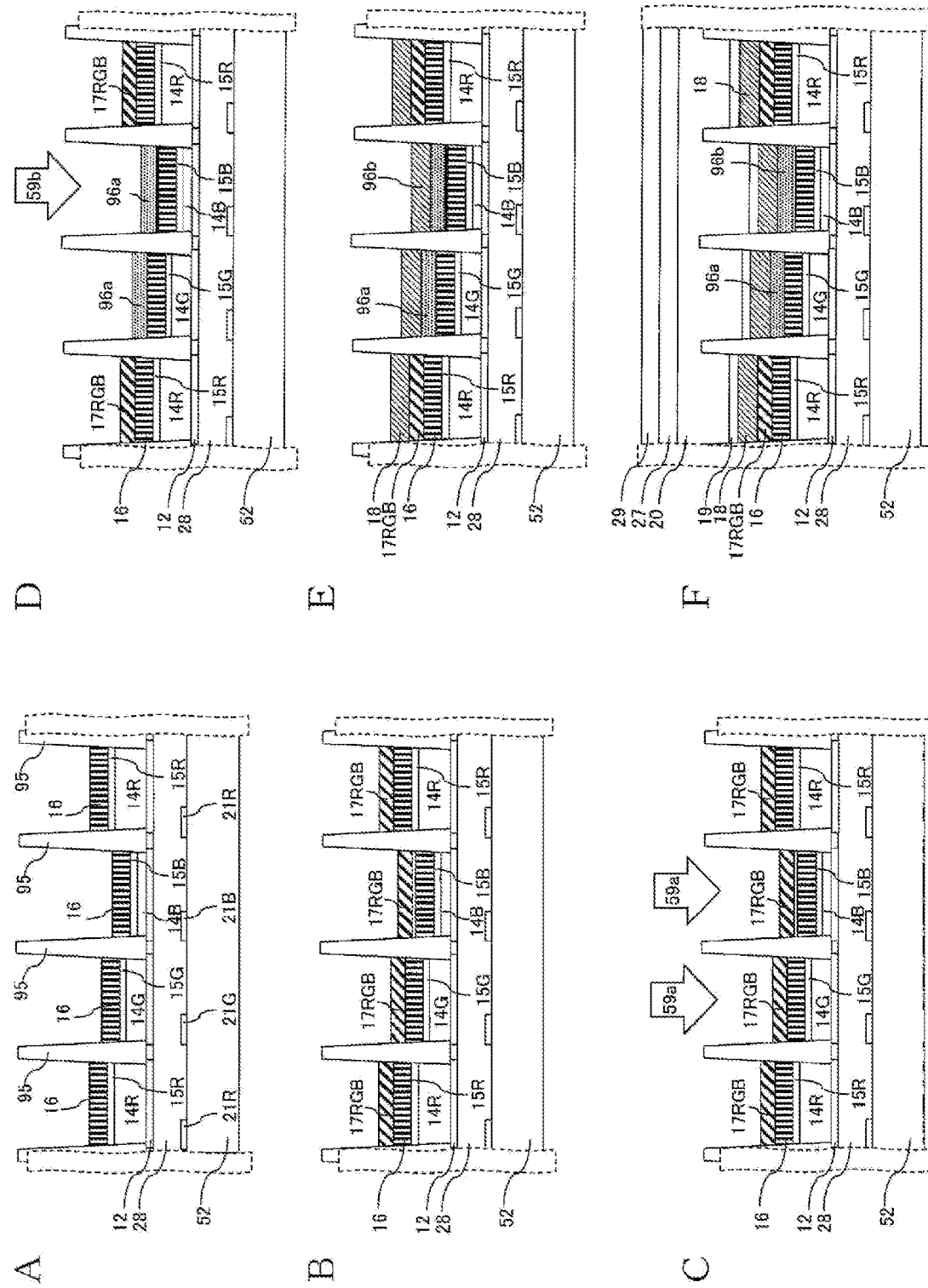
FIG. 25 is diagrams for explaining operations in the manufacture of the EL display panel in the sixth embodiment example of the present invention.

FIGS. 24 and 25 are a cross-sectional view of an EL display panel according to the sixth embodiment of the present invention and an explanatory diagram of the manufacturing method. In FIG. 24, the light-emitting layer EML (RGB) is formed above the red, green, and blue pixel electrodes 15. The light-emitting layer EML (RGB) is formed by codepositing a host material, a red light-emitting guest material, a green light-emitting guest material, and a blue light-emitting guest material.

A manufacturing method of the sixth embodiment of the present invention will be described below. As shown in FIG. 25A, the hole transport layer 16 is formed on the TFT substrate 52 above the pixel electrode 15. Next, as illustrated in FIG. 25B, the light-emitting layer 17RGB is laminated on the hole transport layer 16 on the TFT substrate 52. The light-emitting layer 17RGB is formed by codepositing a host material, a red light-emitting guest material, a green light-emitting guest material, and a blue light-emitting guest material.

Next, the TFT substrate 52 is conveyed into the laser device chamber 118, and as shown in FIG. 25C, the laser light 59*a* is applied to the light-emitting layer EML (RGB) above the green pixel electrode 15G and the blue pixel electrode 15B. When the laser beam 59*a* is shone onto it, the red guest material R in the light-emitting layer EML (RGB) absorbs the laser beam 59*a* and becomes the reformed portion 96*a*. As shown in FIG. 3D, for the red guest material R, a material that easily absorbs the laser beam 59*a* is selected. As the green guest material G and the blue guest material B, materials that hardly absorb the laser light 59*a* are selected. Preferably, as shown in FIG. 3D, the guest material G is selected such that the absorption rate of the guest material G is 25% or less when the absorption rate of the guest material R is 100% at the wavelength of the laser beam 59*a*. Further, the material is selected so that the difference between the absorption rate of the guest material R and the absorption rate of the guest material G is three times or more. The material is preferably selected so as to be 4 times or more. Since the light-emitting layer 17R above the red pixel electrode 15R is not irradiated with the laser light 59*a*, the guest material R, the guest material G, and the guest material B of the light-emitting layer 17RGB are maintained in a state capable of emitting light.

Next, as illustrated in FIG. 25D, laser light 59*b* is applied to the light-emitting layer EML (RGB) above the blue pixel electrode 15B. When the laser beam 59*b* is irradiated, the green guest material G of the light-emitting layer EML (RGB) absorbs the laser beam 59*b* and becomes the reformed portion 96*b*. As shown in FIG. 3D, for the green guest material G, a material that easily absorbs the laser beam 59*b* is selected. For the blue guest material B, a material that hardly absorbs the laser beam 59*b* is selected. Preferably, as shown in FIG. 3D, the guest material B is selected such that the absorption rate of the guest material B is 25% or less when the absorption rate of the guest material G is 100% at the wavelength of the laser beam 59*b*. Further, the material is selected so that the difference between the absorption rate of the guest material G and the absorption rate of the guest material B is three times or more.

Next, as shown in FIG. 25E, an electron-transport layer 18 is formed above the light-emitting layer EML (RGB), an electron-injection layer is formed as shown in FIG. 25F, and the cathode electrode 19 is laminated onto the electron-transport layer 18. In the light-emitting layer EML (RGB) above the pixel electrode 15R in FIG. 24, recombination of electrons and holes mainly occurs in the red guest material R of the light-emitting layer 17R, but recombination occurs in the light-emitting layer EML (RGB). It may also occur in the green guest material G and the blue guest material B. The green guest material G of the light-emitting layer EML (RGB) absorbs the energy with which the blue guest material B is excited. The red guest material R included in the light-emitting layer EML (RGB) above the pixel electrode 15R emits light by absorbing energy excited by the green guest material G. The light-emitting layer 17R of the pixel electrode 15R of the EL display panel of the present invention shown in FIG. 24 emits red light.

The green guest material G of the light-emitting layer EML (RGB) above the pixel electrode 15G absorbs energy that excites the blue guest material B of the light-emitting layer EML (RGB). The light-emitting layer EML (RGB) of the pixel electrode 15G of the EL display panel of the present invention shown in FIG. 24 emits green light. The green guest material G contained in the light-emitting layer EML (RGB) above the pixel electrode 15B is not excited by being irradiated with the laser light 59*b*. Further, the red guest material R contained in the light-emitting layer EML (RGB) is not excited by being irradiated with the laser light 59*a*. In the light-emitting layer EML (RGB) above the pixel electrode 15B, the blue guest material B emits light. Therefore, the pixel 37 of the pixel electrode 15B emits blue light.

In the above embodiment, the light-emitting layer 17 and the like above the pixel electrode 15 are irradiated with the laser light 59 to reform the light-emitting layer 17 and the like. However, the present invention is not limited to this. When the light-emitting layers 17 of different colors overlap between adjacent pixels, color mixing occurs. For example, when the red light-emitting layer 17R and the green light-emitting layer 17G overlap, the overlapping light-emitting layer may generate red light and green light, and mixed color light may be generated. As shown in FIG. 20, the light-emitting layer 17 and the like may be reformed or removed by irradiating laser light 59 between the pixels 37.

FIGS. 26 and 27 are a cross-sectional view of an EL display panel according to a seventh embodiment of the present invention and an explanatory view of the manufacturing method. In the seventh embodiment, laser light 59 is irradiated between adjacent pixels to reform the light-emitting layer 17 and the like between adjacent pixels. In the seventh embodiment, the pixel 37 is irradiated with the laser light 59*c* and the irradiated light-emitting layer 17 is reformed to form a non-light-emitting layer in the first embodiment described with reference to FIGS. 1 and 10 is illustrated.

In the seventh embodiment, as shown in FIG. 27, the light-emitting layer 17 between the pixel electrodes 15 and the hole transport layer 16 are irradiated with a laser beam 59*c* to form a reformed portion 96*c*. The section structure illustrates the embodiment of FIG. 1, wherein the bank 95 of FIG. 1 is eliminated, and the portion of the bank 95 of FIG. 1 is irradiated with the laser beam 59*c* making a structure where the locations irradiated with the laser beam 59*c* are a reformed portion 96*c*. By not forming the bank 95, the step of forming the bank 95 can be omitted, and the manufacturing cost can be reduced. In addition, the aperture ratio of the pixel 37 can be increased, the current concentration in the pixel 37 is eliminated, and the life of the EL element 22 can be increased. Further, by irradiating the laser light 59*c* between the pixels 37, color mixing due to overlapping of the light-emitting layers 17 of different colors between adjacent pixels 37 is eliminated, and mixed color light emission is eliminated.

As shown in FIG. 27A, the hole transport layer 16 is formed above the pixel electrode 15 of the TFT substrate 52. Next, as illustrated in FIG. 27B, the light-emitting layer 17R is laminated on the hole transport layer 16 by a vapor deposition method. Further, the light-emitting layer 17 of the TFT substrate 52 is irradiated with a laser beam 59*a*. The laser light 59*a* is applied to the light-emitting layer 17R above the pixel electrode 15G and the pixel electrode 15B.

As shown in FIG. 27C, the light-emitting layer 17R is reformed by the irradiated portion of the laser beam 59*a* to become a reformed portion 96*a*. Next, as illustrated in FIG. 27C, the light-emitting layer 17G is laminated on the light-emitting layer 17R by a vapor deposition method. Next, as shown in FIG. 27D, the light-emitting layer 17G of the TFT substrate 52 is irradiated with a laser beam 59*b*. The laser light 59*b* irradiates the light-emitting layer 17G above the pixel electrode 15B. The light-emitting layer 17G is reformed by the irradiated portion of the laser beam 59*b* to become a reformed portion 96*b*. As shown in FIG. 27E, the light emitting material between the pixels 37 is reformed by irradiating laser light 59*c* between adjacent pixels. As shown in FIG. 27E, when the laser beam 59*c* is irradiated, a slit mask 92 or the like is used, and the laser beam 59*c* is irradiated from the opening (light transmission portion) of the slit mask 92c. The gap can be reformed.

Next, as illustrated in FIG. 27F, the electron-transport layer 18 is formed above the light-emitting layer 17B, and the cathode electrode 19 is stacked on the electron-transport layer 18.

As described above, the technical idea of the present invention is to irradiate a laser beam or the like to reform or remove the light-emitting layer 17 or the like to make it non-light emitting. The contents (or part of the contents) described in each drawing of the embodiment can be applied to various electronic devices. Specifically, it can be applied to a display portion of an electronic device. Such electronic devices include video cameras, digital cameras, goggles-type displays, navigation systems, sound playback devices (car audio, audio components, etc.), computers, game devices, portable information terminals (mobile computers, mobile phones, portable games). And an image reproducing apparatus (specifically, an apparatus having a display capable of reproducing a recording medium such as digital versatile disc (DVD) and displaying the image).

Figure 29:
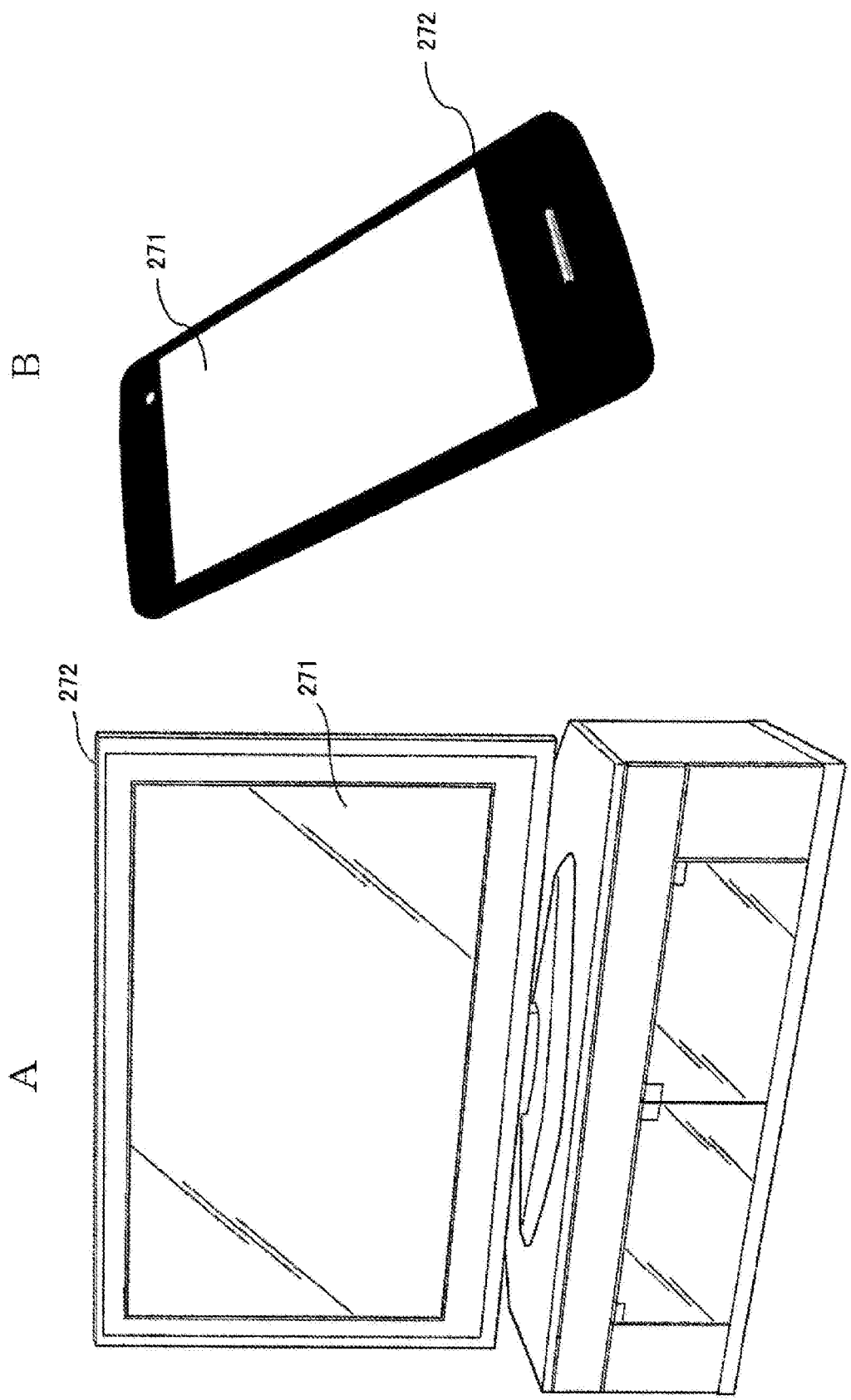
FIG. 29 is explanatory views of display devices utilizing EL display panels of the present invention.
Figure 30:
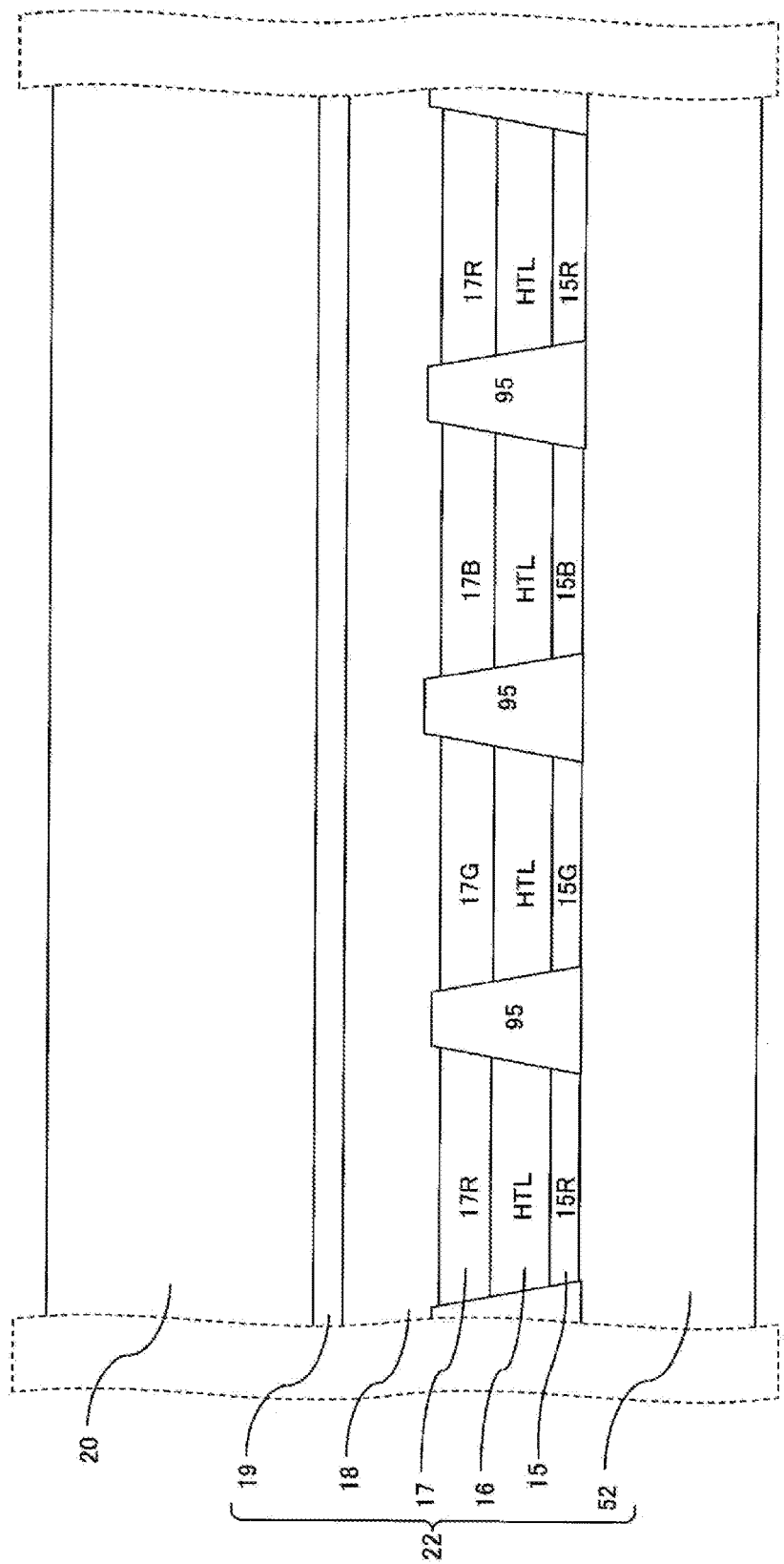
FIG. 30 is a sectional structure diagram of a conventional EL display panel.
Figure 31:
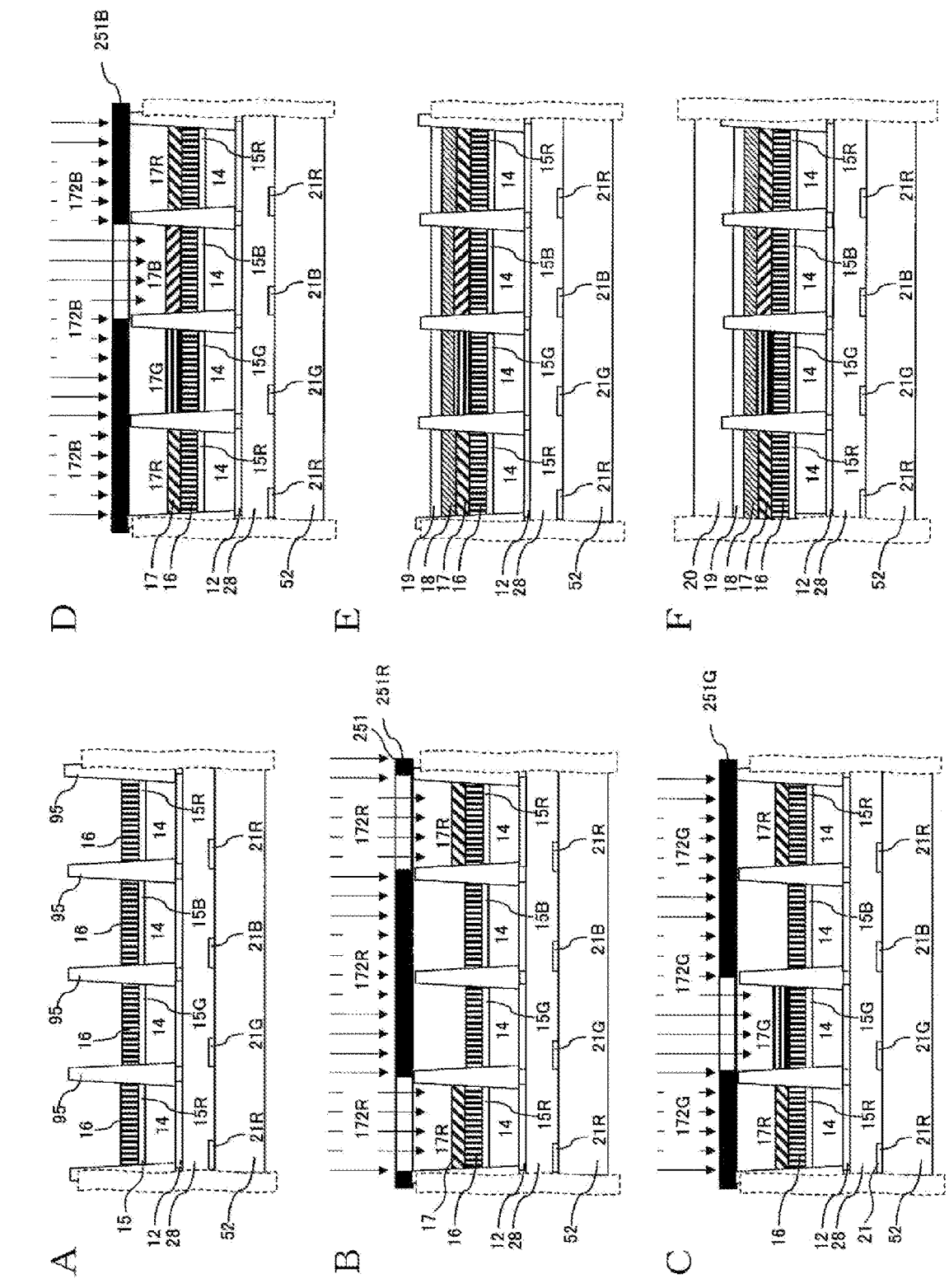
FIG. 31 is diagrams for explaining operations in the manufacture of a conventional EL display panel.

FIG. 29A is a perspective view of a display using the EL display panel 271 of the present invention. The EL display panel 271 is attached to the housing 272. The display illustrated in FIG. 29A has a function of displaying various information (still images, moving images, text images, and the like) on the display portion. FIG. 29B is a perspective view of a smartphone using the EL display panel 271 of the present invention. The EL display panel 271 is installed into the housing 272.

An EL display device using the EL display panel according to the present embodiment is a concept including a system device such as an information device. The concept of a display device includes system equipment such as information equipment.

As described above, the embodiments have been described as examples of the technology in the present disclosure. For this purpose, the accompanying drawings and detailed description are provided. In addition, since the above-described embodiments are for illustrating the technique in the present disclosure, various modifications, replacements, additions, omissions, and the like can be made within the scope of the claims and the equivalents thereof.

The present disclosure is useful for an EL display device and an EL display panel. In particular, it is useful for an active organic EL flat panel display. Moreover, it is useful as a manufacturing method and manufacturing apparatus of the EL display panel of the present invention.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

LEGEND

12: reflective film; 14: insulating film; 15: pixel electrode; 16: hole-transport layer (HTL); 17: light-emitting layer (EML); 18: electron-transport layer (ETL); 19: cathode electrode; 20: sealing membrane; 21: TFT (transistor); 22: EL element; 23: capacitor; 27: sealing film; 28: planarizing film; 29: circularly polarizing plate (circularly polarizing film); 31: gate driver IC (circuit); 32: source driver IC (circuit); 34: gate signal line; 35: source signal line; 36: display screen; 37: pixel; 51: sliding stage; 52: TFT substrate; 53: temperature-adjusting plate; 54: vacuum pump; 55: exhaust duct; 56: deposition chamber; 58: laser device; 59: laser beams; 60: optical density filter; 61: cylindrical lens; 62: mirror galvanometer; 63: laser window; 64: fθ lens; 65: metal evaporation source; 66: organic evaporation source; 71: fluorescence/phosphorescence; 72: beam-splitting mirrors; 73: mirrors; 74: lenses; 75: filter; 76: optical amplifier circuit; 77: beam detection device; 78: beam control device; 79: laser control circuit; 80: photodiode (light sensor); 91: laser spot; 92: slit mask; 94: transparent substrate; 95: bank; 111: compartment chamber; 112: load-lock chamber; 113: convey-in chamber; 114: convey-out chamber; 115: central chamber; 116: film-forming tool; 117: transfer device chamber; 118: laser device chamber; 121: black synthetic resin; 122: LED; 123: substrate; 181: exhaust port; 182: sliding stage; 183: support mechanism; 184: raise/lower mechanism; 185: control mechanism; 186: pressure roller; 191: base film; 192: photoconversion film; 193: intermediate film; 194: buffer film; 195: transfer organic film; 197: donor film; 271: EL display panel; 272: housing

What is claimed is:

1. A method of manufacturing an electroluminescent (EL) display panel in which pixels of a first color, pixels of a second color, and pixels of a third color are disposed in matrix form, the EL display panel manufacturing method comprising:
   a step of forming a first light-emitting layer on pixels of at least any of said colors;
   a step of directing an ultraviolet laser beam into the first light-emitting layer over a given pixel,
   a step of in an optical amplifier circuit photoelectrically converting into a signal voltage fluorescence or phosphorescence emitted by the first light-emitting layer under excitation by being irradiated with the ultraviolet laser beam:
   a step of inputting the signal voltage into a laser control circuit for controlling the intensity of the ultraviolet laser beam, and with the laser control circuit detecting the relative strength of the fluorescence or phosphorescence emitted by the first light-emitting to detect whether the fluorescence or phosphorescence is a predetermined intensity setting or within a predetermined intensity range, to determine that the first light-emitting layer on the given pixel has become reformed; and
   a step of, upon determining that the first light-emitting layer on the given pixel has become reformed, shifting the ultraviolet laser beam to a position on the first-light-emitting layer over a next pixel.

2. The EL display panel manufacturing method set forth in claim 1, wherein the ultraviolet laser beam and the fluorescence or phosphorescence are separated with an optical filter.

3. The EL display panel manufacturing method set forth in claim 1, wherein
   the ultraviolet laser beam is from a pulsed-mode laser device;
   the wavelength of the laser beam is from at least 310 nm to not more than 400 nm; and
   the laser beam irradiates the same location on the first light-emitting layer with a plurality of pulses.

4. The EL display panel manufacturing method set forth in claim 1, further including a step of forming a second light-emitting layer on pixels of any color among the pixels of the first color, the pixels of the second color, and the pixels of the third color; wherein
  the first light-emitting layer is formed onto at least the second light-emitting layer;
  the first light-emitting layer is formed commonly on the pixels of the first color, the pixels of the second color, and the pixels of the third color; and
  the second light-emitting layer is formed utilizing a vapor-deposition fine mask.

5. The EL display panel manufacturing method set forth in claim 1, wherein:
  the first light-emitting layer contains a guest material and a host material;
  in the ultraviolet laser-beam reformed first light-emitting layer, among the three relationships,
  i. guest-material bandgap being greater than host-material bandgap,
  ii. in terms of relative dispositions of highest occupied molecular orbitals (HOMOs) in a guest material and in a host material, guest-material HOMO disposition being lower than host-material HOMO disposition, and
  iii. in terms of lowest unoccupied molecular orbitals (LUMOs) in a guest material and in a host material, guest-material LUMO disposition being higher than host-material LUMO disposition,
at least one or more relationship holds.

6. The EL display panel manufacturing method set forth in claim 1, wherein:
  the first light-emitting layer is formed by codeposition of host materials and guest materials; and
  the guest material is of absorptivity with respect to the ultraviolet laser beam that is greater than that of the host material.

7. The EL display panel manufacturing method set forth in claim 1, wherein the first light-emitting layer is irradiated with the ultraviolet laser beam via a slit in a slit mask.

8. The EL display panel manufacturing method set forth in claim 1, further including a step of forming a second light-emitting layer on pixels of any color among the pixels of the first color, the pixels of the second color, and the pixels of the third color; wherein
  the first light-emitting layer is formed onto at least the second light-emitting layer;
  the first light-emitting layer is formed commonly on the pixels of the first color, the pixels of the second color, and the pixels of the third color; and
  a thermal transfer technique is utilized to form the second light-emitting layer.

9. The EL display panel manufacturing method set forth in claim 1, wherein:
  the step of forming a first light-emitting layer is carried out within a high-vacuum chamber; and
  in the step of directing an ultraviolet laser beam onto the first light-emitting layer, the ultraviolet laser beam is introduced through a window in the high-vacuum chamber.

10. The EL display panel manufacturing method set forth in claim 5, wherein:
  a hole-transport layer is formed on an underlayer of the first light-emitting layer; and
  the guest material is of absorptivity with respect to the first light that is greater than that of the host material.

11. The EL display panel manufacturing method set forth in claim 5, wherein:
  a layer emitting blue light is formed on the pixels of a third color;
  a hole-transport layer is formed on an underlayer of the blue light-emitting layer; and
  said hole-transport layer is of film thickness that is thicker than that of hole-transport layers on the pixels of the other colors.

* * * * *